(12) United States Patent
Park et al.

(10) Patent No.: US 11,902,022 B2
(45) Date of Patent: Feb. 13, 2024

(54) METHOD AND APPARATUS FOR RECEIVING PPDU ON WHICH BCC INTERLEAVING HAS BEEN PERFORMED IN MULTI-RU IN WIRELESS LAN SYSTEM

(71) Applicant: LG ELECTRONICS INC., Seoul (KR)

(72) Inventors: Eunsung Park, Seoul (KR); Jinyoung Chun, Seoul (KR); Jinsoo Choi, Seoul (KR); Dongguk Lim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/758,956

(22) PCT Filed: Jan. 20, 2021

(86) PCT No.: PCT/KR2021/000803
§ 371 (c)(1),
(2) Date: Dec. 15, 2022

(87) PCT Pub. No.: WO2021/153940
PCT Pub. Date: Aug. 5, 2021

(65) Prior Publication Data
US 2023/0129436 A1 Apr. 27, 2023

(30) Foreign Application Priority Data

Jan. 28, 2020 (KR) .................. 10-2020-0010077
Jan. 31, 2020 (KR) .................. 10-2020-0012139

(51) Int. Cl.
*H04L 1/00* (2006.01)
*H04L 27/18* (2006.01)
*H04W 84/12* (2009.01)

(52) U.S. Cl.
CPC .......... *H04L 1/0071* (2013.01); *H04L 1/0059* (2013.01); *H04L 27/18* (2013.01); *H04W 84/12* (2013.01)

(58) Field of Classification Search
CPC ..... H04L 1/0071; H04L 1/0059; H04L 27/18; H04W 84/12
See application file for complete search history.

(56) References Cited

U.S. PATENT DOCUMENTS

| 10,211,948 B2 | 2/2019 | Liu et al. | |
| 2015/0365266 A1* | 12/2015 | Zhang | H04L 27/2627 370/329 |

(Continued)

FOREIGN PATENT DOCUMENTS

| CA | 3167142 | 7/2021 |
| CN | 101753502 | 6/2010 |

(Continued)

OTHER PUBLICATIONS

PCT International Application No. PCT/KR2021/000803, International Search Report dated Apr. 8, 2021, 4 pages.

(Continued)

*Primary Examiner* — Mohammad S Anwar
(74) *Attorney, Agent, or Firm* — LEE, HONG, DEGERMAN, KANG & WAIMEY PC

(57) ABSTRACT

Proposed are a method and apparatus for receiving a PPDU on which BCC interleaving has been performed in a Multi-RU in a wireless LAN system. Specifically, a reception STA receives, from a transmission STA, a PPDU comprising a data field and decodes the data field. The data field is received via a Multi-RU which is an aggregate of a first RU and a second RU. The data field is generated on the basis of a coded bit string included in a BCC interleaver block. The coded bit string is obtained by interleaving a data bit string on the basis of first and second parameters. The data bit (Continued)

string is interleaved as the data bit string is entered into the BCC interleaver block in rows on the basis of the first parameter and is read out in columns of the BCC interleaver block on the basis of the second parameter.

15 Claims, 27 Drawing Sheets

(56) References Cited

U.S. PATENT DOCUMENTS

| | | | | |
|---|---|---|---|---|
| 2016/0212246 A1* | 7/2016 | Seok | ............ | H04L 1/0631 |
| 2017/0180177 A1 | 6/2017 | Wu et al. | | |
| 2018/0160429 A1 | 6/2018 | Seok | | |
| 2018/0248591 A1 | 8/2018 | Geng et al. | | |
| 2020/0305164 A1* | 9/2020 | Yang | ............ | H04W 4/00 |

FOREIGN PATENT DOCUMENTS

| | | | | |
|---|---|---|---|---|
| CN | 102687423 | | 9/2012 | |
| CN | 108206727 | | 6/2018 | |
| CN | 113098655 | | 7/2021 | |
| EP | 3182628 | A1 * | 6/2017 | ............ H04L 1/0041 |
| EP | 4075694 | | 10/2022 | |
| WO | 2021-139558 | | 7/2021 | |

OTHER PUBLICATIONS

Yu et al., "Multiple RU discussion," IEEE 802.11-19/1914r4, Nov. 2019, 12 pages.

Srinivasa et al., "11ac 80MHz Transmission Flow," IEEE 802.11-10/0548r2, May 2010, 25 pages.

Kim et al., "Multiple RU Support for 11be," IEEE 802.11-19/2161r1, Jan. 2020, 14 pages.

Schelstraete et al., "Further considerations for multi-RU," IEEE 802.11-20/0109, Jan. 2020, 15 pages.

United States Patent and Trademark Office U.S. Appl. No. 18/132,007, Notice of Allowance dated Jun. 28, 2023, 15 pages.

Japan Patent Office Application No. 2022-545454, Office Action dated Oct. 3, 2023, 5 pages.

IEEE Computer Society, "IEEE Standard for Information technology-Telecommunications and information exchange between systems Local and metropolitan are networks-Specific requirements, Part 11: Wireless LAN Medium Access Control (MAC) and Physical Layer (PHY) Specifications, Amendment 4: Enchancement for Very High Throughput for Operation in Bands below 6 GHz," IEEE Std 802.11ac-2013, 21 pages.

Mediatek, "Multiple RU Combinations for EHT", IEEE 802.11-19/1907r0, Nov. 2019, 19 pages.

Qualcomm, "11af Interleaver Parameters", IEEE 802.11-12/0908r1, Jul. 2012, 24 pages.

Mediatek USA et al., "BCC Interleaver Parameters for DCM", IEEE 802.11-16/0621, May 2016, 23 pages.

European Patent Office Application Serial No. 21747244.8, Search Report dated May 23, 2023, 10 pages.

The State Intellectual Property Office of the People's Republic of China Application Serial No. 202180017121.5, Office Action dated Nov. 7, 2023, 9 pages.

IP Australia Application Serial No. 2021214471, Office Action dated Oct. 4, 2023, 4 pages Canadian Intellectual Property Office Application Serial No. 3,169,041, Office Action dated Nov. 3, 2023, 5 pages.

* cited by examiner (a)

| L-LTF | L-STF | L-SIG | Data |

PPDU Format (IEEE 802.11a/g)

| L-LTF | L-STF | L-SIG | SIG A | HT-SFT | HT-LFT | ... | HT-LFT | Data |

HT PPDU Format (IEEE 802.11n)

| L-LTF | L-STF | L-SIG | VHT-SIG A | VHT-SFT | VHT-LFT | VHT-SIG B | Data |

VHT PPDU Format (IEEE 802.11ac)

| 8μs | 8μs | 4μs | 4μs | 8μs | 4μs per symbol | 4μs | | | | |
|---|---|---|---|---|---|---|---|---|---|---|
| L-LTF | L-STF | L-SIG | RL-SIG | HE-SIG A | HE-SIG B | HE-STF | HE-LTF | ... | HE-LTF | Data | PE |

Variable durations per HE-LTF symbol

METHOD AND APPARATUS FOR RECEIVING PPDU ON WHICH BCC INTERLEAVING HAS BEEN PERFORMED IN MULTI-RU IN WIRELESS LAN SYSTEM

CROSS-REFERENCE TO RELATED APPLICATIONS

This application is the National Stage filing under 35 U.S.C. 371 of International Application No. PCT/KR2021/000803, filed on Jan. 20, 2021, which claims the benefit of earlier filing date and right of priority to Korean Application Nos. 10-2020-0010077, filed on Jan. 28, 2020, 10-2020-0012139, filed on Jan. 31, 2020, the contents of which are all hereby incorporated by reference herein in their entireties.

BACKGROUND

Technical Field

The present specification relates to a technique for receiving data through a Multi-RU in a WLAN system, and more particularly, to a method and an apparatus for receiving a PPDU on which BCC interleaving is performed in the Multi-RU.

Related Art

A wireless local area network (WLAN) has been enhanced in various ways. For example, the IEEE 802.11ax standard has proposed an enhanced communication environment by using orthogonal frequency division multiple access (OFDMA) and downlink multi-user multiple input multiple output (DL MU MIMO) schemes.

The present specification proposes a technical feature that can be utilized in a new communication standard. For example, the new communication standard may be an extreme high throughput (EHT) standard which is currently being discussed. The EHT standard may use an increased bandwidth, an enhanced PHY layer protocol data unit (PPDU) structure, an enhanced sequence, a hybrid automatic repeat request (HARQ) scheme, or the like, which is newly proposed. The EHT standard may be referred to as the IEEE 802.11be standard.

An increased number of spatial streams may be used in the new wireless LAN standard. In this case, in order to properly use the increased number of spatial streams, a signaling technique in the WLAN system may need to be improved.

SUMMARY

Technical Objectives

The present specification proposes a method and apparatus for receiving a PPDU on which BCC interleaving is performed in a Multi-RU in a WLAN system.

Technical Solutions

An example of the present specification proposes a method for receiving a PPDU.

This embodiment may be performed in a network environment in which a next-generation wireless LAN system (e.g., IEEE 802.11be or EHT wireless LAN system) is supported. The next-generation wireless LAN system is a wireless LAN system improved from the 802.11ax system, and may satisfy backward compatibility with the 802.11ax system.

This embodiment proposes a method of performing BCC interleaving on a data bit string included in a data field of the PPDU when transmitting the PPDU by allocating a Multi-RU (or MRU) supported by the 802.11be WLAN system to one STA. In particular, this embodiment proposes a method of defining a BCC parameter capable of performing BCC interleaving during Multi-RU transmission. The Multi-RU refers to an RU in which several continuous or discontinuous RUs are aggregated.

This embodiment is performed by the receiving STA and may correspond to a STA supporting an Extremely High Throughput (EHT) WLAN system. The transmitting STA of this embodiment may correspond to an access point (AP).

A receiving STA (station) receives a Physical Protocol Data Unit (PPDU) including a data field from the transmitting STA.

The receiving STA decode the data field.

The data field is received through a multiple-resource unit (Multi-RU) in which a first resource unit (RU) and a second RU are aggregated.

The data field is generated based on a coded bit string included in a BCC interleaver block.

The coded bit string is obtained by interleaving a data bit string based on first and second parameters. Specifically, the data bit string is interleaved by entering in rows of the BCC interleaver block based on the first parameter and by reading out in columns of the BCC interleaver block based on the second parameter.

Technical Effects

According to the embodiment proposed in this specification, by proposing the BCC interleaver parameter in Multi-RU, it is possible to obtain a gain in terms of frequency diversity through BCC encoding and interleaving during Multi-RU transmission, which has a new effect of increasing the overall throughput.

BRIEF DESCRIPTION OF THE DRAWINGS

FIG. 4 illustrates an example of a PPDU used in an IEEE standard.

DETAILED DESCRIPTION

Figure 1:
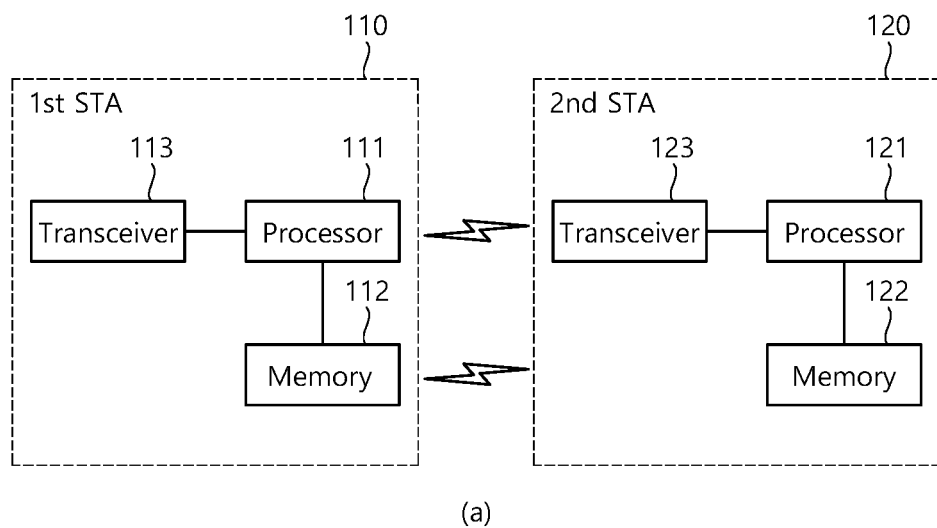
FIG. 1 shows an example of a transmitting apparatus and/or receiving apparatus of the present specification.
Figure 1:
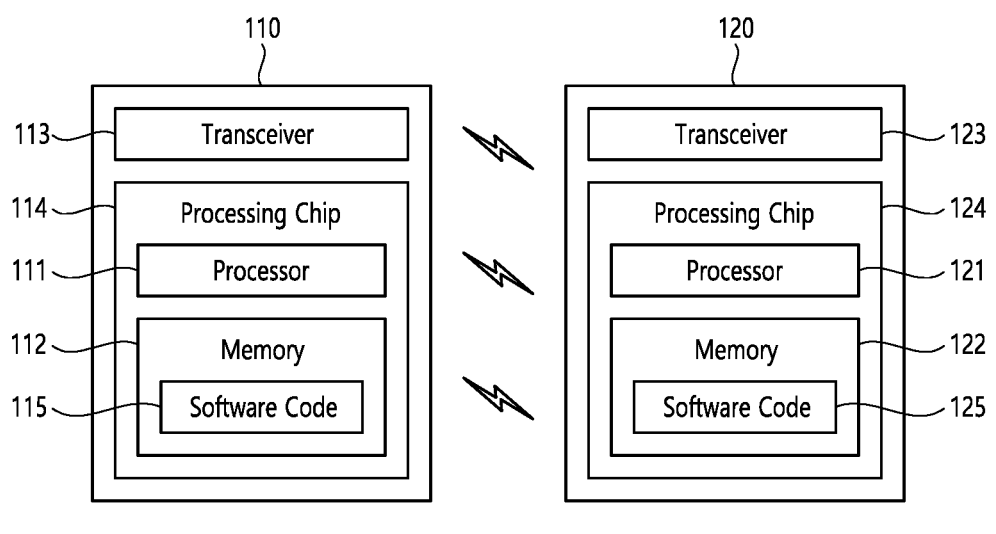

In the present specification, "A or B" may mean "only A", "only B" or "both A and B". In other words, in the present specification, "A or B" may be interpreted as "A and/or B". For example, in the present specification, "A, B, or C" may mean "only A", "only B", "only C", or "any combination of A, B, C".

A slash (/) or comma used in the present specification may mean "and/or". For example, "A/B" may mean "A and/or B". Accordingly, "A/B" may mean "only A", "only B", or "both A and B". For example, "A, B, C" may mean "A, B, or C".

In the present specification, "at least one of A and B" may mean "only A", "only B", or "both A and B". In addition, in the present specification, the expression "at least one of A or B" or "at least one of A and/or B" may be interpreted as "at least one of A and B".

In addition, in the present specification, "at least one of A, B, and C" may mean "only A", "only B", "only C", or "any combination of A, B, and C". In addition, "at least one of A, B, or C" or "at least one of A, B, and/or C" may mean "at least one of A, B, and C".

In addition, a parenthesis used in the present specification may mean "for example". Specifically, when indicated as "control information (EHT-signal)", it may denote that "EHT-signal" is proposed as an example of the "control information". In other words, the "control information" of the present specification is not limited to "EHT-signal", and "EHT-signal" may be proposed as an example of the "control information". In addition, when indicated as "control information (i.e., EHT-signal)", it may also mean that "EHT-signal" is proposed as an example of the "control information".

Technical features described individually in one figure in the present specification may be individually implemented, or may be simultaneously implemented.

The following example of the present specification may be applied to various wireless communication systems. For example, the following example of the present specification may be applied to a wireless local area network (WLAN) system. For example, the present specification may be applied to the IEEE 802.11a/g/n/ac standard or the IEEE 802.11ax standard. In addition, the present specification may also be applied to the newly proposed EHT standard or IEEE 802.11be standard. In addition, the example of the present specification may also be applied to a new WLAN standard enhanced from the EHT standard or the IEEE 802.11be standard. In addition, the example of the present specification may be applied to a mobile communication system. For example, it may be applied to a mobile communication system based on long term evolution (LTE) depending on a 3rd generation partnership project (3GPP) standard and based on evolution of the LTE. In addition, the example of the present specification may be applied to a communication system of a 5G NR standard based on the 3GPP standard.

Hereinafter, in order to describe a technical feature of the present specification, a technical feature applicable to the present specification will be described.

FIG. 1 shows an example of a transmitting apparatus and/or receiving apparatus of the present specification.

In the example of FIG. 1, various technical features described below may be performed. FIG. 1 relates to at least one station (STA). For example, STAs 110 and 120 of the present specification may also be called in various terms such as a mobile terminal, a wireless device, a wireless transmit/receive unit (WTRU), a user equipment (UE), a mobile station (MS), a mobile subscriber unit, or simply a user. The STAs 110 and 120 of the present specification may also be called in various terms such as a network, a base station, a node-B, an access point (AP), a repeater, a router, a relay, or the like. The STAs 110 and 120 of the present specification may also be referred to as various names such as a receiving apparatus, a transmitting apparatus, a receiving STA, a transmitting STA, a receiving device, a transmitting device, or the like.

For example, the STAs 110 and 120 may serve as an AP or a non-AP. That is, the STAs 110 and 120 of the present specification may serve as the AP and/or the non-AP.

The STAs 110 and 120 of the present specification may support various communication standards together in addition to the IEEE 802.11 standard. For example, a communication standard (e.g., LTE, LTE-A, 5G NR standard) or the like based on the 3GPP standard may be supported. In addition, the STA of the present specification may be implemented as various devices such as a mobile phone, a vehicle, a personal computer, or the like. In addition, the STA of the present specification may support communication for various communication services such as voice calls, video calls, data communication, and self-driving (autonomous-driving), or the like.

The STAs 110 and 120 of the present specification may include a medium access control (MAC) conforming to the IEEE 802.11 standard and a physical layer interface for a radio medium.

The STAs 110 and 120 will be described below with reference to a sub-figure (a) of FIG. 1.

The first STA 110 may include a processor 111, a memory 112, and a transceiver 113. The illustrated process, memory, and transceiver may be implemented individually as separate chips, or at least two blocks/functions may be implemented through a single chip.

The transceiver 113 of the first STA performs a signal transmission/reception operation. Specifically, an IEEE 802.11 packet (e.g., IEEE 802.11a/b/g/n/ac/ax/be, etc.) may be transmitted/received.

For example, the first STA 110 may perform an operation intended by an AP. For example, the processor 111 of the AP may receive a signal through the transceiver 113, process a reception (RX) signal, generate a transmission (TX) signal, and provide control for signal transmission. The memory 112 of the AP may store a signal (e.g., RX signal) received through the transceiver 113, and may store a signal (e.g., TX signal) to be transmitted through the transceiver.

For example, the second STA 120 may perform an operation intended by a non-AP STA. For example, a transceiver 123 of a non-AP performs a signal transmission/reception operation. Specifically, an IEEE 802.11 packet (e.g., IEEE 802.11a/b/g/n/ac/ax/be packet, etc.) may be transmitted/received.

For example, a processor 121 of the non-AP STA may receive a signal through the transceiver 123, process an RX signal, generate a TX signal, and provide control for signal transmission. A memory 122 of the non-AP STA may store a signal (e.g., RX signal) received through the transceiver 123, and may store a signal (e.g., TX signal) to be transmitted through the transceiver.

For example, an operation of a device indicated as an AP in the specification described below may be performed in the first STA 110 or the second STA 120. For example, if the first STA 110 is the AP, the operation of the device indicated as the AP may be controlled by the processor 111 of the first STA 110, and a related signal may be transmitted or received through the transceiver 113 controlled by the processor 111 of the first STA 110. In addition, control information related to the operation of the AP or a TX/RX signal of the AP may be stored in the memory 112 of the first STA 110. In addition, if the second STA 120 is the AP, the operation of the device indicated as the AP may be controlled by the processor 121 of the second STA 120, and a related signal may be transmitted or received through the transceiver 123 controlled by the processor 121 of the second STA 120. In addition, control information related to the operation of the AP or a TX/RX signal of the AP may be stored in the memory 122 of the second STA 120.

For example, in the specification described below, an operation of a device indicated as a non-AP (or user-STA) may be performed in the first STA 110 or the second STA 120. For example, if the second STA 120 is the non-AP, the operation of the device indicated as the non-AP may be controlled by the processor 121 of the second STA 120, and a related signal may be transmitted or received through the transceiver 123 controlled by the processor 121 of the second STA 120. In addition, control information related to the operation of the non-AP or a TX/RX signal of the non-AP may be stored in the memory 122 of the second STA 120. For example, if the first STA 110 is the non-AP, the operation of the device indicated as the non-AP may be controlled by the processor 111 of the first STA 110, and a related signal may be transmitted or received through the transceiver 113 controlled by the processor 111 of the first STA 110. In addition, control information related to the operation of the non-AP or a TX/RX signal of the non-AP may be stored in the memory 112 of the first STA 110.

In the specification described below, a device called a (transmitting/receiving) STA, a first STA, a second STA, a STA1, a STA2, an AP, a first AP, a second AP, an AP1, an AP2, a (transmitting/receiving) terminal, a (transmitting/receiving) device, a (transmitting/receiving) apparatus, a network, or the like may imply the STAs 110 and 120 of FIG. 1. For example, a device indicated as, without a specific reference numeral, the (transmitting/receiving) STA, the first STA, the second STA, the STA1, the STA2, the AP, the first AP, the second AP, the AP1, the AP2, the (transmitting/receiving) terminal, the (transmitting/receiving) device, the (transmitting/receiving) apparatus, the network, or the like may imply the STAs 110 and 120 of FIG. 1. For example, in the following example, an operation in which various STAs transmit/receive a signal (e.g., a PPDU) may be performed in the transceivers 113 and 123 of FIG. 1. In addition, in the following example, an operation in which various STAs generate a TX/RX signal or perform data processing and computation in advance for the TX/RX signal may be performed in the processors 111 and 121 of FIG. 1. For example, an example of an operation for generating the TX/RX signal or performing the data processing and computation in advance may include: 1) an operation of determining/obtaining/configuring/computing/decoding/encoding bit information of a sub-field (SIG, STF, LTF, Data) included in a PPDU; 2) an operation of determining/configuring/obtaining a time resource or frequency resource (e.g., a subcarrier resource) or the like used for the sub-field (SIG, STF, LTF, Data) included the PPDU; 3) an operation of determining/configuring/obtaining a specific sequence (e.g., a pilot sequence, an STF/LTF sequence, an extra sequence applied to SIG) or the like used for the sub-field (SIG, STF, LTF, Data) field included in the PPDU; 4) a power control operation and/or power saving operation applied for the STA; and 5) an operation related to determining/obtaining/configuring/decoding/encoding or the like of an ACK signal. In addition, in the following example, a variety of information used by various STAs for determining/obtaining/configuring/computing/decoding/decoding a TX/RX signal (e.g., information related to a field/subfield/control field/parameter/power or the like) may be stored in the memories 112 and 122 of FIG. 1.

The aforementioned device/STA of the sub-figure (a) of FIG. 1 may be modified as shown in the sub-figure (b) of FIG. 1. Hereinafter, the STAs 110 and 120 of the present specification will be described based on the sub-figure (b) of FIG. 1.

For example, the transceivers 113 and 123 illustrated in the sub-figure (b) of FIG. 1 may perform the same function as the aforementioned transceiver illustrated in the sub-figure (a) of FIG. 1. For example, processing chips 114 and 124 illustrated in the sub-figure (b) of FIG. 1 may include the processors 111 and 121 and the memories 112 and 122. The processors 111 and 121 and memories 112 and 122 illustrated in the sub-figure (b) of FIG. 1 may perform the same function as the aforementioned processors 111 and 121 and memories 112 and 122 illustrated in the sub-figure (a) of FIG. 1.

A mobile terminal, a wireless device, a wireless transmit/receive unit (WTRU), a user equipment (UE), a mobile station (MS), a mobile subscriber unit, a user, a user STA, a network, a base station, a Node-B, an access point (AP), a repeater, a router, a relay, a receiving unit, a transmitting unit, a receiving STA, a transmitting STA, a receiving device, a transmitting device, a receiving apparatus, and/or a transmitting apparatus, which are described below, may imply the STAs 110 and 120 illustrated in the sub-figure (a)/(b) of FIG. 1, or may imply the processing chips 114 and 124 illustrated in the sub-figure (b) of FIG. 1. That is, a technical feature of the present specification may be performed in the STAs 110 and 120 illustrated in the sub-figure (a)/(b) of FIG. 1, or may be performed only in the processing chips 114 and 124 illustrated in the sub-figure (b) of FIG. 1. For example, a technical feature in which the transmitting STA transmits a control signal may be understood as a technical feature in which a control signal generated in the processors 111 and 121 illustrated in the sub-figure (a)/(b) of FIG. 1 is transmitted through the transceivers 113 and 123 illustrated in the sub-figure (a)/(b) of FIG. 1. Alternatively, the technical feature in which the transmitting STA transmits the control signal may be understood as a technical feature in which the control signal to be transferred to the transceivers 113 and 123 is generated in the processing chips 114 and 124 illustrated in the sub-figure (b) of FIG. 1.

For example, a technical feature in which the receiving STA receives the control signal may be understood as a technical feature in which the control signal is received by means of the transceivers 113 and 123 illustrated in the sub-figure (a) of FIG. 1. Alternatively, the technical feature in which the receiving STA receives the control signal may be understood as the technical feature in which the control signal received in the transceivers 113 and 123 illustrated in the sub-figure (a) of FIG. 1 is obtained by the processors 111 and 121 illustrated in the sub-figure (a) of FIG. 1. Alternatively, the technical feature in which the receiving STA receives the control signal may be understood as the technical feature in which the control signal received in the transceivers 113 and 123 illustrated in the sub-figure (b) of FIG. 1 is obtained by the processing chips 114 and 124 illustrated in the sub-figure (b) of FIG. 1.

Referring to the sub-figure (b) of FIG. 1, software codes 115 and 125 may be included in the memories 112 and 122. The software codes 115 and 126 may include instructions for controlling an operation of the processors 111 and 121. The software codes 115 and 125 may be included as various programming languages.

The processors 111 and 121 or processing chips 114 and 124 of FIG. 1 may include an application-specific integrated circuit (ASIC), other chipsets, a logic circuit and/or a data processing device. The processor may be an application processor (AP). For example, the processors 111 and 121 or processing chips 114 and 124 of FIG. 1 may include at least one of a digital signal processor (DSP), a central processing unit (CPU), a graphics processing unit (GPU), and a modulator and demodulator (modem). For example, the processors 111 and 121 or processing chips 114 and 124 of FIG. 1 may be SNAPDRAGON™ series of processors made by Qualcomm®, EXYNOS™ series of processors made by Samsung®, A series of processors made by Apple®, HELIO™ series of processors made by MediaTek®, ATOM™ series of processors made by Intel® or processors enhanced from these processors.

In the present specification, an uplink may imply a link for communication from a non-AP STA to an SP STA, and an uplink PPDU/packet/signal or the like may be transmitted through the uplink. In addition, in the present specification, a downlink may imply a link for communication from the AP STA to the non-AP STA, and a downlink PPDU/packet/signal or the like may be transmitted through the downlink.

Figure 2:
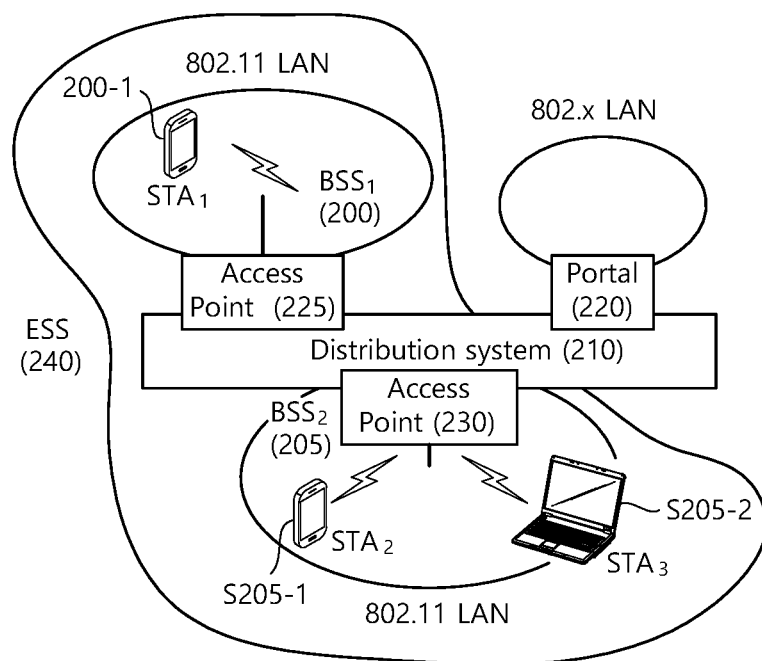
FIG. 2 is a conceptual view illustrating the structure of a wireless local area network (WLAN).
Figure 2:
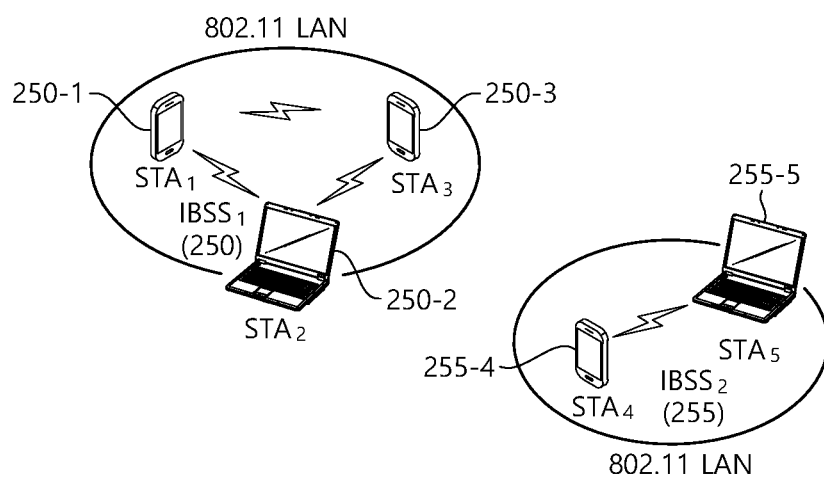

FIG. 2 is a conceptual view illustrating the structure of a wireless local area network (WLAN).

An upper part of FIG. 2 illustrates the structure of an infrastructure basic service set (BSS) of institute of electrical and electronic engineers (IEEE) 802.11.

Referring the upper part of FIG. 2, the wireless LAN system may include one or more infrastructure BSSs 200 and 205 (hereinafter, referred to as BSS). The BSSs 200 and 205 as a set of an AP and a STA such as an access point (AP) 225 and a station (STA1) 200-1 which are successfully synchronized to communicate with each other are not concepts indicating a specific region. The BSS 205 may include one or more STAs 205-1 and 205-2 which may be joined to one AP 230.

The BSS may include at least one STA, APs providing a distribution service, and a distribution system (DS) 210 connecting multiple APs.

The distribution system 210 may implement an extended service set (ESS) 240 extended by connecting the multiple BSSs 200 and 205. The ESS 240 may be used as a term indicating one network configured by connecting one or more APs 225 or 230 through the distribution system 210. The AP included in one ESS 240 may have the same service set identification (SSID).

A portal 220 may serve as a bridge which connects the wireless LAN network (IEEE 802.11) and another network (e.g., 802.X).

In the BSS illustrated in the upper part of FIG. 2, a network between the APs 225 and 230 and a network between the APs 225 and 230 and the STAs 200-1, 205-1, and 205-2 may be implemented. However, the network is configured even between the STAs without the APs 225 and 230 to perform communication. A network in which the communication is performed by configuring the network even between the STAs without the APs 225 and 230 is defined as an Ad-Hoc network or an independent basic service set (IBSS).

A lower part of FIG. 2 illustrates a conceptual view illustrating the IBSS.

Referring to the lower part of FIG. 2, the IBSS is a BSS that operates in an Ad-Hoc mode. Since the IBSS does not include the access point (AP), a centralized management entity that performs a management function at the center does not exist. That is, in the IBSS, STAs 250-1, 250-2, 250-3, 255-4, and 255-5 are managed by a distributed manner. In the IBSS, all STAs 250-1, 250-2, 250-3, 255-4, and 255-5 may be constituted by movable STAs and are not permitted to access the DS to constitute a self-contained network.

Figure 3:
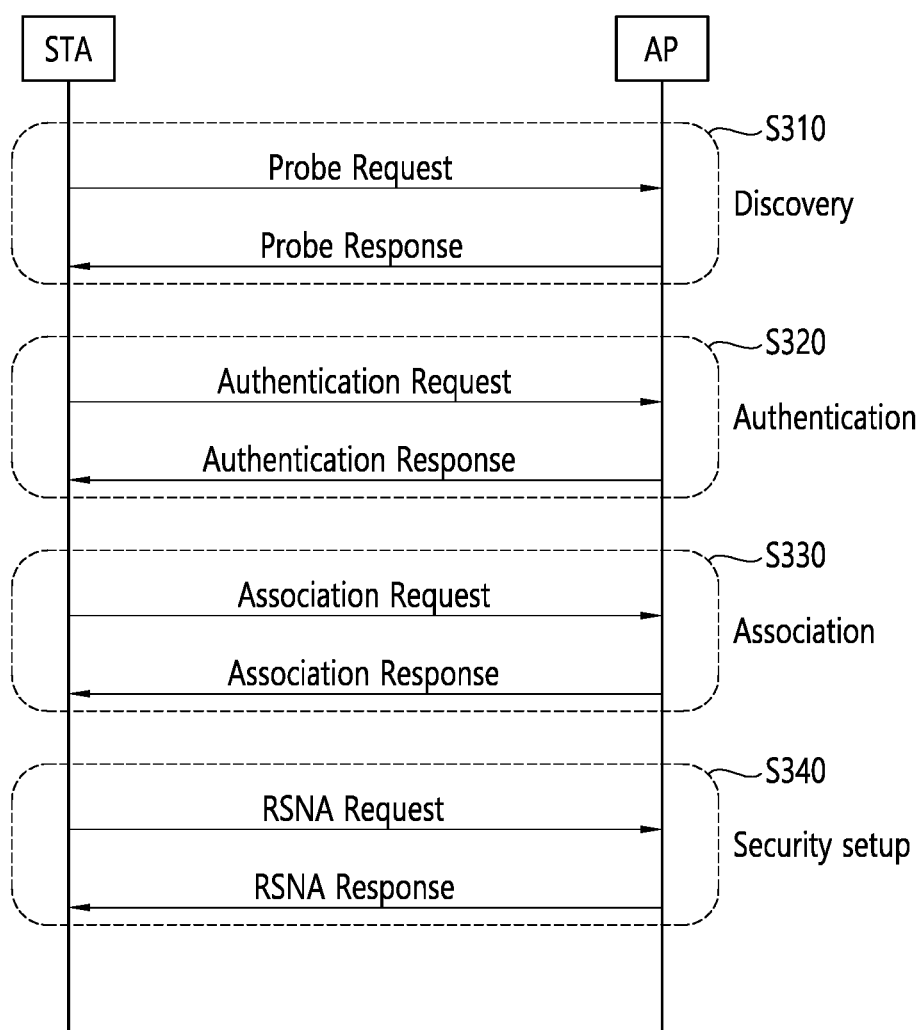
FIG. 3 illustrates a general link setup process.

FIG. 3 illustrates a general link setup process.

In S310, a STA may perform a network discovery operation. The network discovery operation may include a scanning operation of the STA. That is, to access a network, the STA needs to discover a participating network. The STA needs to identify a compatible network before participating in a wireless network, and a process of identifying a network present in a particular area is referred to as scanning. Scanning methods include active scanning and passive scanning.

FIG. 3 illustrates a network discovery operation including an active scanning process. In active scanning, a STA performing scanning transmits a probe request frame and waits for a response to the probe request frame in order to identify which AP is present around while moving to channels. A responder transmits a probe response frame as a response to the probe request frame to the STA having transmitted the probe request frame. Here, the responder may be a STA that transmits the last beacon frame in a BSS of a channel being scanned. In the BSS, since an AP transmits a beacon frame, the AP is the responder. In an IBSS, since STAs in the IBSS transmit a beacon frame in turns, the responder is not fixed. For example, when the STA transmits a probe request frame via channel 1 and receives a probe response frame via channel 1, the STA may store BSS-related information included in the received probe response frame, may move to the next channel (e.g., channel 2), and may perform scanning (e.g., transmits a probe request and receives a probe response via channel 2) by the same method.

Although not shown in FIG. 3, scanning may be performed by a passive scanning method. In passive scanning, a STA performing scanning may wait for a beacon frame while moving to channels. A beacon frame is one of management frames in IEEE 802.11 and is periodically transmitted to indicate the presence of a wireless network and to enable the STA performing scanning to find the wireless network and to participate in the wireless network. In a BSS, an AP serves to periodically transmit a beacon frame. In an IBSS, STAs in the IBSS transmit a beacon frame in turns. Upon receiving the beacon frame, the STA performing scanning stores information related to a BSS included in the beacon frame and records beacon frame information in each channel while moving to another channel. The STA having received the beacon frame may store BSS-related information included in the received beacon frame, may move to the next channel, and may perform scanning in the next channel by the same method.

After discovering the network, the STA may perform an authentication process in S320. The authentication process may be referred to as a first authentication process to be clearly distinguished from the following security setup operation in S340. The authentication process in S320 may include a process in which the STA transmits an authentication request frame to the AP and the AP transmits an authentication response frame to the STA in response. The authentication frames used for an authentication request/response are management frames.

The authentication frames may include information related to an authentication algorithm number, an authentication transaction sequence number, a status code, a challenge text, a robust security network (RSN), and a finite cyclic group.

The STA may transmit the authentication request frame to the AP. The AP may determine whether to allow the authentication of the STA based on the information included in the received authentication request frame. The AP may provide the authentication processing result to the STA via the authentication response frame.

When the STA is successfully authenticated, the STA may perform an association process in S330. The association process includes a process in which the STA transmits an association request frame to the AP and the AP transmits an association response frame to the STA in response. The association request frame may include, for example, information related to various capabilities, a beacon listen interval, a service set identifier (SSID), a supported rate, a supported channel, RSN, a mobility domain, a supported operating class, a traffic indication map (TIM) broadcast request, and an interworking service capability. The association response frame may include, for example, information related to various capabilities, a status code, an association ID (AID), a supported rate, an enhanced distributed channel access (EDCA) parameter set, a received channel power indicator (RCPI), a received signal-to-noise indicator (RSNI), a mobility domain, a timeout interval (association comeback time), an overlapping BSS scanning parameter, a TIM broadcast response, and a QoS map.

In S340, the STA may perform a security setup process. The security setup process in S340 may include a process of setting up a private key through four-way handshaking, for example, through an extensible authentication protocol over LAN (EAPOL) frame.

FIG. 4 illustrates an example of a PPDU used in an IEEE standard.

As illustrated, various types of PHY protocol data units (PPDUs) are used in IEEE a/g/n/ac standards. Specifically, an LTF and a STF include a training signal, a SIG-A and a SIG-B include control information for a receiving STA, and a data field includes user data corresponding to a PSDU (MAC PDU/aggregated MAC PDU).

FIG. 4 also includes an example of an HE PPDU according to IEEE 802.11ax. The HE PPDU according to FIG. 4 is an illustrative PPDU for multiple users. An HE-SIG-B may be included only in a PPDU for multiple users, and an HE-SIG-B may be omitted in a PPDU for a single user.

As illustrated in FIG. 4, the HE-PPDU for multiple users (MUs) may include a legacy-short training field (L-STF), a legacy-long training field (L-LTF), a legacy-signal (L-SIG), a high efficiency-signal A (HE-SIG A), a high efficiency-signal-B (HE-SIG B), a high efficiency-short training field (HE-STF), a high efficiency-long training field (HE-LTF), a data field (alternatively, an MAC payload), and a packet extension (PE) field. The respective fields may be transmitted for illustrated time periods (i.e., 4 or 8 μs).

Hereinafter, a resource unit (RU) used for a PPDU is described. An RU may include a plurality of subcarriers (or tones). An RU may be used to transmit a signal to a plurality of STAs according to OFDMA. Further, an RU may also be defined to transmit a signal to one STA. An RU may be used for an STF, an LTF, a data field, or the like.

Figure 5:
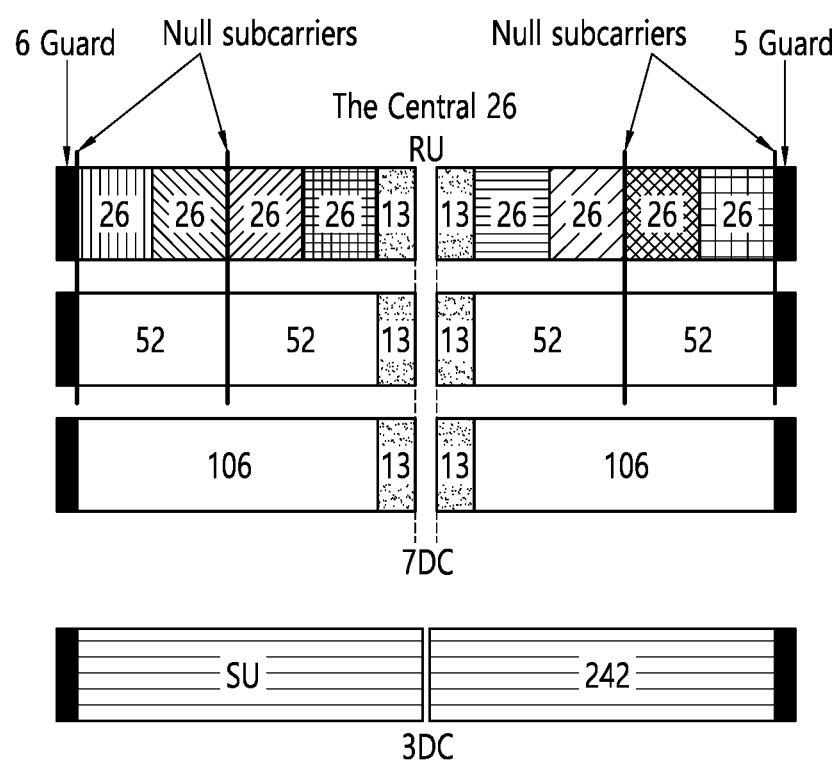
FIG. 5 illustrates a layout of resource units (RUs) used in a band of 20 MHz.

FIG. 5 illustrates a layout of resource units (RUs) used in a band of 20 MHz.

As illustrated in FIG. 5, resource units (RUs) corresponding to different numbers of tones (i.e., subcarriers) may be used to form some fields of an HE-PPDU. For example, resources may be allocated in illustrated RUs for an HE-STF, an HE-LTF, and a data field.

As illustrated in the uppermost part of FIG. 5, a 26-unit (i.e., a unit corresponding to 26 tones) may be disposed. Six tones may be used for a guard band in the leftmost band of the 20 MHz band, and five tones may be used for a guard band in the rightmost band of the 20 MHz band. Further, seven DC tones may be inserted in a center band, that is, a DC band, and a 26-unit corresponding to 13 tones on each of the left and right sides of the DC band may be disposed. A 26-unit, a 52-unit, and a 106-unit may be allocated to other bands. Each unit may be allocated for a receiving STA, that is, a user.

The layout of the RUs in FIG. 5 may be used not only for a multiple users (MUs) but also for a single user (SU), in which case one 242-unit may be used and three DC tones may be inserted as illustrated in the lowermost part of FIG. 5.

Although FIG. 5 proposes RUs having various sizes, that is, a 26-RU, a 52-RU, a 106-RU, and a 242-RU, specific sizes of RUs may be extended or increased. Therefore, the present embodiment is not limited to the specific size of each RU (i.e., the number of corresponding tones).

Figure 6:
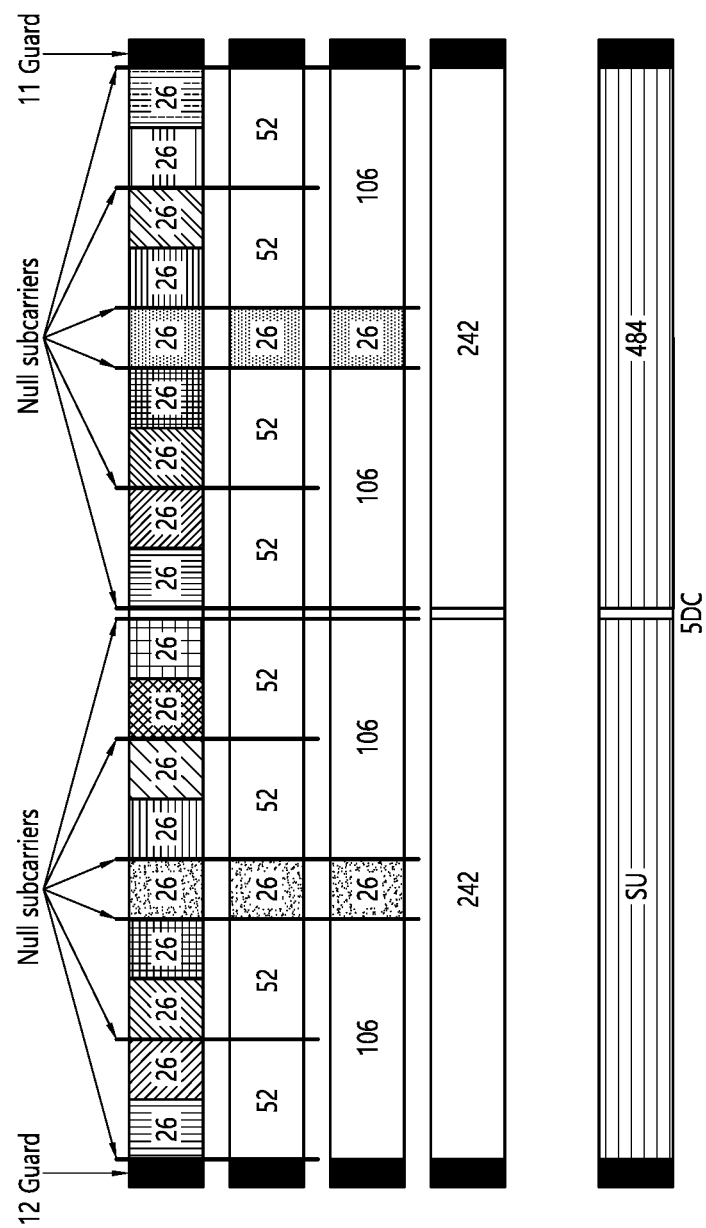
FIG. 6 illustrates a layout of RUs used in a band of 40 MHz.

FIG. 6 illustrates a layout of RUs used in a band of 40 MHz.

Similarly to FIG. 5 in which RUs having various sizes are used, a 26-RU, a 52-RU, a 106-RU, a 242-RU, a 484-RU, and the like may be used in an example of FIG. 6. Further, five DC tones may be inserted in a center frequency, 12 tones may be used for a guard band in the leftmost band of the 40

MHz band, and 11 tones may be used for a guard band in the rightmost band of the 40 MHz band.

As illustrated in FIG. 6, when the layout of the RUs is used for a single user, a 484-RU may be used. The specific number of RUs may be changed similarly to FIG. 5.

Figure 7:
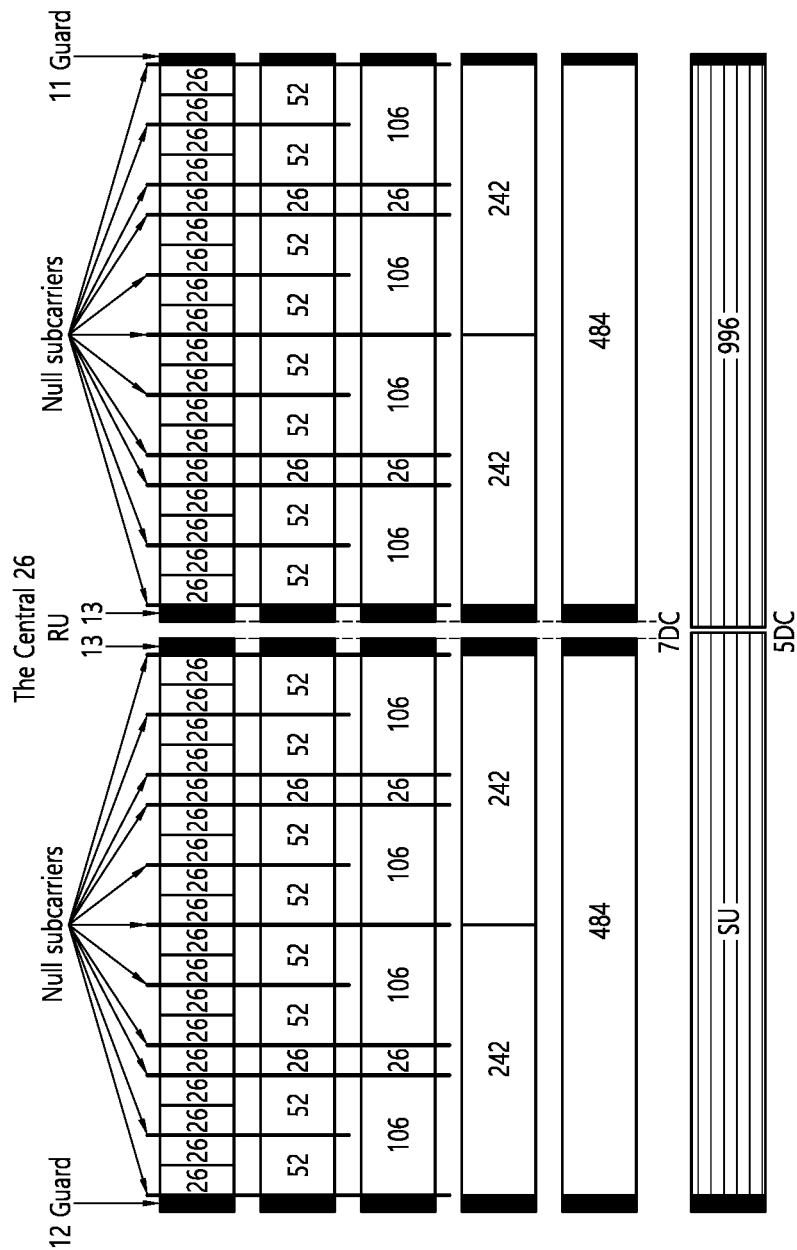
FIG. 7 illustrates a layout of RUs used in a band of 80 MHz.

FIG. 7 illustrates a layout of RUs used in a band of 80 MHz.

Similarly to FIG. 5 and FIG. 6 in which RUs having various sizes are used, a 26-RU, a 52-RU, a 106-RU, a 242-RU, a 484-RU, a 996-RU, and the like may be used in an example of FIG. 7. Further, seven DC tones may be inserted in the center frequency, 12 tones may be used for a guard band in the leftmost band of the 80 MHz band, and 11 tones may be used for a guard band in the rightmost band of the 80 MHz band. In addition, a 26-RU corresponding to 13 tones on each of the left and right sides of the DC band may be used.

As illustrated in FIG. 7, when the layout of the RUs is used for a single user, a 996-RU may be used, in which case five DC tones may be inserted.

The RU described in the present specification may be used in uplink (UL) communication and downlink (DL) communication. For example, when UL-MU communication which is solicited by a trigger frame is performed, a transmitting STA (e.g., an AP) may allocate a first RU (e.g., 26/52/106/242-RU, etc.) to a first STA through the trigger frame, and may allocate a second RU (e.g., 26/52/106/242-RU, etc.) to a second STA. Thereafter, the first STA may transmit a first trigger-based PPDU based on the first RU, and the second STA may transmit a second trigger-based PPDU based on the second RU. The first/second trigger-based PPDU is transmitted to the AP at the same (or overlapped) time period.

For example, when a DL MU PPDU is configured, the transmitting STA (e.g., AP) may allocate the first RU (e.g., 26/52/106/242-RU, etc.) to the first STA, and may allocate the second RU (e.g., 26/52/106/242-RU, etc.) to the second STA. That is, the transmitting STA (e.g., AP) may transmit HE-STF, HE-LTF, and Data fields for the first STA through the first RU in one MU PPDU, and may transmit HE-STF, HE-LTF, and Data fields for the second STA through the second RU.

Information related to a layout of the RU may be signaled through HE-SIG-B.

Figure 8:
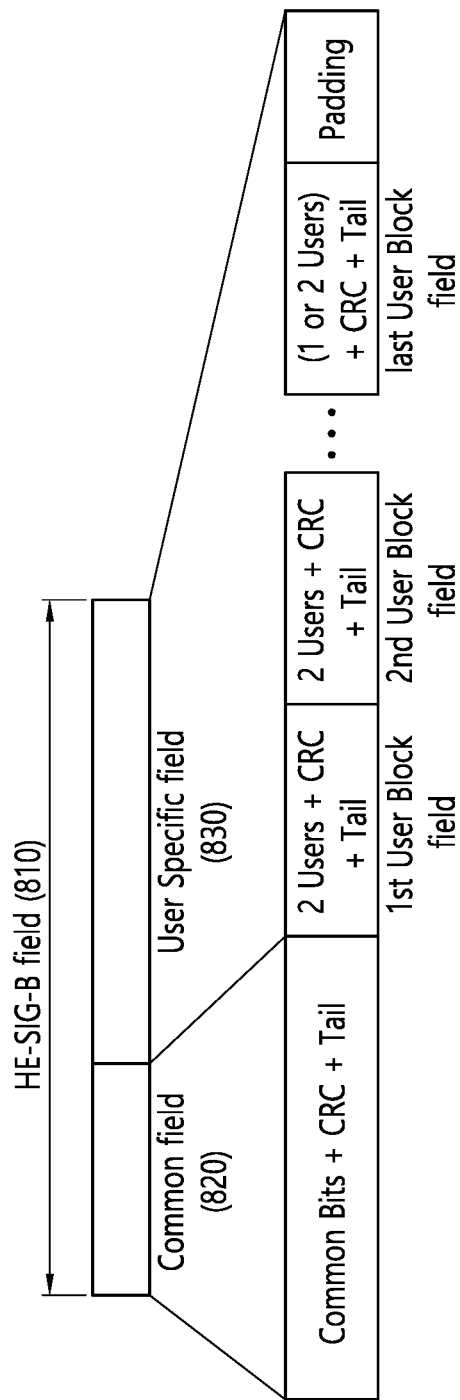
FIG. 8 illustrates a structure of an HE-SIG-B field.

FIG. 8 illustrates a structure of an HE-SIG-B field.

As illustrated, an HE-SIG-B field 810 includes a common field 820 and a user-specific field 830. The common field 820 may include information commonly applied to all users (i.e., user STAs) which receive SIG-B. The user-specific field 830 may be called a user-specific control field. When the SIG-B is transferred to a plurality of users, the user-specific field 830 may be applied only any one of the plurality of users.

As illustrated in FIG. 8, the common field 820 and the user-specific field 830 may be separately encoded.

The common field 820 may include RU allocation information of N*8 bits. For example, the RU allocation information may include information related to a location of an RU. For example, when a 20 MHz channel is used as shown in FIG. 5, the RU allocation information may include information related to a specific frequency band to which a specific RU (26-RU/52-RU/106-RU) is arranged.

An example of a case in which the RU allocation information consists of 8 bits is as follows.

TABLE 1

| 8 bits indices (B7 B6 B5 B4 B3 B2 B1 B0) | #1 | #2 | #3 | #4 | #5 | #6 | #7 | #8 | #9 | Number of entries |
|---|---|---|---|---|---|---|---|---|---|---|
| 00000000 | 26 | 26 | 26 | 26 | 26 | 26 | 26 | 26 | 26 | 1 |
| 00000001 | 26 | 26 | 26 | 26 | 26 | 26 | 26 | 52 | | 1 |
| 00000010 | 26 | 26 | 26 | 26 | 26 | 52 | 26 | 26 | | 1 |
| 00000011 | 26 | 26 | 26 | 26 | 26 | 52 | 52 | | | 1 |
| 00000100 | 26 | 26 | 52 | 26 | 26 | 26 | 26 | | | 1 |
| 00000101 | 26 | 26 | 52 | 26 | 26 | 26 | 52 | | | 1 |
| 00000110 | 26 | 26 | 52 | 26 | 52 | 26 | 26 | | | 1 |
| 00000111 | 26 | 26 | 52 | 26 | 52 | 52 | | | | 1 |
| 00001000 | 52 | 26 | 26 | 26 | 26 | 26 | 26 | 26 | | 1 |

As shown the example of FIG. 5, up to nine 26-RUs may be allocated to the 20 MHz channel. When the RU allocation information of the common field 820 is set to "00000000" as shown in Table 1, the nine 26-RUs may be allocated to a corresponding channel (i.e., 20 MHz). In addition, when the RU allocation information of the common field 820 is set to "00000001" as shown in Table 1, seven 26-RUs and one 52-RU are arranged in a corresponding channel. That is, in the example of FIG. 5, the 52-RU may be allocated to the rightmost side, and the seven 26-RUs may be allocated to the left thereof.

The example of Table 1 shows only some of RU locations capable of displaying the RU allocation information.

For example, the RU allocation information may include an example of Table 2 below.

TABLE 2

| 8 bits indices (B7 B6 B5 B4 B3 B2 B1 B0) | #1 | #2 | #3 | #4 | #5 | #6 | #7 | #8 | #9 | Number of entries |
|---|---|---|---|---|---|---|---|---|---|---|
| 01000$y_2y_1y_0$ | | | 106 | | 26 | 26 | 26 | 26 | 26 | 8 |
| 01001$y_2y_1y_0$ | | | 106 | | 26 | 26 | 26 | 52 | | 8 |

"01000y2y1y0" relates to an example in which a 106-RU is allocated to the leftmost side of the 20 MHz channel, and five 26-RUs are allocated to the right side thereof. In this case, a plurality of STAs (e.g., user-STAs) may be allocated to the 106-RU, based on an MU-MIMO scheme. Specifically, up to 8 STAs (e.g., user-STAs) may be allocated to the 106-RU, and the number of STAs (e.g., user-STAs) allocated to the 106-RU is determined based on 3-bit information (y2y1y0). For example, when the 3-bit information (y2y1y0) is set to N, the number of STAs (e.g., user-STAs) allocated to the 106-RU based on the MU-MIMO scheme may be N+1.

In general, a plurality of STAs (e.g., user STAs) different from each other may be allocated to a plurality of RUs. However, the plurality of STAs (e.g., user STAs) may be allocated to one or more RUs having at least a specific size (e.g., 106 subcarriers), based on the MU-MIMO scheme.

As shown in FIG. 8, the user-specific field 830 may include a plurality of user fields. As described above, the number of STAs (e.g., user STAs) allocated to a specific channel may be determined based on the RU allocation information of the common field 820. For example, when the RU allocation information of the common field 820 is "00000000", one user STA may be allocated to each of nine 26-RUs (e.g., nine user STAs may be allocated). That is, up to 9 user STAs may be allocated to a specific channel through an OFDMA scheme. In other words, up to 9 user STAs may be allocated to a specific channel through a non-MU-MIMO scheme.

For example, when RU allocation is set to "01000y2y1y0", a plurality of STAs may be allocated to the 106-RU arranged at the leftmost side through the MU-MIMO scheme, and five user STAs may be allocated to five 26-RUs arranged to the right side thereof through the non-MU MIMO scheme. This case is specified through an example of FIG. 9.

Figure 9:
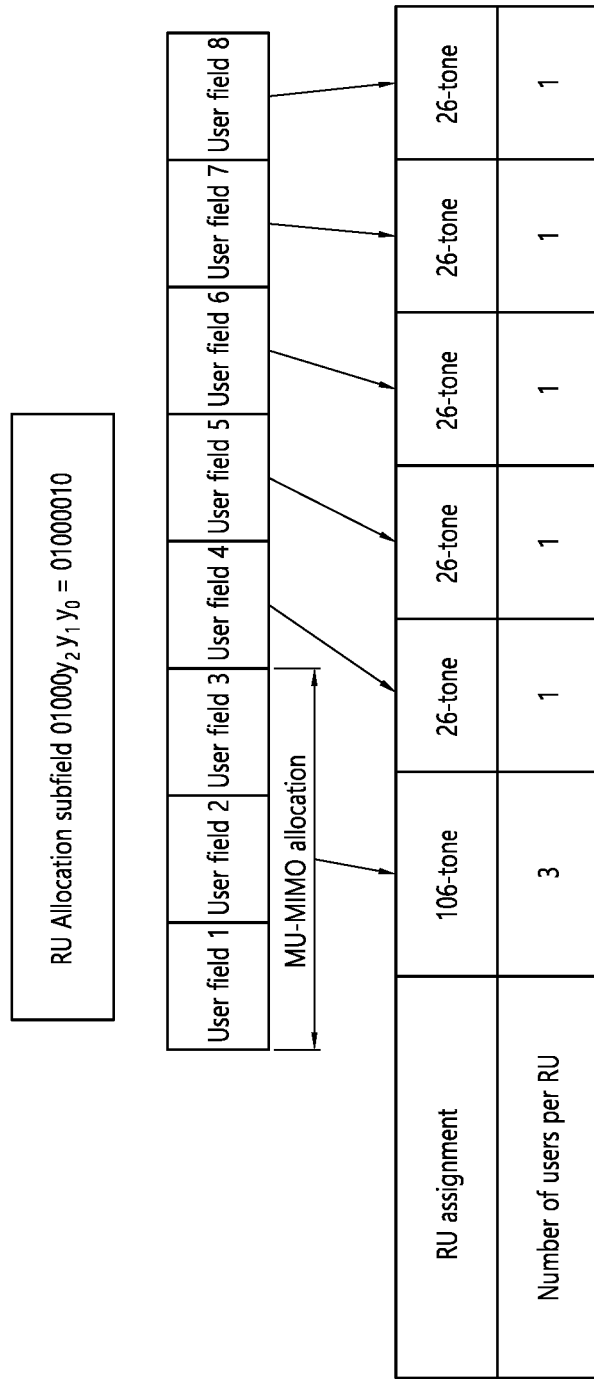
FIG. 9 illustrates an example in which a plurality of user STAs are allocated to the same RU through an MU-MIMO scheme.

FIG. 9 illustrates an example in which a plurality of user STAs are allocated to the same RU through an MU-MIMO scheme.

For example, when RU allocation is set to "01000010" as shown in FIG. 9, a 106-RU may be allocated to the leftmost side of a specific channel, and five 26-RUs may be allocated to the right side thereof. In addition, three user STAs may be allocated to the 106-RU through the MU-MIMO scheme. As a result, since eight user STAs are allocated, the user-specific field 830 of HE-SIG-B may include eight user fields.

The eight user fields may be expressed in the order shown in FIG. 9. In addition, as shown in FIG. 8, two user fields may be implemented with one user block field.

The user fields shown in FIG. 8 and FIG. 9 may be configured based on two formats. That is, a user field related to an MU-MIMO scheme may be configured in a first format, and a user field related to a non-MIMO scheme may be configured in a second format. Referring to the example of FIG. 9, a user field 1 to a user field 3 may be based on the first format, and a user field 4 to a user field 8 may be based on the second format. The first format or the second format may include bit information of the same length (e.g., 21 bits).

Each user field may have the same size (e.g., 21 bits). For example, the user field of the first format (the first of the MU-MIMO scheme) may be configured as follows.

For example, a first bit (i.e., B0-B10) in the user field (i.e., 21 bits) may include identification information (e.g., STA-ID, partial AID, etc.) of a user STA to which a corresponding user field is allocated. In addition, a second bit (i.e., B11-B14) in the user field (i.e., 21 bits) may include information related to a spatial configuration. Specifically, an example of the second bit (i.e., B11-B14) may be as shown in Table 3 and Table 4 below.

TABLE 3

| $N_{user}$ | B3...B0 | $N_{STS}$ [1] | $N_{STS}$ [2] | $N_{STS}$ [3] | $N_{STS}$ [4] | $N_{STS}$ [5] | $N_{STS}$ [6] | $N_{STS}$ [7] | $N_{STS}$ [8] | Total $N_{STS}$ | Number of entries |
|---|---|---|---|---|---|---|---|---|---|---|---|
| 2 | 0000-0011 | 1-4 | 1 | | | | | | | 2-5 | 10 |
| | 0100-0110 | 2-4 | 2 | | | | | | | 4-6 | |
| | 0111-1000 | 3-4 | 3 | | | | | | | 6-7 | |
| | 1001 | 4 | 4 | | | | | | | 8 | |
| 3 | 0000-0011 | 1-4 | 1 | 1 | | | | | | 3-6 | 13 |
| | 0100-0110 | 2-4 | 2 | 1 | | | | | | 5-7 | |
| | 0111-1000 | 3-4 | 3 | 1 | | | | | | 7-8 | |
| | 1001-1011 | 2-4 | 2 | 2 | | | | | | 6-8 | |
| | 1100 | 3 | 3 | 2 | | | | | | 8 | |
| 4 | 0000-0011 | 1-4 | 1 | 1 | 1 | | | | | 4-7 | 11 |
| | 0100-0110 | 2-4 | 2 | 1 | 1 | | | | | 6-8 | |
| | 0111 | 3 | 3 | 1 | 1 | | | | | 8 | |
| | 1000-1001 | 2-3 | 2 | 2 | 1 | | | | | 7-8 | |
| | 1010 | 2 | 2 | 2 | 2 | | | | | 8 | |

TABLE 4

| $N_{user}$ | B3...B0 | $N_{STS}$ [1] | $N_{STS}$ [2] | $N_{STS}$ [3] | $N_{STS}$ [4] | $N_{STS}$ [5] | $N_{STS}$ [6] | $N_{STS}$ [7] | $N_{STS}$ [8] | Total $N_{STS}$ | Number of entries |
|---|---|---|---|---|---|---|---|---|---|---|---|
| 5 | 0000-0011 | 1-4 | 1 | 1 | 1 | 1 | | | | 5-8 | 7 |
| | 0100-0101 | 2-3 | 2 | 1 | 1 | 1 | | | | 7-8 | |
| | 0110 | 2 | 2 | 2 | 1 | 1 | | | | 8 | |
| 6 | 0000-0010 | 1-3 | 1 | 1 | 1 | 1 | 1 | | | 6-8 | 4 |
| | 0011 | 2 | 2 | 1 | 1 | 1 | 1 | | | 8 | |
| 7 | 0000-0001 | 1-2 | 1 | 1 | 1 | 1 | 1 | 1 | | 7-8 | 2 |
| 8 | 0000 | 1 | 1 | 1 | 1 | 1 | 1 | 1 | 1 | 8 | 1 |

As shown in Table 3 and/or Table 4, the second bit (e.g., B11-B14) may include information related to the number of spatial streams allocated to the plurality of user STAs which are allocated based on the MU-MIMO scheme. For example, when three user STAs are allocated to the 106-RU based on the MU-MIMO scheme as shown in FIG. 9, N user is set to "3". Therefore, values of N_STS[1], N_STS[2], and N_STS [3] may be determined as shown in Table 3. For example, when a value of the second bit (B11-B14) is "0011", it may be set to N_STS[1]=4, N_STS [2]=1, N_STS[3]=1. That is, in the example of FIG. 9, four spatial streams may be allocated to the user field 1, one spatial stream may be allocated to the user field 1, and one spatial stream may be allocated to the user field 3.

As shown in the example of Table 3 and/or Table 4, information (i.e., the second bit, B11-B14) related to the number of spatial streams for the user STA may consist of 4 bits. In addition, the information (i.e., the second bit, B11-B14) on the number of spatial streams for the user STA may support up to eight spatial streams. In addition, the information (i.e., the second bit, B11-B14) on the number of spatial streams for the user STA may support up to four spatial streams for one user STA.

In addition, a third bit (i.e., B15-18) in the user field (i.e., 21 bits) may include modulation and coding scheme (MCS) information. The MCS information may be applied to a data field in a PPDU including corresponding SIG-B.

An MCS, MCS information, an MCS index, an MCS field, or the like used in the present specification may be indicated by an index value. For example, the MCS information may be indicated by an index 0 to an index 11. The MCS information may include information related to a constellation modulation type (e.g., BPSK, QPSK, 16-QAM, 64-QAM, 256-QAM, 1024-QAM, etc.) and information related to a coding rate (e.g., 1/2, 2/3, 3/4, 5/6e, etc.). Information related to a channel coding type (e.g., LCC or LDPC) may be excluded in the MCS information.

In addition, a fourth bit (i.e., B19) in the user field (i.e., 21 bits) may be a reserved field.

In addition, a fifth bit (i.e., B20) in the user field (i.e., 21 bits) may include information related to a coding type (e.g., BCC or LDPC). That is, the fifth bit (i.e., B20) may include information related to a type (e.g., BCC or LDPC) of channel coding applied to the data field in the PPDU including the corresponding SIG-B.

The aforementioned example relates to the user field of the first format (the format of the MU-MIMO scheme). An example of the user field of the second format (the format of the non-MU-MIMO scheme) is as follows.

A first bit (e.g., B0-B10) in the user field of the second format may include identification information of a user STA. In addition, a second bit (e.g., B11-B13) in the user field of the second format may include information related to the number of spatial streams applied to a corresponding RU. In addition, a third bit (e.g., B14) in the user field of the second format may include information related to whether a beamforming steering matrix is applied. A fourth bit (e.g., B15-B18) in the user field of the second format may include modulation and coding scheme (MCS) information. In addition, a fifth bit (e.g., B19) in the user field of the second format may include information related to whether dual carrier modulation (DCM) is applied. In addition, a sixth bit (i.e., B20) in the user field of the second format may include information related to a coding type (e.g., BCC or LDPC).

Figure 10:
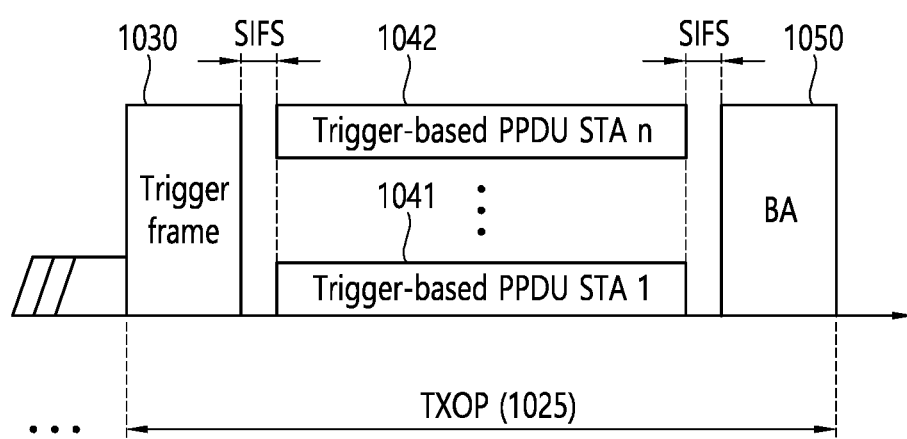
FIG. 10 illustrates an operation based on UL-MU.

FIG. 10 illustrates an operation based on UL-MU. As illustrated, a transmitting STA (e.g., an AP) may perform channel access through contending (e.g., a backoff operation), and may transmit a trigger frame 1030. That is, the transmitting STA may transmit a PPDU including the trigger frame 1030. Upon receiving the PPDU including the trigger frame, a trigger-based (TB) PPDU is transmitted after a delay corresponding to SIFS.

TB PPDUs 1041 and 1042 may be transmitted at the same time period, and may be transmitted from a plurality of STAs (e.g., user STAs) having AIDs indicated in the trigger frame 1030. An ACK frame 1050 for the TB PPDU may be implemented in various forms.

A specific feature of the trigger frame is described with reference to FIG. 11 to FIG. 13. Even if UL-MU communication is used, an orthogonal frequency division multiple access (OFDMA) scheme or an MU MIMO scheme may be used, and the OFDMA and MU-MIMO schemes may be simultaneously used.

Figure 11:
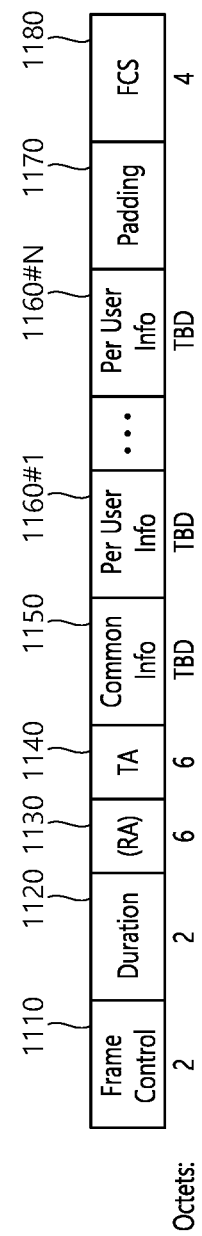
FIG. 11 illustrates an example of a trigger frame.

FIG. 11 illustrates an example of a trigger frame. The trigger frame of FIG. 11 allocates a resource for uplink multiple-user (MU) transmission, and may be transmitted, for example, from an AP. The trigger frame may be configured of a MAC frame, and may be included in a PPDU.

Each field shown in FIG. 11 may be partially omitted, and another field may be added. In addition, a length of each field may be changed to be different from that shown in the figure.

A frame control field 1110 of FIG. 11 may include information related to a MAC protocol version and extra additional control information. A duration field 1120 may include time information for NAV configuration or information related to an identifier (e.g., AID) of a STA.

In addition, an RA field 1130 may include address information of a receiving STA of a corresponding trigger frame, and may be optionally omitted. A TA field 1140 may include address information of a STA (e.g., an AP) which transmits the corresponding trigger frame. A common information field 1150 includes common control information applied to the receiving STA which receives the corresponding trigger frame. For example, a field indicating a length of an L-SIG field of an uplink PPDU transmitted in response to the corresponding trigger frame or information for controlling content of a SIG-A field (i.e., HE-SIG-A field) of the uplink PPDU transmitted in response to the corresponding trigger frame may be included. In addition, as common control information, information related to a length of a CP of the uplink PPDU transmitted in response to the corresponding trigger frame or information related to a length of an LTF field may be included.

In addition, per user information fields 1160 #1 to 1160 #N corresponding to the number of receiving STAs which receive the trigger frame of FIG. 11 are preferably included. The per user information field may also be called an "allocation field".

In addition, the trigger frame of FIG. 11 may include a padding field 1170 and a frame check sequence field 1180.

Each of the per user information fields 1160 #1 to 1160 #N shown in FIG. 11 may include a plurality of subfields.

Figure 12:
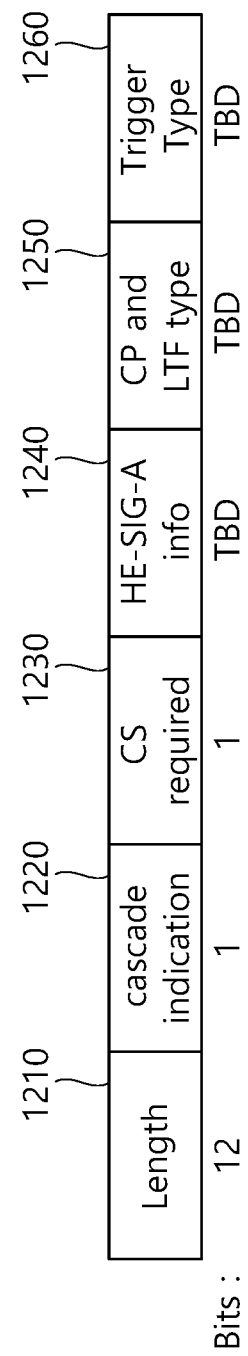
FIG. 12 illustrates an example of a common information field of a trigger frame.

FIG. 12 illustrates an example of a common information field of a trigger frame. A subfield of FIG. 12 may be partially omitted, and an extra subfield may be added. In addition, a length of each subfield illustrated may be changed.

A length field 1210 illustrated has the same value as a length field of an L-SIG field of an uplink PPDU transmitted in response to a corresponding trigger frame, and a length field of the L-SIG field of the uplink PPDU indicates a length of the uplink PPDU. As a result, the length field 1210 of the trigger frame may be used to indicate the length of the corresponding uplink PPDU.

In addition, a cascade identifier field 1220 indicates whether a cascade operation is performed. The cascade operation implies that downlink MU transmission and uplink MU transmission are performed together in the same TXOP. That is, it implies that downlink MU transmission is performed and thereafter uplink MU transmission is performed after a pre-set time (e.g., SIFS). During the cascade operation, only one transmitting device (e.g., AP) may perform downlink communication, and a plurality of transmitting devices (e.g., non-APs) may perform uplink communication.

A CS request field 1230 indicates whether a wireless medium state or a NAV or the like is necessarily considered in a situation where a receiving device which has received a corresponding trigger frame transmits a corresponding uplink PPDU.

An HE-SIG-A information field 1240 may include information for controlling content of a SIG-A field (i.e., HE-SIG-A field) of the uplink PPDU in response to the corresponding trigger frame.

A CP and LTF type field 1250 may include information related to a CP length and LTF length of the uplink PPDU transmitted in response to the corresponding trigger frame. A trigger type field 1260 may indicate a purpose of using the corresponding trigger frame, for example, typical triggering, triggering for beamforming, a request for block ACK/NACK, or the like.

It may be assumed that the trigger type field 1260 of the trigger frame in the present specification indicates a trigger frame of a basic type for typical triggering. For example, the trigger frame of the basic type may be referred to as a basic trigger frame.

Figure 13:
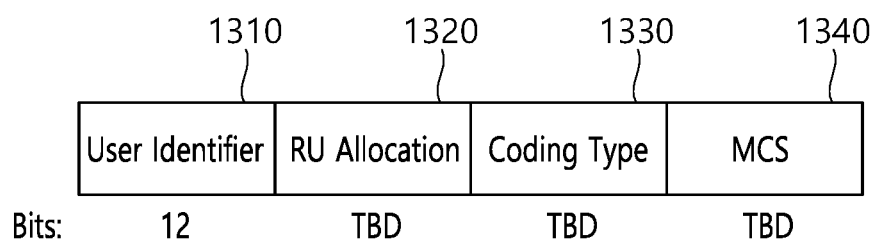
FIG. 13 illustrates an example of a subfield included in a per user information field.

FIG. 13 illustrates an example of a subfield included in a per user information field. A user information field 1300 of FIG. 13 may be understood as any one of the per user information fields 1160 #1 to 1160 #N mentioned above with reference to FIG. 11. A subfield included in the user information field 1300 of FIG. 13 may be partially omitted, and an extra subfield may be added. In addition, a length of each subfield illustrated may be changed.

A user identifier field 1310 of FIG. 13 indicates an identifier of a STA (i.e., receiving STA) corresponding to per user information. An example of the identifier may be the entirety or part of an association identifier (AID) value of the receiving STA.

In addition, an RU allocation field 1320 may be included. That is, when the receiving STA identified through the user identifier field 1310 transmits a TB PPDU in response to the trigger frame, the TB PPDU is transmitted through an RU indicated by the RU allocation field 1320. In this case, the RU indicated by the RU allocation field 1320 may be an RU shown in FIG. 5, FIG. 6, and FIG. 7.

The subfield of FIG. 13 may include a coding type field 1330. The coding type field 1330 may indicate a coding type of the TB PPDU. For example, when BCC coding is applied to the TB PPDU, the coding type field 1330 may be set to '1', and when LDPC coding is applied, the coding type field 1330 may be set to '0'.

In addition, the subfield of FIG. 13 may include an MCS field 1340. The MCS field 1340 may indicate an MCS scheme applied to the TB PPDU. For example, when BCC coding is applied to the TB PPDU, the coding type field 1330 may be set to '1', and when LDPC coding is applied, the coding type field 1330 may be set to '0'.

Hereinafter, a UL OFDMA-based random access (UORA) scheme will be described.

Figure 14:
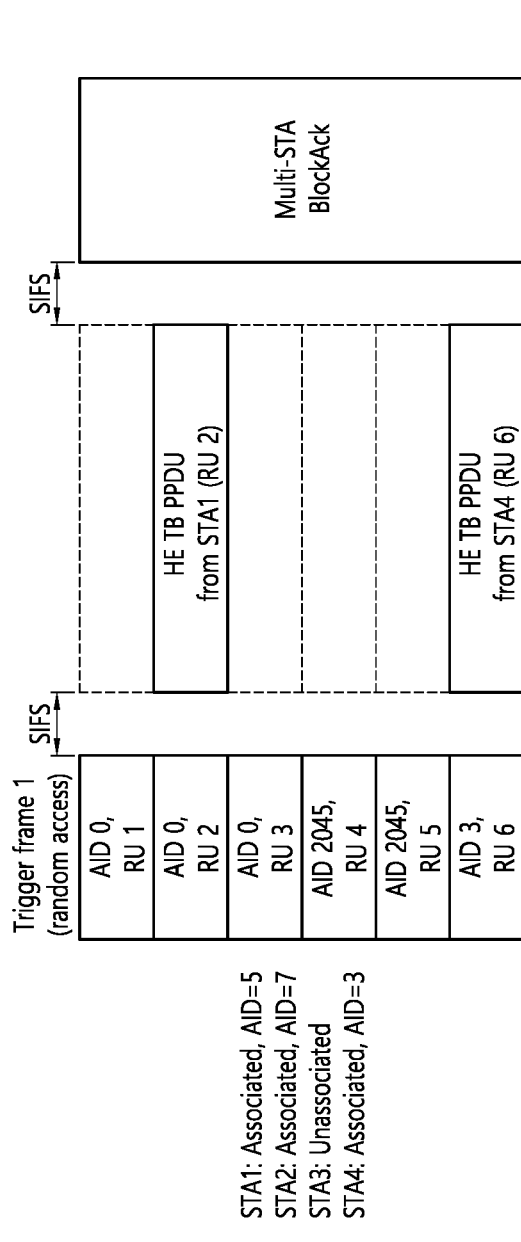
FIG. 14 describes a technical feature of the UORA scheme.

FIG. 14 describes a technical feature of the UORA scheme.

A transmitting STA (e.g., an AP) may allocate six RU resources through a trigger frame as shown in FIG. 14. Specifically, the AP may allocate a 1st RU resource (AID 0, RU 1), a 2nd RU resource (AID 0, RU 2), a 3rd RU resource (AID 0, RU 3), a 4th RU resource (AID 2045, RU 4), a 5th RU resource (AID 2045, RU 5), and a 6th RU resource (AID 3, RU 6). Information related to the AID 0, AID 3, or AID 2045 may be included, for example, in the user identifier field 1310 of FIG. 13. Information related to the RU 1 to RU 6 may be included, for example, in the RU allocation field 1320 of FIG. 13. AID=0 may imply a UORA resource for an associated STA, and AID=2045 may imply a UORA resource for an un-associated STA. Accordingly, the 1st to 3rd RU resources of FIG. 14 may be used as a UORA resource for the associated STA, the 4th and 5th RU resources of FIG. 14 may be used as a UORA resource for the un-associated STA, and the 6th RU resource of FIG. 14 may be used as a typical resource for UL MU.

In the example of FIG. 14, an OFDMA random access backoff (OBO) of a STA1 is decreased to 0, and the STA1 randomly selects the 2nd RU resource (AID 0, RU 2). In addition, since an OBO counter of a STA2/3 is greater than 0, an uplink resource is not allocated to the STA2/3. In addition, regarding a STA4 in FIG. 14, since an AID (e.g., AID=3) of the STA4 is included in a trigger frame, a resource of the RU 6 is allocated without backoff.

Specifically, since the STA1 of FIG. 14 is an associated STA, the total number of eligible RA RUs for the STA1 is 3 (RU 1, RU 2, and RU 3), and thus the STA1 decreases an OBO counter by 3 so that the OBO counter becomes 0. In addition, since the STA2 of FIG. 14 is an associated STA, the total number of eligible RA RUs for the STA2 is 3 (RU 1, RU 2, and RU 3), and thus the STA2 decreases the OBO counter by 3 but the OBO counter is greater than 0. In addition, since the STA3 of FIG. 14 is an un-associated STA, the total number of eligible RA RUs for the STA3 is 2 (RU 4, RU 5), and thus the STA3 decreases the OBO counter by 2 but the OBO counter is greater than 0.

Figure 15:
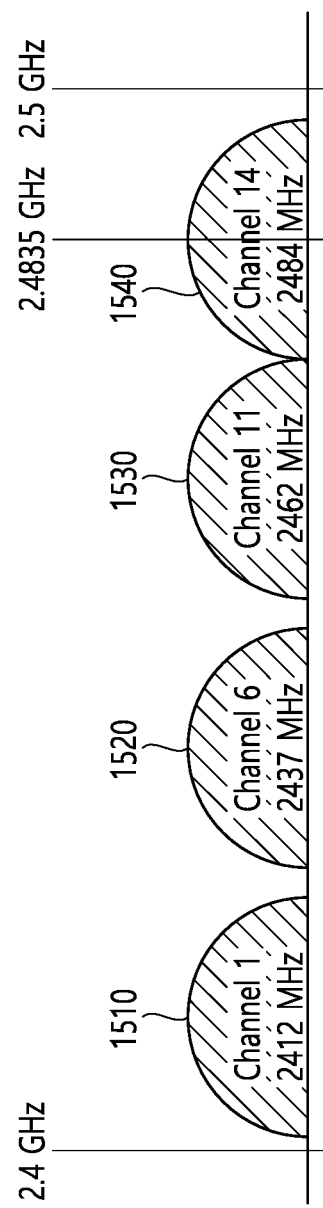
FIG. 15 illustrates an example of a channel used/supported/defined within a 2.4 GHz band.

FIG. 15 illustrates an example of a channel used/supported/defined within a 2.4 GHz band.

The 2.4 GHz band may be called in other terms such as a first band. In addition, the 2.4 GHz band may imply a frequency domain in which channels of which a center frequency is close to 2.4 GHz (e.g., channels of which a center frequency is located within 2.4 to 2.5 GHz) are used/supported/defined.

A plurality of 20 MHz channels may be included in the 2.4 GHz band. 20 MHz within the 2.4 GHz may have a plurality of channel indices (e.g., an index 1 to an index 14). For example, a center frequency of a 20 MHz channel to which a channel index 1 is allocated may be 2.412 GHz, a center frequency of a 20 MHz channel to which a channel index 2 is allocated may be 2.417 GHz, and a center frequency of a 20 MHz channel to which a channel index N is allocated may be (2.407+0.005*N) GHz. The channel index may be called in various terms such as a channel number or the like. Specific numerical values of the channel index and center frequency may be changed.

FIG. 15 exemplifies 4 channels within a 2.4 GHz band. Each of 1st to 4th frequency domains 1510 to 1540 shown herein may include one channel. For example, the 1st frequency domain 1510 may include a channel 1 (a 20 MHz channel having an index 1). In this case, a center frequency of the channel 1 may be set to 2412 MHz. The 2nd frequency domain 1520 may include a channel 6. In this case, a center frequency of the channel 6 may be set to 2437 MHz. The 3rd frequency domain 1530 may include a channel 11. In this case, a center frequency of the channel 11 may be set to 2462 MHz. The 4th frequency domain 1540 may include a channel 14. In this case, a center frequency of the channel 14 may be set to 2484 MHz.

Figure 16:
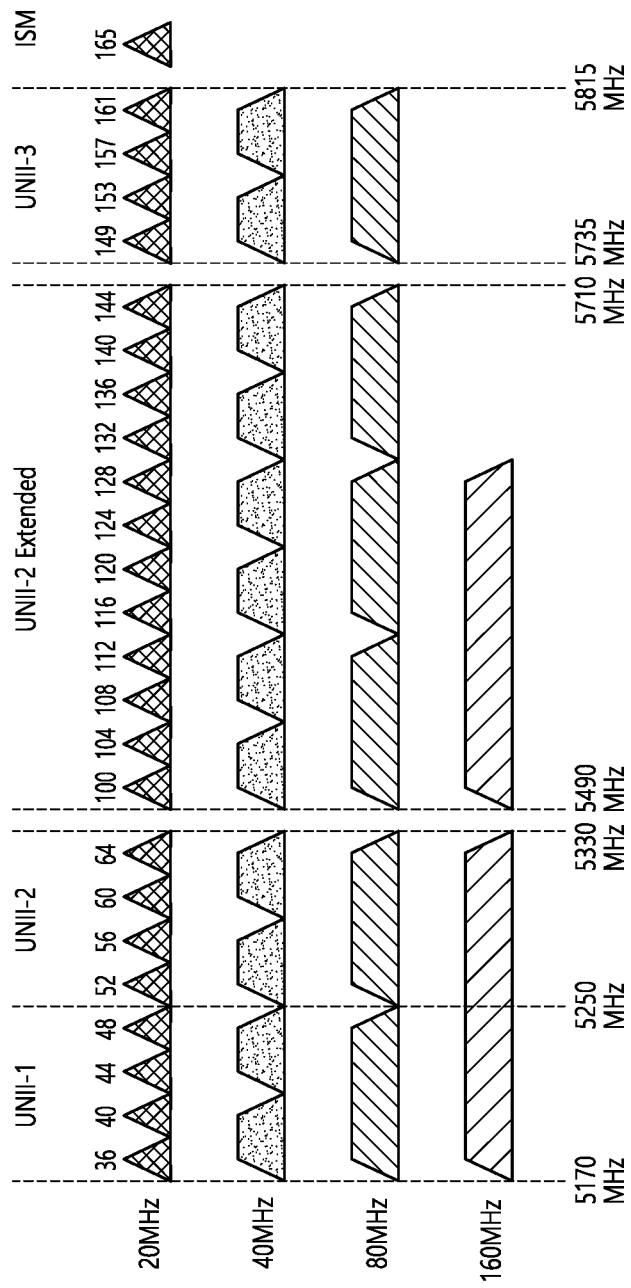
FIG. 16 illustrates an example of a channel used/supported/defined within a 5 GHz band.

FIG. 16 illustrates an example of a channel used/supported/defined within a 5 GHz band.

The 5 GHz band may be called in other terms such as a second band or the like. The 5 GHz band may imply a frequency domain in which channels of which a center frequency is greater than or equal to 5 GHz and less than 6 GHz (or less than 5.9 GHz) are used/supported/defined. Alternatively, the 5 GHz band may include a plurality of channels between 4.5 GHz and 5.5 GHz. A specific numerical value shown in FIG. 16 may be changed.

A plurality of channels within the 5 GHz band include an unlicensed national information infrastructure (UNII)-1, a UNII-2, a UNII-3, and an ISM. The INII-1 may be called UNII Low. The UNII-2 may include a frequency domain called UNII Mid and UNII-2Extended. The UNII-3 may be called UNII-Upper.

A plurality of channels may be configured within the 5 GHz band, and a bandwidth of each channel may be variously set to, for example, 20 MHz, 40 MHz, 80 MHz, 160 MHz, or the like. For example, 5170 MHz to 5330 MHz frequency domains/ranges within the UNII-1 and UNII-2 may be divided into eight 20 MHz channels. The 5170 MHz to 5330 MHz frequency domains/ranges may be divided into four channels through a 40 MHz frequency domain. The 5170 MHz to 5330 MHz frequency domains/ranges may be divided into two channels through an 80 MHz frequency domain. Alternatively, the 5170 MHz to 5330 MHz frequency domains/ranges may be divided into one channel through a 160 MHz frequency domain.

Figure 17:
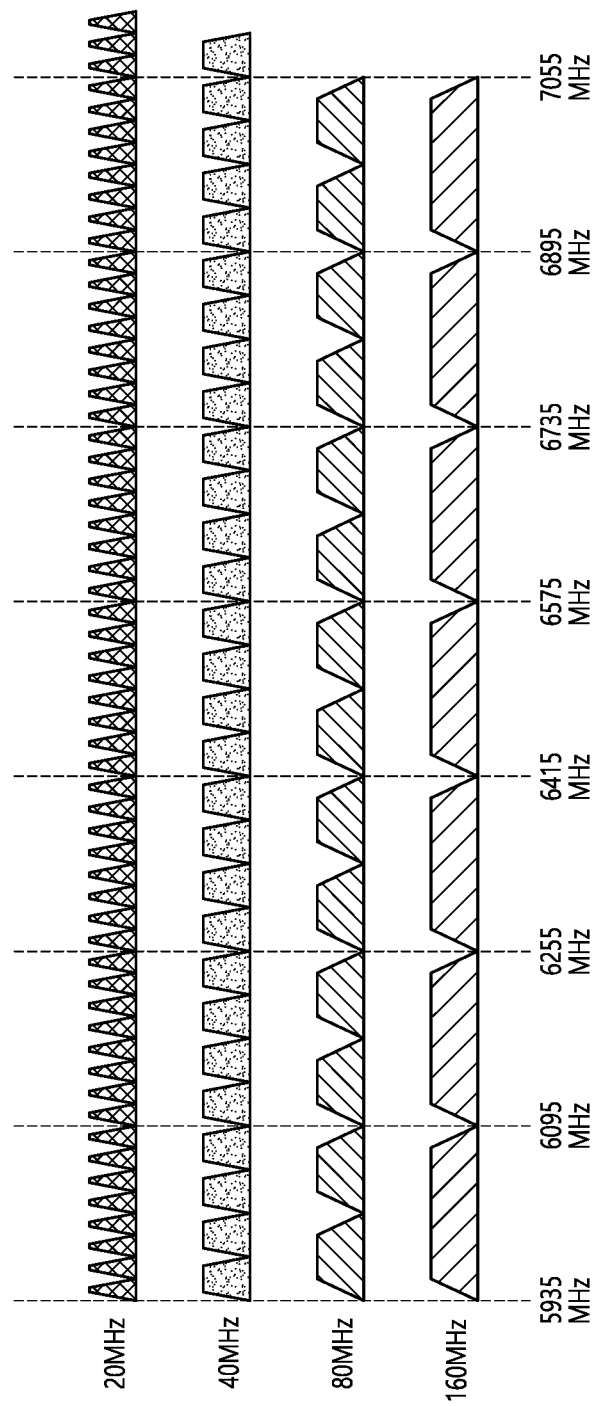
FIG. 17 illustrates an example of a channel used/supported/defined within a 6 GHz band.

FIG. 17 illustrates an example of a channel used/supported/defined within a 6 GHz band.

The 6 GHz band may be called in other terms such as a third band or the like. The 6 GHz band may imply a frequency domain in which channels of which a center frequency is greater than or equal to 5.9 GHz are used/supported/defined. A specific numerical value shown in FIG. 17 may be changed.

For example, the 20 MHz channel of FIG. 17 may be defined starting from 5.940 GHz. Specifically, among 20 MHz channels of FIG. 17, the leftmost channel may have an index 1 (or a channel index, a channel number, etc.), and 5.945 GHz may be assigned as a center frequency. That is, a center frequency of a channel of an index N may be determined as (5.940+0.005*N) GHz.

Accordingly, an index (or channel number) of the 2 MHz channel of FIG. 17 may be 1, 5, 9, 13, 17, 21, 25, 29, 33, 37, 41, 45, 49, 53, 57, 61, 65, 69, 73, 77, 81, 85, 89, 93, 97, 101, 105, 109, 113, 117, 121, 125, 129, 133, 137, 141, 145, 149, 153, 157, 161, 165, 169, 173, 177, 181, 185, 189, 193, 197, 201, 205, 209, 213, 217, 221, 225, 229, 233. In addition, according to the aforementioned (5.940+0.005*N) GHz rule, an index of the 40 MHz channel of FIG. 17 may be 3, 11, 19, 27, 35, 43, 51, 59, 67, 75, 83, 91, 99, 107, 115, 123, 131, 139, 147, 155, 163, 171, 179, 187, 195, 203, 211, 219, 227.

Although 20, 40, 80, and 160 MHz channels are illustrated in the example of FIG. 17, a 240 MHz channel or a 320 MHz channel may be additionally added.

Hereinafter, a PPDU transmitted/received in a STA of the present specification will be described.

Figure 18:
FIG. 18 illustrates an example of a PPDU used in the present specification.

FIG. 18 illustrates an example of a PPDU used in the present specification.

The PPDU of FIG. 18 may be called in various terms such as an EHT PPDU, a TX PPDU, an RX PPDU, a first type or N-th type PPDU, or the like. For example, in the present specification, the PPDU or the EHT PPDU may be called in various terms such as a TX PPDU, a RX PPDU, a first type or N-th type PPDU, or the like. In addition, the EHT PPDU may be used in an EHT system and/or a new WLAN system enhanced from the EHT system.

The PPDU of FIG. 18 may indicate the entirety or part of a PPDU type used in the EHT system. For example, the example of FIG. 18 may be used for both of a single-user (SU) mode and a multi-user (MU) mode. In other words, the PPDU of FIG. 18 may be a PPDU for one receiving STA or a plurality of receiving STAs. When the PPDU of FIG. 18 is used for a trigger-based (TB) mode, the EHT-SIG of FIG. 18 may be omitted. In other words, an STA which has received a trigger frame for uplink-MU (UL-MU) may transmit the PPDU in which the EHT-SIG is omitted in the example of FIG. 18.

In FIG. 18, an L-STF to an EHT-LTF may be called a preamble or a physical preamble, and may be generated/transmitted/received/obtained/decoded in a physical layer.

A subcarrier spacing of the L-STF, L-LTF, L-SIG, RL-SIG, U-SIG, and EHT-SIG fields of FIG. 18 may be determined as 312.5 kHz, and a subcarrier spacing of the EHT-STF, EHT-LTF, and Data fields may be determined as 78.125 kHz. That is, a tone index (or subcarrier index) of the L-STF, L-LTF, L-SIG, RL-SIG, U-SIG, and EHT-SIG fields may be expressed in unit of 312.5 kHz, and a tone index (or subcarrier index) of the EHT-STF, EHT-LTF, and Data fields may be expressed in unit of 78.125 kHz.

In the PPDU of FIG. 18, the L-LTE and the L-STF may be the same as those in the conventional fields.

The L-SIG field of FIG. 18 may include, for example, bit information of 24 bits. For example, the 24-bit information may include a rate field of 4 bits, a reserved bit of 1 bit, a length field of 12 bits, a parity bit of 1 bit, and a tail bit of 6 bits. For example, the length field of 12 bits may include information related to a length or time duration of a PPDU. For example, the length field of 12 bits may be determined based on a type of the PPDU. For example, when the PPDU is a non-HT, HT, VHT PPDU or an EHT PPDU, a value of the length field may be determined as a multiple of 3. For example, when the PPDU is an HE PPDU, the value of the length field may be determined as "a multiple of 3"+1 or "a multiple of 3"+2. In other words, for the non-HT, HT, VHT PPDI or the EHT PPDU, the value of the length field may be determined as a multiple of 3, and for the HE PPDU, the value of the length field may be determined as "a multiple of 3"+1 or "a multiple of 3"+2.

For example, the transmitting STA may apply BCC encoding based on a 1/2 coding rate to the 24-bit information of the L-SIG field. Thereafter, the transmitting STA may obtain a BCC coding bit of 48 bits. BPSK modulation may be applied to the 48-bit coding bit, thereby generating 48 BPSK symbols. The transmitting STA may map the 48 BPSK symbols to positions except for a pilot subcarrier{subcarrier index −21, −7, +7, +21} and a DC subcarrier {subcarrier index 0}. As a result, the 48 BPSK symbols may be mapped to subcarrier indices −26 to −22, −20 to −8, −6 to −1, +1 to +6, +8 to +20, and +22 to +26. The transmitting STA may additionally map a signal of {−1, −1, −1, 1} to a subcarrier index{−28, −27, +27, +28}. The aforementioned signal may be used for channel estimation on a frequency domain corresponding to {−28, −27, +27, +28}.

The transmitting STA may generate an RL-SIG generated in the same manner as the L-SIG. BPSK modulation may be applied to the RL-SIG. The receiving STA may know that the RX PPDU is the HE PPDU or the EHT PPDU, based on the presence of the RL-SIG.

A universal SIG (U-SIG) may be inserted after the RL-SIG of FIG. 18. The U-SIB may be called in various terms such as a first SIG field, a first SIG, a first type SIG, a control signal, a control signal field, a first (type) control signal, or the like.

The U-SIG may include information of N bits, and may include information for identifying a type of the EHT PPDU. For example, the U-SIG may be configured based on two symbols (e.g., two contiguous OFDM symbols). Each symbol (e.g., OFDM symbol) for the U-SIG may have a duration of 4 μs. Each symbol of the U-SIG may be used to transmit the 26-bit information. For example, each symbol of the U-SIG may be transmitted/received based on 52 data tomes and 4 pilot tones.

Through the U-SIG (or U-SIG field), for example, A-bit information (e.g., 52 un-coded bits) may be transmitted. A first symbol of the U-SIG may transmit first X-bit information (e.g., 26 un-coded bits) of the A-bit information, and a second symbol of the U-SIB may transmit the remaining Y-bit information (e.g. 26 un-coded bits) of the A-bit information. For example, the transmitting STA may obtain 26 un-coded bits included in each U-SIG symbol. The transmitting STA may perform convolutional encoding (i.e., BCC encoding) based on a rate of R=1/2 to generate 52-coded bits, and may perform interleaving on the 52-coded bits. The transmitting STA may perform BPSK modulation on the interleaved 52-coded bits to generate 52 BPSK symbols to be allocated to each U-SIG symbol. One U-SIG symbol may be transmitted based on 65 tones (subcarriers) from a subcarrier index −28 to a subcarrier index +28, except for a DC index 0. The 52 BPSK symbols generated by the transmitting STA may be transmitted based on the remaining tones (subcarriers) except for pilot tones, i.e., tones −21, −7, +7, +21.

For example, the A-bit information (e.g., 52 un-coded bits) generated by the U-SIG may include a CRC field (e.g., a field having a length of 4 bits) and a tail field (e.g., a field having a length of 6 bits). The CRC field and the tail field may be transmitted through the second symbol of the U-SIG. The CRC field may be generated based on 26 bits allocated to the first symbol of the U-SIG and the remaining 16 bits except for the CRC/tail fields in the second symbol, and may be generated based on the conventional CRC calculation algorithm. In addition, the tail field may be used to terminate trellis of a convolutional decoder, and may be set to, for example, "000000".

The A-bit information (e.g., 52 un-coded bits) transmitted by the U-SIG (or U-SIG field) may be divided into version-independent bits and version-dependent bits. For example, the version-independent bits may have a fixed or variable size. For example, the version-independent bits may be allocated only to the first symbol of the U-SIG, or the version-independent bits may be allocated to both of the first and second symbols of the U-SIG. For example, the version-independent bits and the version-dependent bits may be called in various terms such as a first control bit, a second control bit, or the like.

For example, the version-independent bits of the U-SIG may include a PHY version identifier of 3 bits. For example, the PHY version identifier of 3 bits may include information related to a PHY version of a TX/RX PPDU. For example, a first value of the PHY version identifier of 3 bits may indicate that the TX/RX PPDU is an EHT PPDU. In other words, when the transmitting STA transmits the EHT PPDU, the PHY version identifier of 3 bits may be set to a first value. In other words, the receiving STA may determine that the RX PPDU is the EHT PPDU, based on the PHY version identifier having the first value.

For example, the version-independent bits of the U-SIG may include a UL/DL flag field of 1 bit. A first value of the UL/DL flag field of 1 bit relates to UL communication, and a second value of the UL/DL flag field relates to DL communication.

For example, the version-independent bits of the U-SIG may include information related to a TXOP length and information related to a BSS color ID.

For example, when the EHT PPDU is divided into various types (e.g., various types such as an EHT PPDU related to an SU mode, an EHT PPDU related to an MU mode, an EHT PPDU related to a TB mode, an EHT PPDU related to extended range transmission, or the like), information related to the type of the EHT PPDU may be included in the version-dependent bits of the U-SIG.

For example, the U-SIG may include: 1) a bandwidth field including information related to a bandwidth; 2) a field including information related to an MCS scheme applied to EHT-SIG; 3) an indication field including information regarding whether a dual subcarrier modulation (DCM) scheme is applied to EHT-SIG; 4) a field including information related to the number of symbol used for EHT-SIG; 5) a field including information regarding whether the EHT-SIG is generated across a full band; 6) a field including information related to a type of EHT-LTF/STF; and 7) information related to a field indicating an EHT-LTF length and a CP length.

Preamble puncturing may be applied to the PPDU of FIG. 18. The preamble puncturing implies that puncturing is applied to part (e.g., a secondary 20 MHz band) of the full band. For example, when an 80 MHz PPDU is transmitted, an STA may apply puncturing to the secondary 20 MHz band out of the 80 MHz band, and may transmit a PPDU only through a primary 20 MHz band and a secondary 40 MHz band.

For example, a pattern of the preamble puncturing may be configured in advance. For example, when a first puncturing pattern is applied, puncturing may be applied only to the secondary 20 MHz band within the 80 MHz band. For example, when a second puncturing pattern is applied, puncturing may be applied to only any one of two secondary 20 MHz bands included in the secondary 40 MHz band within the 80 MHz band. For example, when a third puncturing pattern is applied, puncturing may be applied to only the secondary 20 MHz band included in the primary 80 MHz band within the 160 MHz band (or 80+80 MHz band). For example, when a fourth puncturing is applied, puncturing may be applied to at least one 20 MHz channel not belonging to a primary 40 MHz band in the presence of the primary 40 MHz band included in the 80 MHaz band within the 160 MHz band (or 80+80 MHz band).

Information related to the preamble puncturing applied to the PPDU may be included in U-SIG and/or EHT-SIG. For example, a first field of the U-SIG may include information related to a contiguous bandwidth, and second field of the U-SIG may include information related to the preamble puncturing applied to the PPDU.

For example, the U-SIG and the EHT-SIG may include the information related to the preamble puncturing, based on the following method. When a bandwidth of the PPDU exceeds 80 MHz, the U-SIG may be configured individually in unit of 80 MHz. For example, when the bandwidth of the PPDU is 160 MHz, the PPDU may include a first U-SIG for a first 80 MHz band and a second U-SIG for a second 80 MHz band. In this case, a first field of the first U-SIG may include information related to a 160 MHz bandwidth, and a second field of the first U-SIG may include information related to a preamble puncturing (i.e., information related to a preamble puncturing pattern) applied to the first 80 MHz band. In addition, a first field of the second U-SIG may include information related to a 160 MHz bandwidth, and a second field of the second U-SIG may include information related to a preamble puncturing (i.e., information related to a preamble puncturing pattern) applied to the second 80 MHz band. Meanwhile, an EHT-SIG contiguous to the first U-SIG may include information related to a preamble puncturing applied to the second 80 MHz band (i.e., information related to a preamble puncturing pattern), and an EHT-SIG contiguous to the second U-SIG may include information related to a preamble puncturing (i.e., information related to a preamble puncturing pattern) applied to the first 80 MHz band.

Additionally or alternatively, the U-SIG and the EHT-SIG may include the information related to the preamble puncturing, based on the following method. The U-SIG may include information related to a preamble puncturing (i.e., information related to a preamble puncturing pattern) for all bands. That is, the EHT-SIG may not include the information related to the preamble puncturing, and only the U-SIG may include the information related to the preamble puncturing (i.e., the information related to the preamble puncturing pattern).

The U-SIG may be configured in unit of 20 MHz. For example, when an 80 MHz PPDU is configured, the U-SIG may be duplicated. That is, four identical U-SIGs may be included in the 80 MHz PPDU. PPDUs exceeding an 80 MHz bandwidth may include different U-SIGs.

The EHT-SIG may include a technical feature of the HE-SIG-B described with reference to FIG. 8 and FIG. 9. For example, the EHT-SIG may include a common field and a user-specific field as in the example of FIG. 8. The common field of the EHT-SIG may be omitted, and the number of user-specific fields may be determined based on the number of users.

The EHT-SIG may include N-bit information (e.g., 1-bit information) regarding whether the EHT-PPDU supports the SU mode or the MU mode.

The EHT-SIG may be configured based on various MCS schemes. As described above, information related to an MCS scheme applied to the EHT-SIG may be included in U-SIG. The EHT-SIG may be configured based on a DCM scheme. For example, among N data tones (e.g., 52 data tones) allocated for the EHT-SIG, a first modulation scheme may be applied to half of consecutive tones, and a second modulation scheme may be applied to the remaining half of the consecutive tones. That is, a transmitting STA may use the first modulation scheme to modulate specific control information through a first symbol and allocate it to half of the consecutive tones, and may use the second modulation scheme to modulate the same control information by using a second symbol and allocate it to the remaining half of the consecutive tones. As described above, information (e.g., a 1-bit field) regarding whether the DCM scheme is applied to the EHT-SIG may be included in the U-SIG. An HE-STF of FIG. 18 may be used for improving automatic gain control estimation in a multiple input multiple output (MIMO) environment or an OFDMA environment. An HE-LTF of FIG. 18 may be used for estimating a channel in the MIMO environment or the OFDMA environment.

The EHT-STF of FIG. 18 may be set in various types. For example, a first type of STF (e.g., 1x STF) may be generated based on a first type STF sequence in which a non-zero coefficient is arranged with an interval of 16 subcarriers. An STF signal generated based on the first type STF sequence may have a period of 0.8 µs, and a periodicity signal of 0.8 µs may be repeated 5 times to become a first type STF having a length of 4 µs. For example, a second type of STF (e.g., 2×STF) may be generated based on a second type STF sequence in which a non-zero coefficient is arranged with an interval of 8 subcarriers. An STF signal generated based on the second type STF sequence may have a period of 1.6 µs, and a periodicity signal of 1.6 µs may be repeated 5 times to become a second type STF having a length of 8 µs. Hereinafter, an example of a sequence for configuring an EHT-STF (i.e., an EHT-STF sequence) is proposed. The following sequence may be modified in various ways.

The EHT-STF may be configured based on the following sequence M.

$$M=\{-1,-1,-1,1,1,1,-1,1,1,1,-1,1,1,-1,1\} \quad \text{<Equation 1>}$$

The EHT-STF for the 20 MHz PPDU may be configured based on the following equation. The following example may be a first type (i.e., 1x STF) sequence. For example, the first type sequence may be included in not a trigger-based (TB) PPDU but an EHT-PPDU. In the following equation, (a:b:c) may imply a duration defined as b tone intervals (i.e., a subcarrier interval) from a tone index (i.e., subcarrier index) 'a' to a tone index 'c'. For example, the equation 2 below may represent a sequence defined as 16 tone intervals from a tone index −112 to a tone index 112. Since a subcarrier spacing of 78.125 kHz is applied to the EHT-STR, the 16 tone intervals may imply that an EHT-STF coefficient (or element) is arranged with an interval of 78.125*16=1250 kHz. In addition, * implies multiplication, and sqrt( ) implies a square root. In addition, j implies an imaginary number.

$$\text{EHT-STF}(-112{:}16{:}112)=\{M\}*(1+j)/\text{sqrt}(2)$$

$$\text{EHT-STF}(0)=0 \quad \text{<Equation 2>}$$

The EHT-STF for the 40 MHz PPDU may be configured based on the following equation. The following example may be the first type (i.e., 1×STF) sequence.

$$\text{EHT-STF}(-240{:}16{:}240)=\{M,0,-M\}*(1+j)/\text{sqrt}(2) \quad \text{<Equation 3>}$$

The EHT-STF for the 80 MHz PPDU may be configured based on the following equation. The following example may be the first type (i.e., 1x STF) sequence.

$$\text{EHT-STF}(-496{:}16{:}496)=\{M,1,-M,0,-M,1,-M\}*(1+j)/\text{sqrt}(2) \quad \text{<Equation 4>}$$

The EHT-STF for the 160 MHz PPDU may be configured based on the following equation. The following example may be the first type (i.e., 1x STF) sequence.

$$\text{EHT-STF}(-1008{:}16{:}1008)=\{M,1,-M,0,-M,1,-M,0,-M,-1,M,0,-M,1,-M\}*(1+j)/\text{sqrt}(2) \quad \text{<Equation 5>}$$

In the EHT-STF for the 80+80 MHz PPDU, a sequence for lower 80 MHz may be identical to Equation 4. In the EHT-STF for the 80+80 MHz PPDU, a sequence for upper 80 MHz may be configured based on the following equation.

$$\text{EHT-STF}(-496{:}16{:}496)=\{-M,-1,M,0,-M,1,-M\}*(1+j)/\text{sqrt}(2) \quad \text{<Equation 6>}$$

Equation 7 to Equation 11 below relate to an example of a second type (i.e., 2×STF) sequence.

EHT-STF(−120:8:120)={$M$,0,−$M$}*(1+$j$)/sqrt(2) <Equation 7>

The EHT-STF for the 40 MHz PPDU may be configured based on the following equation.

EHT-STF(−248:8:248)={$M$,−1,−$M$,0,$M$,−1,$M$}*(1+$j$)/sqrt(2)

EHT-STF(−248)=0

EHT-STF(248)=0 <Equation 8>

The EHT-STF for the 80 MHz PPDU may be configured based on the following equation.

EHT-STF(−504:8:504)={$M$,−1,$M$,−1,−$M$,−1,$M$,0,−$M$,1,$M$,1,−$M$,1,−$M$}*(1+$j$)/sqrt(2) <Equation 9>

The EHT-STF for the 160 MHz PPDU may be configured based on the following equation.

EHT-STF(−1016:16:1016)={$M$,−1,$M$,−1,−$M$,−1,$M$,0,−$M$,1,$M$,1,−$M$,1,−$M$,1,$M$,1,−$M$,0,−$M$,1,$M$,1,−$M$,1,−$M$}*(1+$j$)/sqrt(2)

EHT-STF(−8)=0, EHT-STF(8)=0,

EHT-STF(−1016)=0, EHT-STF(1016)=0 <Equation 10>

In the EHT-STF for the 80+80 MHz PPDU, a sequence for lower 80 MHz may be identical to Equation 9. In the EHT-STF for the 80+80 MHz PPDU, a sequence for upper 80 MHz may be configured based on the following equation.

EHT-STF(−504:8:504)={−$M$,1,−$M$,1,$M$,1,−$M$,0,−$M$,1,$M$,1,−$M$,1,−$M$}*(1+$j$)/sqrt(2)

EHT-STF(−504)=0,

EHT-STF(504)=0 <Equation 11>

The EHT-LTF may have first, second, and third types (i.e., 1×, 2×, 4×LTF). For example, the first/second/third type LTF may be generated based on an LTF sequence in which a non-zero coefficient is arranged with an interval of 4/2/1 subcarriers. The first/second/third type LTF may have a time length of 3.2/6.4/12.8 μs. In addition, a GI (e.g., 0.8/1/6/3.2 μs) having various lengths may be applied to the first/second/third type LTF.

Information related to a type of STF and/or LTF (information related to a GI applied to LTF is also included) may be included in a SIG-A field and/or SIG-B field or the like of FIG. 18.

A PPDU (e.g., EHT-PPDU) of FIG. 18 may be configured based on the example of FIG. 5 and FIG. 6.

For example, an EHT PPDU transmitted on a 20 MHz band, i.e., a 20 MHz EHT PPDU, may be configured based on the RU of FIG. 5. That is, a location of an RU of EHT-STF, EHT-LTF, and data fields included in the EHT PPDU may be determined as shown in FIG. 5.

An EHT PPDU transmitted on a 40 MHz band, i.e., a 40 MHz EHT PPDU, may be configured based on the RU of FIG. 6. That is, a location of an RU of EHT-STF, EHT-LTF, and data fields included in the EHT PPDU may be determined as shown in FIG. 6.

Since the RU location of FIG. 6 corresponds to 40 MHz, a tone-plan for 80 MHz may be determined when the pattern of FIG. 6 is repeated twice. That is, an 80 MHz EHT PPDU may be transmitted based on a new tone-plan in which not the RU of FIG. 7 but the RU of FIG. 6 is repeated twice.

When the pattern of FIG. 6 is repeated twice, 23 tones (i.e., 11 guard tones+12 guard tones) may be configured in a DC region. That is, a tone-plan for an 80 MHz EHT PPDU allocated based on OFDMA may have 23 DC tones. Unlike this, an 80 MHz EHT PPDU allocated based on non-OFDMA (i.e., a non-OFDMA full bandwidth 80 MHz PPDU) may be configured based on a 996-RU, and may include 5 DC tones, 12 left guard tones, and 11 right guard tones.

A tone-plan for 160/240/320 MHz may be configured in such a manner that the pattern of FIG. 6 is repeated several times.

The PPDU of FIG. 18 may be determined (or identified) as an EHT PPDU based on the following method.

A receiving STA may determine a type of an RX PPDU as the EHT PPDU, based on the following aspect. For example, the RX PPDU may be determined as the EHT PPDU: 1) when a first symbol after an L-LTF signal of the RX PPDU is a BPSK symbol; 2) when RL-SIG in which the L-SIG of the RX PPDU is repeated is detected; and 3) when a result of applying "modulo 3" to a value of a length field of the L-SIG of the RX PPDU is detected as "0". When the RX PPDU is determined as the EHT PPDU, the receiving STA may detect a type of the EHT PPDU (e.g., an SU/MU/Trigger-based/Extended Range type), based on bit information included in a symbol after the RL-SIG of FIG. 18. In other words, the receiving STA may determine the RX PPDU as the EHT PPDU, based on: 1) a first symbol after an L-LTF signal, which is a BPSK symbol; 2) RL-SIG contiguous to the L-SIG field and identical to L-SIG; 3) L-SIG including a length field in which a result of applying "modulo 3" is set to "0"; and 4) a 3-bit PHY version identifier of the aforementioned U-SIG (e.g., a PHY version identifier having a first value).

For example, the receiving STA may determine the type of the RX PPDU as the EHT PPDU, based on the following aspect. For example, the RX PPDU may be determined as the HE PPDU: 1) when a first symbol after an L-LTF signal is a BPSK symbol; 2) when RL-SIG in which the L-SIG is repeated is detected; and 3) when a result of applying "modulo 3" to a value of a length field of the L-SIG is detected as "1" or "2".

For example, the receiving STA may determine the type of the RX PPDU as a non-HT, HT, and VHT PPDU, based on the following aspect. For example, the RX PPDU may be determined as the non-HT, HT, and VHT PPDU: 1) when a first symbol after an L-LTF signal is a BPSK symbol; and 2) when RL-SIG in which L-SIG is repeated is not detected. In addition, even if the receiving STA detects that the RL-SIG is repeated, when a result of applying "modulo 3" to the length value of the L-SIG is detected as "0", the RX PPDU may be determined as the non-HT, HT, and VHT PPDU.

In the following example, a signal represented as a (TX/RX/UL/DL) signal, a (TX/RX/UL/DL) frame, a (TX/RX/UL/DL) packet, a (TX/RX/UL/DL) data unit, (TX/RX/UL/DL) data, or the like may be a signal transmitted/received based on the PPDU of FIG. 18. The PPDU of FIG. 18 may be used to transmit/receive frames of various types. For example, the PPDU of FIG. 18 may be used for a control frame. An example of the control frame may include a request to send (RTS), a clear to send (CTS), a power save-poll (PS-poll), BlockACKReq, BlockAck, a null data packet (NDP) announcement, and a trigger frame. For example, the PPDU of FIG. 18 may be used for a management frame. An example of the management frame may include a beacon frame, a (re-)association request frame, a (re-)association response frame, a probe request frame, and a probe response frame. For example, the PPDU of FIG. 18 may be used for a data frame. For example, the PPDU of FIG. 18 may be used to simultaneously transmit at least two or more of the control frames, the management frame, and the data frame.

Figure 19:
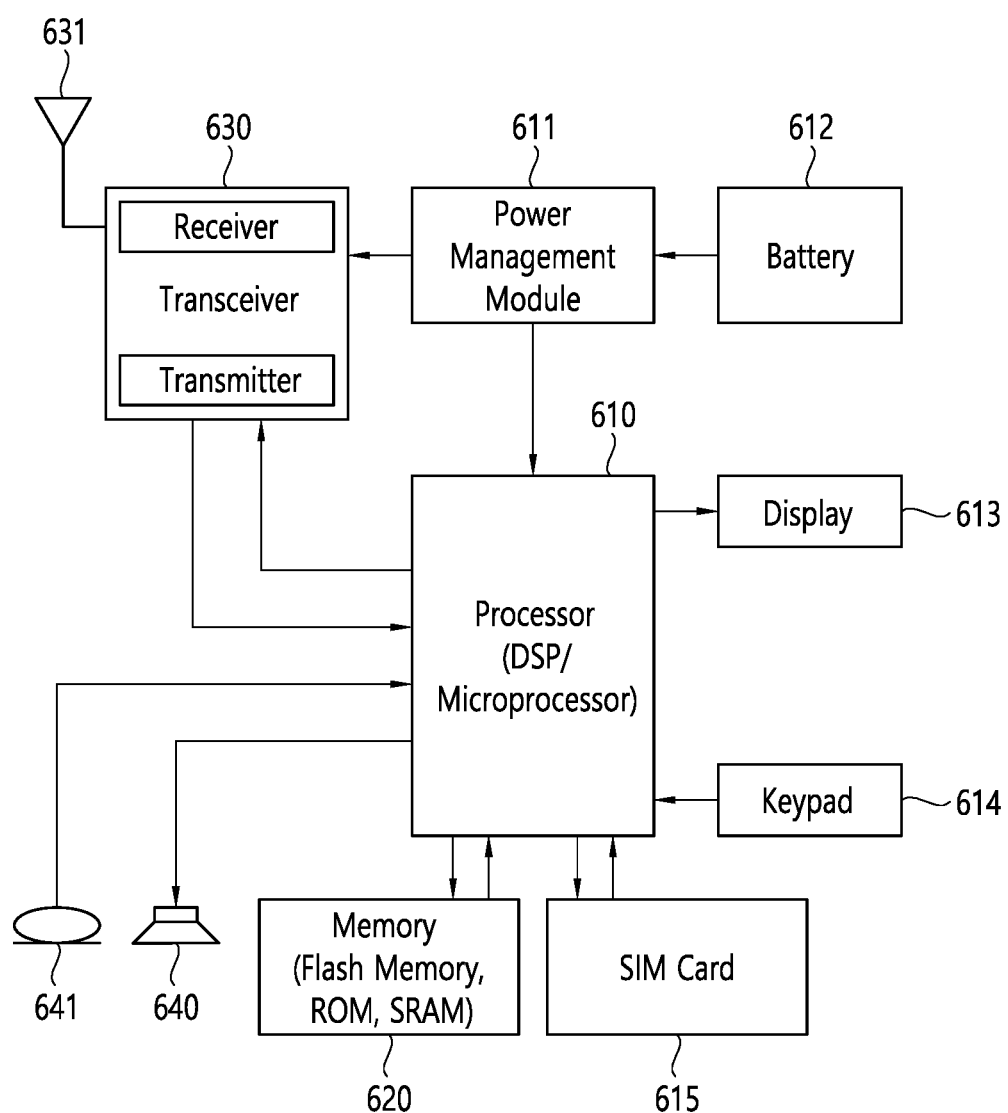
FIG. 19 illustrates an example of a modified transmission device and/or receiving apparatus/device of the present specification.

FIG. 19 illustrates an example of a modified transmission device and/or receiving device of the present specification.

Each device/STA of the sub-figure (a)/(b) of FIG. 1 may be modified as shown in FIG. 19. A transceiver 630 of FIG. 19 may be identical to the transceivers 113 and 123 of FIG. 1. The transceiver 630 of FIG. 19 may include a receiver and a transmitter.

A processor 610 of FIG. 19 may be identical to the processors 111 and 121 of FIG. 1. Alternatively, the processor 610 of FIG. 19 may be identical to the processing chips 114 and 124 of FIG. 1.

A memory 620 of FIG. 19 may be identical to the memories 112 and 122 of FIG. 1. Alternatively, the memory 620 of FIG. 19 may be a separate external memory different from the memories 112 and 122 of FIG. 1.

Referring to FIG. 19, a power management module 611 manages power for the processor 610 and/or the transceiver 630. A battery 612 supplies power to the power management module 611. A display 613 outputs a result processed by the processor 610. A keypad 614 receives inputs to be used by the processor 610. The keypad 614 may be displayed on the display 613. A SIM card 615 may be an integrated circuit which is used to securely store an international mobile subscriber identity (IMSI) and its related key, which are used to identify and authenticate subscribers on mobile telephony devices such as mobile phones and computers.

Referring to FIG. 19, a speaker 640 may output a result related to a sound processed by the processor 610. A microphone 641 may receive an input related to a sound to be used by the processor 610.

1. Tone Plan in 802.11ax WLAN System

In the present specification, a tone plan relates to a rule for determining a size of a resource unit (RU) and/or a location of the RU. Hereinafter, a PPDU based on the IEEE 802.11ax standard, that is, a tone plan applied to an HE PPDU, will be described. In other words, hereinafter, the RU size and RU location applied to the HE PPDU are described, and control information related to the RU applied to the HE PPDU is described.

In the present specification, control information related to an RU (or control information related to a tone plan) may include a size and location of the RU, information of a user STA allocated to a specific RU, a frequency bandwidth for a PPDU in which the RU is included, and/or control information on a modulation scheme applied to the specific RU. The control information related to the RU may be included in a SIG field. For example, in the IEEE 802.11ax standard, the control information related to the RU is included in an HE-SIG-B field. That is, in a process of generating a TX PPDU, a transmitting STA may allow the control information on the RU included in the PPDU to be included in the HE-SIG-B field. In addition, a receiving STA may receive an HE-SIG-B included in an RX PPDU and obtain control information included in the HE-SIG-B, so as to determine whether there is an RU allocated to the receiving STA and decode the allocated RU, based on the HE-SIG-B.

In the IEEE 802.11ax standard, HE-STF, HE-LTF, and data fields may be configured in unit of RUs. That is, when a first RU for a first receiving STA is configured, STF/LTF/data fields for the first receiving STA may be transmitted/received through the first RU.

In the IEEE 802.11ax standard, a PPDU (i.e., SU PPDU) for one receiving STA and a PPDU (i.e., MU PPDU) for a plurality of receiving STAs are separately defined, and respective tone plans are separately defined. Specific details will be described below.

The RU defined in 11ax may include a plurality of subcarriers. For example, when the RU includes N subcarriers, it may be expressed by an N-tone RU or N RUs. A location of a specific RU may be expressed by a subcarrier index. The subcarrier index may be defined in unit of a subcarrier frequency spacing. In the 11ax standard, the subcarrier frequency spacing is 312.5 kHz or 78.125 kHz, and the subcarrier frequency spacing for the RU is 78.125 kHz. That is, a subcarrier index +1 for the RU may mean a location which is more increased by 78.125 kHz than a DC tone, and a subcarrier index −1 for the RU may mean a location which is more decreased by 78.125 kHz than the DC tone. For example, when the location of the specific RU is expressed by [−121:−96], the RU may be located in a region from a subcarrier index −121 to a subcarrier index −96. As a result, the RU may include 26 subcarriers.

The N-tone RU may include a pre-set pilot tone.

2. Null Subcarrier and Pilot Subcarrier

A subcarrier and resource allocation in the 802.11ax system will be described.

An OFDM symbol consists of subcarriers, and the number of subcarriers may function as a bandwidth of a PPDU. In the WLAN 802.11 system, a data subcarrier used for data transmission, a pilot subcarrier used for phase information and parameter tacking, and an unused subcarrier not used for data transmission and pilot transmission are defined.

An HE MU PPDU which uses OFDMA transmission may be transmitted by mixing a 26-tone RU, a 52-tone RU, a 106-tone RU, a 242-tone RU, a 484-tone RU, and a 996-tone RU.

Herein, the 26-tone RU consists of 24 data subcarriers and 2 pilot subcarriers. The 52-tone RU consists of 48 data subcarriers and 4 pilot subcarriers. The 106-tone RU consists of 102 data subcarriers and 4 pilot subcarriers. The 242-tone RU consists of 234 data subcarriers and 8 pilot subcarriers. The 484-tone RU consists of 468 data subcarriers and 16 pilot subcarriers. The 996-tone RU consists of 980 data subcarriers and 16 pilot subcarriers.

1) Null Subcarrier

As shown in FIG. 5 to FIG. 7, a null subcarrier exists between 26-tone RU, 52-tone RU, and 106-tone RU locations. The null subcarrier is located near a DC or edge tone to protect against transmit center frequency leakage, receiver DC offset, and interference from an adjacent RU. The null subcarrier has zero energy. An index of the null subcarrier is listed as follows.

| Channel Width | RU Size | Null Subcarrier Indices |
| --- | --- | --- |
| 20 MHz | 26, 52 | ±69, ±122 |
|  | 106 | none |
|  | 242 | none |
| 40 MHz | 26, 52 | ±3, ±56, ±57, ±110, ±137, ±190, ±191, ±244 |
|  | 106 | ±3, ±110, ±137, ±244 |
|  | 242, 484 | none |
| 80 MHz | 26, 52 | ±17, ±70, ±71, ±124, ±151, ±204, ±205, ±258, ±259, ±312, ±313, ±366, ±393, ±446, ±447, ±500 |
|  | 106 | ±17, ±124, ±151, ±258, ±259, ±366, ±393, ±500 |
|  | 242, 484 | none |
|  | 996 | none |

-continued

| Channel Width | RU Size | Null Subcarrier Indices |
|---|---|---|
| 160 MHz | 26, 52, 106 | {null subcarrier indices in 80 MHz − 512, null subcarrier indices in 80 MHz + 512} |
|  | 242, 484, 996, 2×996 | none |

A null subcarrier location for each 80 MHz frequency segment of the 80+80 MHz HE PPDU shall follow the location of the 80 MHz HE PPDU.

2) Pilot Subcarrier

If a pilot subcarrier exists in an HE-LTF field of HE SU PPDU, HE MU PPDU, HE ER SU PPDU, or HE TB PPDU, a location of a pilot sequence in an HE-LTF field and data field may be the same as a location of 4× HE-LTF. In 1× HE-LTF, the location of the pilot sequence in HE-LTF is configured based on pilot subcarriers for a data field multiplied 4 times. If the pilot subcarrier exists in 2× HE-LTF, the location of the pilot subcarrier shall be the same as a location of a pilot in a 4× data symbol. All pilot subcarriers are located at even-numbered indices listed below.

| Channel Width | RU Size | Pilot Subcarrier Indices |
|---|---|---|
| 20 MHz | 26, 52 | ±10, ±22, ±36, ±48, ±62, ±76, ±90, ±102, ±116 |
|  | 106, 242 | ±22, ±48, ±90, ±116 |
| 40 MHz | 26, 52 | ±10, ±24, ±36, ±50, ±64, ±78, ±90, ±104, ±116, ±130, ±144, ±158, ±170, ±184, ±198, ±212, ±224, ±238 |
|  | 106, 242, 484 | ±10, ±36, ±78, ±104, ±144, ±170, ±212, ±238 |
| 80 MHz | 26, 52 | ±10, ±24, ±38, ±50, ±64, ±78, ±92, ±104, ±118, ±130, ±144, ±158, ±172, ±184, ±198, ±212, ±226, ±238, ±252, ±266, ±280, ±292, ±306, ±320, ±334, ±346, ±360, ±372, ±386, ±400, ±414, ±426, ±440, ±454, ±468, ±480, ±494 |
|  | 106, 242, 484 | ±24, ±50, ±92, ±118, ±158, ±184, ±226, ±252, ±266, ±292, ±334, ±360, ±400, ±426, ±468, ±494 |
|  | 996 | ±24, ±92, ±158, ±226, ±266, ±334, ±400, ±468 |
| 160 MHz | 26, 52, 106, 242, 484 | {pilot subcarrier indices in 80 MHz − 512, pilot subcarrier indices in 80 MHz + 512} |
|  | 996 | {for the lower 80 MHz, pilot subcarrier indices in 80 MHz − 512, for the upper 80 MHz, pilot subcarrier indices in 80 MHz + 512} |

At 160 MHz or 80+80 MHz, the location of the pilot subcarrier shall use the same 80 MHz location for 80 MHz of both sides.

3. HE Transmit Procedure and Constellation Mapping

In an 802.11ax wireless local area network (WLAN) system, transmission procedures (or transmit procedures) in a physical layer (PHY) include a procedure for an HE Single User (SU) PPDU, a transmission procedure for an HE extended range (ER) SU PPDU, a transmission procedure for an HE Multi User (MU) PPDU, and a transmission procedure for an HE trigger-based (TB) PPDU. A FORMAT field of a PHY-TXSTART.request(TXVECTOR) may be the same as HE_SU, HE_MU, HE_ER_SU or HE_TB. The transmission procedures do not describe operations of optional features, such as Dual Carrier Modulation (DCM).

Figure 21:
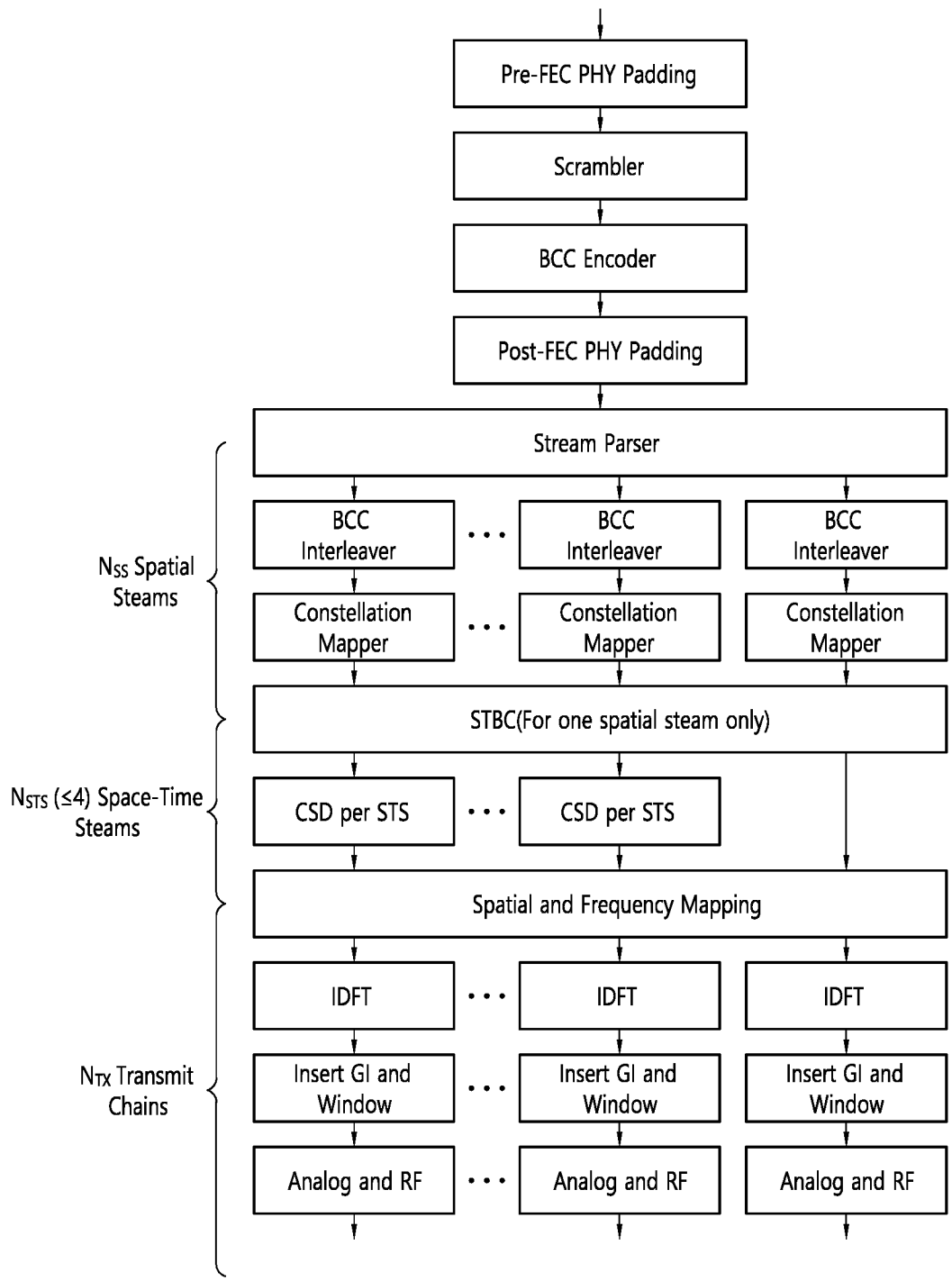
FIG. 21 shows an example of a block diagram of a transmitting apparatus for generating a data field of an HE PPDU by using BCC encoding.

Among the diverse transmission procedures, FIG. 21 shows only the PHY transmission procedure for the HE SU PPDU.

Figure 20:
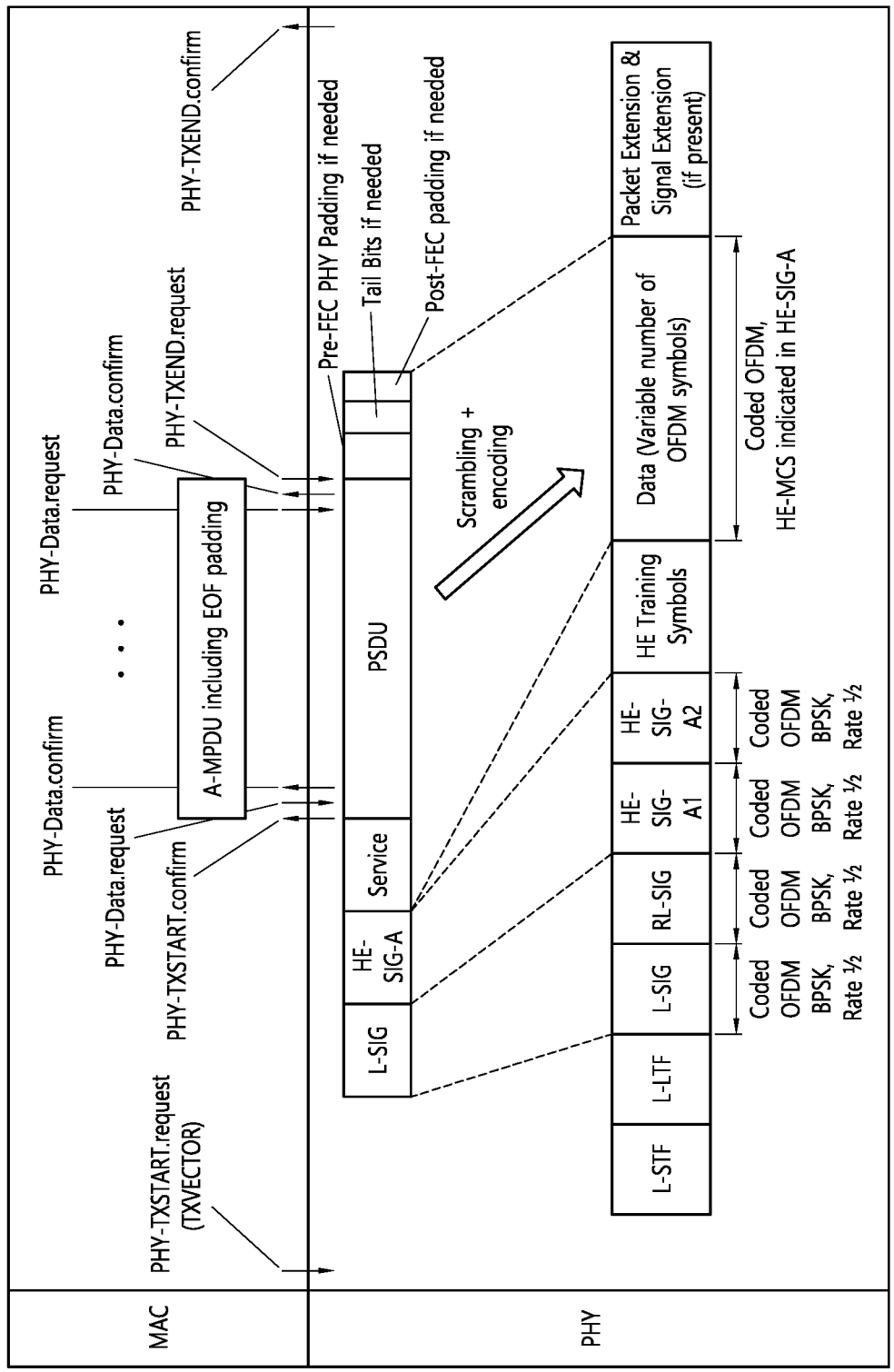
FIG. 20 shows an example of a PHY transmission procedure for HE SU PPDU.

FIG. 20 shows an example of a PHY transmission procedure for HE SU PPDU.

In order to transmit data, the MAC generates a PHY-TXSTART.request primitive, which causes a PHY entity to enter a transmit state. Additionally, the PHY is configured to operate in an appropriate frequency via station management through PLME. Other transmission parameters, such as HE-MCS, coding type, and transmission power are configured through a PHY-SAP by using a PHY-TXSTART.request (TXVECTOR) primitive. After transmitting a PPDU that transfers (or communicates) a trigger frame, a MAC sublayer may issue a PHY-TRIGGER.request together with a TRIGVECTOR parameter, which provides information needed for demodulating an HE TB PPDU response that is expected of the PHY entity.

The PHY indicates statuses of a primary channel and another channel via PHY-CCA.indication. The transmission of a PPDU should be started by the PHY after receiving the PHY-TXSTART.request(TXVECTOR) primitive.

After a PHY preamble transmission is started, the PHY entity immediately initiates data scrambling and data encoding. An encoding method for the data field is based on FEC_CODING, CH_BANDWIDTH, NUM_STS, STBC, MCS, and NUM_USERS parameters of the TXVECTOR.

A SERVICE field and a PSDU are encoded in a transmitter (or transmitting device) block diagram, which will be described later on. Data should be exchanged between the MAC and the PHY through a PHY-DATA.request(DATA) primitive that is issued by the MAC and PHY-DATA. confirm primitives that are issued by the PHY. A PHY padding bit is applied to the PSDU in order to set a number of bits of the coded PSDU to be an integer multiple of a number of coded bits per OFDM symbol.

The transmission is swiftly (or quickly) ended by the MAC through a PHY-TXEND.request primitive. The PSDU transmission is ended upon receiving a PHY-TXEND.request primitive. Each PHY-TXEND.request primitive mat notify its reception together with a PHY-TXEND.confirm primitive from the PHY.

A packet extension and/or a signal extension may exist in a PPDU. A PHY-TXEND.confirm primitive is generated at an actual end time of a most recent PPDU, an end time of a packet extension, and an end time of a signal extension.

In the PHY, a Guard Interval (GI) that is indicated together with a GI duration in a GI TYPE parameter of the TXVECTOR is inserted in all data OFDM symbols as a solution for a delay spread.

If the PPDU transmission is completed, the PHY entity enters a receive state.

In order to generate each field of the HE PPDU, the following block diagrams are used.

a) pre-FEC PHY padding
b) Scrambler
c) FEC (BCC or LDPC) encoders
d) post-FEC PHY padding
e) Stream parser
f) Segment parser (for contiguous 160 MHz and non-contiguous 80+80 MHz transmission)
g) BCC interleaver
h) Constellation mapper
i) DCM tone mapper
j) Pilot insertion
k) Replication over multiple 20 MHz (for BW>20 MHz)
l) Multiplication by 1st column of PHE-LTF
m) LDPC tone mapper n) Segment deparser
o) Space time block code (STBC) encoder for one spatial stream
p) Cyclic shift diversity (CSD) per STS insertion
q) Spatial mapper
r) Frequency mapping
s) Inverse discrete Fourier transform (IDFT)
f) Cyclic shift diversity (CSD) per chain insertion
u) Guard interval (GI) insertion
v) Windowing FIG. 21 shows an example of a block diagram of a transmitting apparatus for generating a data field of an HE PPDU by using BCC encoding.

FIG. 21 shows a block diagram of the transmitter used to generate the data field of the HE PPDU to which Binary Convolution Coding (BCC) encoding is applied and capable of UL transmission or DL non-MU MIMO transmission in 26-tone RU, 52-tone RU, 106-tone RU, or 242-tone RU.

Referring to FIG. 21, for a bit string input to a block diagram of a transmitter, 1) Pre-FEC PHY padding is performed, 2) a scrambling operation is performed, 3) BCC encoding is performed, 4) Post-FEC PHY padding is performed, 5) a stream parsing operation for mapping coded bits to a specific spatial stream is performed, 6) BCC interleaving is performed for each spatial stream, 7) constellation mapping for each spatial stream is performed to generate a modulation symbol.

Figure 22:
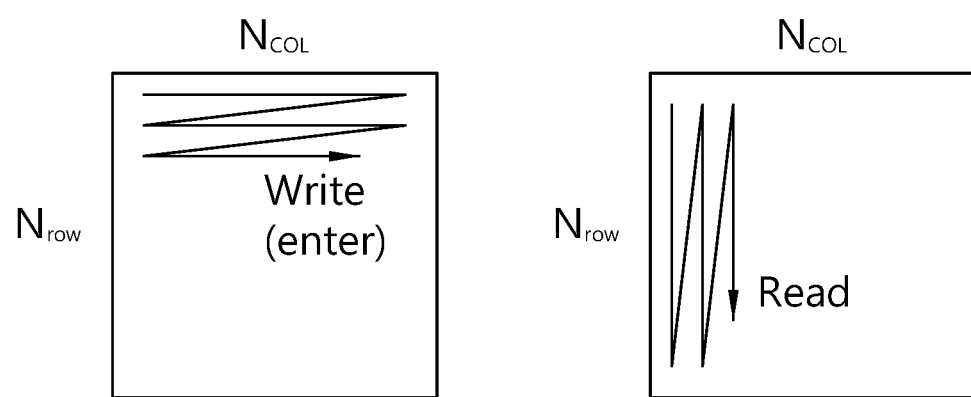
FIG. 22 is a diagram illustrating an example of block interleaving that can be applied to an embodiment of the present specification.

FIG. 22 is a diagram illustrating an example of block interleaving that can be applied to an embodiment of the present specification.

When the transmitting apparatus uses BCC encoding as an encoding technique, the encoded bit string is interleaved through a block interleaver. The interleaver uses the size of the column ($N_{COL}$) and row ($N_{ROW}$) of the interleaver block according to a defined value. $N_{ROT}$ is a parameter for frequency rotation. The defined values are shown in Table 5 below.

TABLE 5

| Parameter | 20 MHz | 40 MHz | 80 MHz |
|---|---|---|---|
| $N_{COL}$ | 13 | 18 | 26 |
| $N_{ROW}$ | $4 \times N_{BPSCS}$ | $6 \times N_{BPSCS}$ | $9 \times N_{BPSCS}$ |
| $N_{ROT}(N_{SS} \leq 4)$ | 11 | 29 | 58 |
| $N_{ROT}(N_{SS} > 4)$ | 6 | 13 | 28 |

Here, $N_{BPSCS}$ ($i_{SS}$) represents the number of coded bits per carrier in each spatial stream (however, $i_{SS}$=an integer between 1 and $N_{SS}$). The method of using the interleaver as above is to input a coded bit column along a row and read it according to a column. This may refer to FIG. 22, which is a diagram illustrating a method of using block interleaving.

The DCM tone mapper, which is a part of the constellation mapper, is applied only when DCM is indicated for the RU. A subset of this transmitter block diagram consisting of a constellation mapper and a CSD block as well as a block to the right of the spatial mapping block is also used to generate the HE-LTF field or the HE-STF field.

In the block diagram of the transmitting apparatus of FIG. 21, since there is no segment parser, the above operations are performed for one frequency segment. However, if necessary, segment parsing for dividing frequency segments by adding a segment parser after the stream parser in the block diagram of the transmitter of FIG. 21 may be performed. Accordingly, the BCC interleaving, the constellation mapping, or Low Density Parity Check (LDPC) tone mapping may be performed for each frequency segment (for each RU in the Multi-RU).

In addition, in HE MU transmission, except that cyclic shift diversity (CSD) is performed with knowledge of the space-time stream start index for the corresponding user, the PPDU encoding processor is independently performed in a resource unit (RU) for each user until the input of the spatial mapping block. All user data of the RU is coupled and mapped in the transmission chain of the spatial mapping block.

Hereinafter, constellation mapping will be described.

The constellation mapping refers to the mapping of the input bits of the constellation mapper and the complex constellation points for BPSK, QPSK, 16-QAM, and 256-QAM. That is, the constellation mapper may map bits in the output of the stream parser or segment parser (if present) to complex constellation points according to the modulation scheme.

The DCM technique may be applied only to the data field and/or the SIG-B field of the HE PPDU. In addition, the DCM technique may or may not be used in the transmitting device (optional feature).

A more detailed description of the DCM technique of 11ax is as follows.

DCM is an optional modulation scheme for HE-SIG-B and data fields. DCM may be applied to HE SU PPDU and HE ER SU PPDU. In the HE MU PPDU or HE TB PPDU, DCM may be applied to an RU including data for one user, but may not be applied to an RU including data for a plurality of users.

DCM is applicable only for HE-MCS 0, 1, 3 and 4. DCM is applicable only in Nss=1 or Nss=2 (for one user RU in HE MU PPDU, Nss,r,u=1 or Nss,r,u=2). DCM is not applicable with MU-MIMO or STBC.

When DCM is used, the bit sequence is mapped to a pair of symbols (d'k, d'q(k)). In this case, in order to use frequency diversity for 996-ton RUs or smaller RUs, k has a range of $0 \leq k \leq N_{SD}-1$, and q(k) is $N_{SD} \leq q(k) \leq 2 N_{SD}-1$ has a range of 1. For a 2×996 ton RU, k has a range of $0 \leq k \leq N_{SD}/2-1$, and q(k) has a range of $N_{SD}/2 \leq q(k) \leq N_{SD}-1$. In order to maximize frequency diversity, the index of a pair of DCM subcarriers (k, q(k)) is q(k)=k+$N_{SD}$ for a 996-ton RU or smaller RU, and q(k)=k+$N_{SD}$/2 for a 2×996 tone RU. Here, $N_{SD}$ is $N_{SD}$ when DCM=1, and has a half value of $N_{SD}$ when DCM=0.

A modulation bit to which DCM is applied may be described as follows.

For BPSK modulation with DCM, the input stream is broken into groups of $N_{CBPS}$ or $N_{CBPS,u}$ bits ($B_0, B_1, \ldots, B_{N_{CBPS,u}-1}$). Each bit $B_k$ is BPSK modulated to a sample d'$_k$. This generates the samples for the lower half of the data subcarriers. For the upper half of the subcarriers, the samples are generated as d'$_{k+N_{SD}}$=d'$_k \times e^{j(k+N_{SD})}$, k=0, 1, ..., $N_{SD}$-1. The $N_{SD}$ here refers to the $N_{SD}$ with DCM=1, which is half the value of $N_{SD}$ with DCM=0.

For QPSK modulation with DCM, the input stream is broken into groups of $N_{CBPS}$ or $N_{CBPS,u}$ bits ($B_0, B_1, \ldots, B_{N_{CBPS,u}-1}$). Each pair of bits ($B_{2k}$, $B_{2k+1}$) is QPSK modulated to a symbol d'$_k$. This generates the constellation points for the lower half the data subcarriers in the RU. For the upper half of the data subcarriers in the RU, d'$_{k+N_{SB}}$=conj(d'$_k$), where conj( ) represents the complex conjugate operation. The $N_{SD}$ here refers to the $N_{SD}$ with DCM=1, which is half the value of $N_{SD}$ With DCM=0.

For 16-QAM modulation with DCM, the input stream is broken into groups of $N_{CBPS}$ or $N_{CBPS,u}$ bits $(B_0, B_1, \ldots, B_{N_{CBPS,u}-1})$. A group of 4 bits $(B_{4k}, B_{4k+1}, B_{4k+2}, B_{4k+3})$ is 16-QAM modulated to a sample $d'_k$ as described in 17.3.5.8 (Subcarrier modulation mapping). This is the sample on subcarrier k in the lower half, in the upper half, the sample $d'_{k+N_{SD}}$ on subcarrier $k+N_{SD}$ is obtained by 16-QAM modulating a permutation of the bits $(B_{4k}, B_{4k+1}, B_{4k+2}, B_{4k+3})$. Specifically, $d'_{k+N_{SD}}$ is obtained by applying the 16-QAM modulation procedure in 18.3.5.8 to the bit group $(B_{4k+1}, B_{4k}, B_{4k+3}, B_{4k+2})$. The $N_{SD}$ here refers to the $N_{SD}$ with DCM=1 which is half the value of $N_{SD}$ with DCM=0.

Hereinafter, LDPC tone mapping will be described.

LDPC tone mapping must be performed on all LDPC encoded streams using the LDPC tone mapping distance parameter, $D_{TM}$. $D_{TM}$ is a constant for each bandwidth and has a value for each band as shown below. LDPC tone mapping should not be performed for streams encoded using BCC.

| Parameter | 20 MHz | 40 MHz | 80 MHz | 160 MHz, 80 + 80 MHz |
|---|---|---|---|---|
| $D_{TM}$ | 4 | 6 | 9 | 9 |

For VHT PPDU transmission, LDPC tone mapping for an LDPC coded stream for user u may be performed as follows by substituting a complex number of streams generated by a constellation mapper.

$$d''_{(k),i,n,l,u} = d'_{k,i,n,l,u}: k = 0, 1, \ldots, N_{SD} - 1 \text{ for 20 MHz,}$$

$$\text{40 MHz, 80 MHz and 80 + 80 MHz;}$$

$$k = 0, 1, \ldots, \frac{N_{SD}}{2} - 1 \text{ for 160 MHz;}$$

$$i = 1, \ldots, N_{SS,n};$$

$$n = 0, 1, \ldots, N_{SYM} - 1;$$

$$t = 0 \text{ for 20 MHz, 40 MHz, and 80 MHz;}$$

$$l = 0, 1 \text{ for 160 MHz and 80 + 80 MHz;}$$

$$u = 0, \ldots, N_{user} - 1$$

where $$t(k) = \begin{cases} D_{TM}\left(k \bmod \frac{N_{SD}}{D_{TM}}\right) + \left\lfloor \frac{k \cdot D_{TM}}{N_{SD}} \right\rfloor, & \text{for 20 MHz, 40 MHz,} \\ & \text{80 MHz, and 80 + 80 MHz} \\ D_{TM}\left(k \bmod \frac{N_{SD}/2}{D_{TM}}\right) + \left\lfloor \frac{k \cdot D_{TM}}{N_{SD}/2} \right\rfloor, & \text{for 160 MHz} \end{cases}$$

As a result of the LDPC tone mapping operation, two successively generated complex constellation numbers $d'_{k,i,n,l,u}$ and $d'_{k+1,i,n,l,u}$ respectively may be transmitted on two data tones separated from each other by at least $D_{TM}-1$. For example, is transmitted on a first data tone, is transmitted on a second data tone, the first and The second data tones may be separated from each other by $D_{TM}-1$. The above operation uses a matrix with $D_{TM}$ rows and $N_{SD}/D_{TM}$ columns (for 20 MHz, 40 MHz, 80 MHz or 80+80 MHz) or $N_{SD}/2*D_{TM}$ columns (for 160 MHz) for complex numbers for i, n and u variables. It is equivalent to block-interleaving $d'_{0,i,n,l,u}, \ldots, d'_{N_{SD}-1,i,n,l,u}$. At this time, $d'_{0,i,n,l,u}, \ldots, d'_{N_{SD}-1,i,n,l,u}$ are written row-wise in the matrix, and $d'_{0,i,n,l,u}, \ldots, d'_{N_{SD}-1,i,n,l,u}$ are read column-wise from the matrix.

LDPC tone mapping is performed separately for upper 80 MHz and lower 80 MHz of 160 MHz or 80+80 MHz transmission indicated by frequency subblock index 1.

Since LDPC tone mapping is not performed on the BCC coded stream, the following equation may be applied to the BCC coded stream.

40 MHz, 80 MHz and 80 + 80 MHz; : $k = 0, 1, \ldots$ , $$N_{SD} - 1 \text{ for 20 MHz, 40 MHz, 80 MHz and 80 + 80 MHz;}$$

$$k = 0, 1, \ldots, \frac{N_{SD}}{2} - 1 \text{ for 160 MHz;}$$

$$i = 1, \ldots, N_{SS,n};$$

$$n = 0, 1, \ldots, N_{SYM} - 1;$$

$$t = 0 \text{ for 20 MHz, 40 MHz, and 80 MHz;}$$

$$l = 0, 1 \text{ for 160 MHz and 80 + 80 MHz;}$$

$$u = 0, \ldots, N_{user} - 1$$

In addition, LDPC tone mapping must be performed on all LDPC encoded streams mapped to resource units (RUs). LDPC tone mapping should not be performed for streams using BCC. When DCM is applied to the LDPC encoded stream, $D_{TM\_DCM}$ shall be applied to both the lower half data subcarrier of the RU and the upper half data subcarrier of the RU. The LDPC tone mapping distance parameters arm and $D_{TM\_DCM}$ are constants for each RU size and values for other RU sizes.

| | RU Size (tones) | | | | | |
|---|---|---|---|---|---|---|
| Parameter | 26 | 52 | 106 | 242 | 484 | 996 | 2 × 996 |
| $D_{TM}$ | 1 | 3 | 6 | 9 | 12 | 20 | 20 |
| $D_{TM\_DCM}$ | 1 | 1 | 3 | 9 | 9 | 14 | 14 |

The LDPC tone mapping parameters $D_{TM}$ and $D_{TM\_DCM}$ are applied for each frequency subblock 1=0 and 1=1.

For HE PPDU without DCM, LDPC tone mapping for the LDPC-encoded stream for the user u in the r-th RU may be performed as follows by substituting a stream of a complex number generated by a constellation mapper.

$$d''_{(k),i,n,l,r,u} = d'_{k,i,n,l,r,u}$$

where $$k = \begin{cases} 0, 1, \ldots, N_{SD} - 1 \text{ for a } 26-, 52-, 106-, 242-, 484- \text{ and} \\ \quad\quad\quad\quad 996-\text{tone } RU \\ 0, 1, \ldots, N_{SD}/2 - 1 \text{ for a } 2 \times 996-\text{tone } RU \end{cases}$$

$$i = 1, \ldots, N_{SS,r,u}$$

$$n = 0, 1, \ldots, N_{SYM} - 1$$

$$l = \begin{cases} 0 \text{ for a } 26-, 52-, 106-, 242-, 484- \text{ and } 996-\text{tone } RU \\ 0, 1 \text{ for a } 2 \times 996-\text{tone } RU \end{cases}$$

$$u = 0, \ldots, N_{user,r} - 1$$

$$r = 0, \ldots, N_{RU} - 1$$

$N_{SD}$ is the number of data tones in the $r$-$th$ RU

-continued $$t(k) = \begin{cases} D_{TM}\left(k \bmod \dfrac{N_{SD}}{D_{TM}}\right) + \left\lfloor \dfrac{k \cdot D_{TM}}{N_{SD}} \right\rfloor, \\ \text{for a 26--, 52--, 106--, 242--, 484-- and 996--tone } RU \\ D_{TM}\left(k \bmod \dfrac{N_{SD}/2}{D_{TM}}\right) + \left\lfloor \dfrac{k \cdot D_{TM}}{N_{SD}/2} \right\rfloor, \text{ for a } 2 \times 996\text{--tone } RU \end{cases}$$

For the HE PPDU in which DCM is applied to the data field, the LDPC tone mapping for the LDPC encoded stream for the user u in the r-th RU can be performed as follows by substituting the stream of the complex number generated by the constellation mapper.

$$d''_{(k),i,n,l,r,u} = d'_{k,i,n,l,r,u}$$

where $$k = \begin{cases} 0, 1, \ldots, 2N_{SD} - 1 \text{ for a 26--, 52--, 106--, 242--,} \\ \qquad 484\text{-- and 996--tone } RU \\ 0, 1, \ldots, N_{SD} - 1 \text{ for a } 2 \times 996\text{--tone } RU \end{cases}$$

$i = 1, \ldots, N_{SS,r,u}$ $n = 0, 1, \ldots, N_{SYM} - 1$ $l = \begin{cases} 0 \text{ for a 26--, 52--, 106--, 242--, 484-- and 996--tone } RU \\ 0, 1 \text{ for a } 2 \times 996\text{--tone } RU \end{cases}$ $u = 0, \ldots, N_{user,r} - 1$ $r = 0, \ldots, N_{RU} - 1$ $N_{SD}$ is the number of data tones in the r-th RU if DCM is applied For a 26--, 52--, 106--, 242--, 484-- and 996--tone $RU$, $$t(k) = \begin{cases} D_{TM\_DCM}\left(k \bmod \dfrac{N_{SD}}{D_{TM\_DCM}}\right) + \left\lfloor \dfrac{k \cdot D_{TM\_DCM}}{N_{SD}} \right\rfloor, \text{ for } k < N_{SD} \\ D_{TM\_DCM}\left((k - N_{SD}) \bmod \dfrac{N_{SD}}{D_{TM\_DCM}}\right) + \\ \left\lfloor \dfrac{(k - N_{SD}) \cdot D_{TM\_DCM}}{N_{SD}} \right\rfloor + N_{SD}, \text{ for } k \geq N_{SD} \end{cases}$$

For a $2 \times 996$--tone $RU$, $$t(k) = \begin{cases} D_{TM\_DCM}\left(k \bmod \dfrac{N_{SD}/2}{D_{TM\_DCM}}\right) + \left\lfloor \dfrac{k \cdot D_{TM\_DCM}}{N_{SD}/2} \right\rfloor, \text{ for } 0 \leq k < N_{SD}/2 \\ D_{TM\_DCM}\left((k - N_{SD}/2) \bmod \dfrac{N_{SD}/2}{D_{TM\_DCM}}\right) + \\ \left\lfloor \dfrac{(k - N_{SD}/2) \cdot D_{TM\_DCM}}{N_{SD}/2} \right\rfloor + N_{SD}/2, \text{ for } N_{SD}/2 \leq k < N_{SD} \end{cases}$$

$D_{TM\_DCM}$ the LDPC tone mapping distance for the r-th RU if DOA is applied.

For 26-, 52-, 106-, 242-, 484-, and 996-tone RUs, the LDPC tone mapper is defined as one segment. LDPC tone mapping is performed separately for the upper 80 MHz and lower 80 MHz frequency segments of the 2×996-tone RU indicated by the frequency subblock index 1.

Since LDPC tone mapping is not performed on the BCC coded stream, the following equation may be applied to the BCC coded stream.

$$d''_{k,i,n,l,r,u} = d'_{k,i,n,l,r,u}$$

where $$k = \begin{cases} 0, 1, \ldots, N_{SD} - 1 \text{ for a 26--, 52--, 106--, 242--,} \\ \qquad 484\text{-- and 996--tone } RU \\ 0, 1, \ldots, N_{SD}/2 - 1 \text{ for a } 2 \times 996\text{--tone } RU \end{cases}$$

Figure 23:
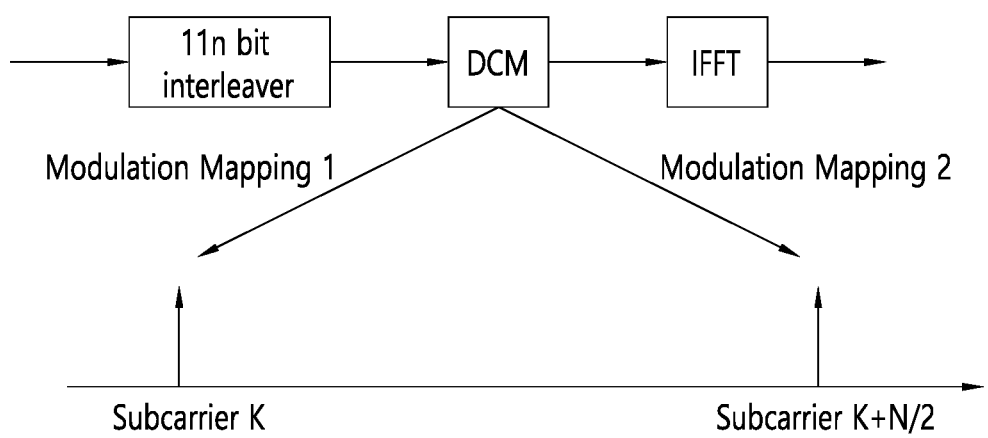
FIG. 23 shows an example in which the DCM scheme is applied to data.

-continued $i = 1, \ldots, N_{SS,r,u}$ $i = 1, \ldots, N_{SS,r,u}$ $n = 0, 1, \ldots, N_{SYM} - 1$ $l = \begin{cases} 0 \text{ for a 26--, 52--, 106--, 242--, 484-- and 996--tone } RU \\ 0, 1 \text{ for a } 2 \times 996\text{--tone } RU \end{cases}$ $u = 0, \ldots, N_{user,r} - 1$ $r = 0, \ldots, N_{RU} - 1$ FIG. 23 shows an example in which the DCM technique is applied to data.

Meanwhile, in IEEE 802.11ax, a DCM (Dual Carrier/Subcarrier Modulation) scheme is applied. A transmitting apparatus based on the DCM scheme may transmit the same information through different subcarriers. For example, the transmitter may include the structure shown in FIG. 23. As shown in FIG. 23, first data information may be included in subcarrier K based on the first constellation mapping, that is, modulation mapping 1. Also, the same first data information may be included in subcarrier K+N/2 based on the second constellation mapping, that is, modulation mapping 2. The first constellation mapping and the second constellation mapping may be the same mapping scheme or different mapping schemes. In FIG. 23, the variable N may be N_SD, which is the number of data tones included in the RU or frequency segment. In addition, the technique of FIG. 23 is an example in which the result of applying the first/second constellation mapping to the same data is mapped to the first/second tone. However, for example, it is also possible that a result of applying the first/second/third constellation mapping to the same data is mapped to the first/second/third tone, or a result of applying the 1st/second . . . /Nth constellation mapping to the same data is mapped to the 1st/2nd . . . /Nth tone.

The DCM technique may be applied only to the data field and/or the SIG-B field of the HE PPDU. In addition, the DCM technique may or may not be used in the transmitting device (optional feature).

A more detailed description of the DCM technique of 11ax is as follows.

DCM is an optional modulation scheme for HE-SIG-B and data fields. DCM may be applied to HE SU PPDU and HE ER SU PPDU. In the HE MU PPDU or HE TB PPDU, DCM may be applied to an RU including data for one user, but may not be applied to an RU including data for a plurality of users.

DCM is applicable only for HE-MCS 0, 1, 3 and 4. DCM is applicable only in $N_{SS}$=1 or $N_{SS}$=2 (for one user RU in HE MU PPDU, Nss,r,u=1 or Nss,r,u=2). DCM is not applicable with MU-MIMO or STBC.

When DCM is used, the bit sequence is mapped to a pair of symbols (d'k, d'q(k)). In this case, in order to use frequency diversity for 996-ton RUs or smaller RUs, k has a range of 0<=k<=$N_{SD}$−1, and q(k) is $N_{SD}$<=q(k)<=2 $N_{SD}$−1 has a range of 1. For a 2×996 ton RU, k has a range of 0<=k<=$N_{SD}$/2−1, and q(k) has a range of $N_{SD}$/2<= q(k)<=$N_{SD}$−1. In order to maximize frequency diversity, the index of a pair of DCM subcarriers (k, q(k)) is q(k)=k+$N_{SD}$ for a 996-ton RU or smaller RU, and q(k)=k+$N_{SD}$/2 for a 2×996 tone RU. Here, $N_{SD}$ is $N_{SD}$ when DCM=1, and has a half value of $N_{SD}$ when DCM=0.

A modulation bit to which DCM is applied may be described as follows

For BPSK modulation with DCM, the input stream is broken into groups of $N_{CBPS}$ or $N_{CBPS,u}$ bits ($B_0, B_1, \ldots, B_{N_{CBPS,u}-1}$). Each bit $B_k$ is BPSK modulated to a sample $d'_k$. This generates the samples for the lower half of the data subcarriers. For the upper half of the subcarriers, the samples are generated as $d'_{k+N_{SD}}=d'_k \times e^{j(k+N_{SD})}$, k=0, 1, \ldots, $N_{SD}$−1. The $N_{SD}$ here refers to the $N_{SD}$ with DCM=1, which is half the value of $N_{SD}$ with DCM=0.

For QPSK modulation with DCM, the input stream is broken into groups of $N_{CBPS}$ or $N_{CBPS,u}$ bits ($B_0, B_1, \ldots, B_{N_{CBPS,u}-1}$). Each pair of bits ($B_{2k}, B_{2k+1}$) is QPSK modulated to a symbol $d'_k$. This generates the constellation points for the lower half the data subcarriers in the RU. For the upper half of the data subcarriers in the RU, $d'_{k+N_{SB}}=\text{conj}(d'_k)$, where conj( ) represents the complex conjugate operation. The $N_{SD}$ here refers to the $N_{SD}$ with DCM=1, which is half the value of $N_{SD}$ With DCM=0.

For 16-QAM modulation with DCM, the input stream is broken into groups of $N_{CBPS}$ or $N_{CBPS,u}$ bits ($B_0, B_1, \ldots, B_{N_{CBPS,u}-1}$). A group of 4 bits ($B_{4k}, B_{4k+1}, B_{4k+2}, B_{4k+3}$) is 16-QAM modulated to a sample $d'_k$ as described in 17.3.5.8 (Subcarrier modulation mapping). This is the sample on subcarrier k in the lower half, in the upper half, the sample $d'_{k+N_{SD}}$ on subcarrier k+$N_{SD}$ is obtained by 16-QAM modulating a permutation of the bits ($B_{4k}, B_{4k+1}, B_{4k+2}, B_{4k+3}$). Specifically, $d'_{k+N_{SD}}$ is obtained by applying the 16-QAM modulation procedure in 18.3.5.8 to the bit group ($B_{4k+1}, B_{4k}, B_{4k+3}, B_{4k+2}$). The $N_{SD}$ here refers to the $N_{SD}$ with DCM=1 which is half the value of $N_{SD}$ with DCM=0.

The subcarrier allocation related variable for the HE-modulated field in the non-OFDMA HE PPDU may be defined as a tone allocation related parameter for the non-OFDMA HE PPDU as follows.

| Parameter | CBW20 | CBW40 | CBW80 | CBW80 + 80 | CBW160 | Description |
| --- | --- | --- | --- | --- | --- | --- |
| $N_{SD}$ | 234 | 468 | 980 | 980 | 1960 | Number of data subcarriers per frequency segment |
| $N_{SP}$ | 8 | 16 | 16 | 16 | 32 | Number of pilot subcarriers per frequency segment |
| $N_{ST}$ | 242 | 484 | 996 | 996 | 1992 | Total number of subcarriers per frequency segment |
| $N_{SR}$ | 122 | 244 | 500 | 500 | 1012 | Highest data subcarrier index per frequency segment |
| $N_{Seg}$ | 1 | 1 | 1 | 2 | 1 | Number of frequency segments |
| $N_{DC}$ | 3 | 5 | 5 | 5 | 23 | Number of null subcarriers at DC per segment |
| $N_{Guard, Left}$ | 6 | 12 | 12 | 12 | 12 | Number of low frequency guardsubcarriers |
| $N_{Guard, Right}$ | 5 | 11 | 11 | 11 | 11 | Number of high frequency guard subcarriers |

NOTE:

NOTE: $N_{ST} = N_{SD} + N_{SP}$

In the OFDMA HE PPDU, a subcarrier assignment related variable for an RU may be defined as a tone assignment related parameter for the OFDMA HE PPDU as follows.

| | RU Size (subcarriers) | | | | | | |
| --- | --- | --- | --- | --- | --- | --- | --- |
| Parameter | 26 | 52 | 106 | 242 | 484 | 996 | 2 × 996 | Description |
| $N_{SD}$ | 24 | 48 | 102 | 234 | 468 | 980 | 1960 | Number of data subcarriers per RU |
| $N_{SP}$ | 2 | 4 | 4 | 8 | 16 | 16 | 32 | Number of pilot subcarriers per RU |
| $N_{ST}$ | 26 | 52 | 106 | 242 | 484 | 996 | 1992 | Total number of subcarriers per RU |

NOTE:

$N_{ST} = N_{SD} + N_{SP}$

As described above, $N_{SD}$ may mean the number of data tones included in one RU or frequency segment (e.g., 20/40/80/160 MHz segment).

A parameter frequently used in the 802.11 wireless LAN system can be defined as follows.

bits, and each block must be interleaved by the interleaver based on the interleaver. In 160 MHz or 80+80 MHz VHT PPDU transmission, each frequency subblock of the $N_{CBPSS}/2$ output bit of the segment parser is interleaved by the interleaver for 80 MHz as defined herein. This inter-

| Symbol | Explanation |
|---|---|
| $N_{RU}$ | For pre-BHT modulated fields. $N_{RC} = 1$. <br> For BHT modulated fields. $N_{RU}$ represents the number of occupied RUs or MRUs in the transmission |
| $N_{user,r}$ | For pre-BHT modulated feilds. $N_{user,r} = 1$. <br> For BHT modulated feilds. $N_{user,r}$ represents the total number of users in the r-th occupied RU or MRU of the transmission. |
| $N_{user,total}$ | Total number of users in all occupied RUs or MRUs of BHT transmission, i.e., <br><br> $$N_{user,total} = \sum_{r=0}^{N_{RU}-1} N_{user,r}$$ |
| $N_{COPS,u}$ | Number of coded bits per OFDM symbol for user u, $u = 0, 1, \ldots, N_{user,total} - 1$. |
| $N_{CBPS,u}$ | Number of coded bits per OEDM symbol per spatial stream for user u. <br> $u = 0, 1, \ldots, N_{user,total} - 1$. |
| $N_{DBPS,u}$ | Number of data bits per OFDM symbol for user u, $u = 0, 1, \ldots, N_{user,total} - 1$. |
| $N_{BPSCS,u}$ | Number of coded bits per subcarrier per spatial stream for user u, <br> $u = 0, 1, \ldots, N_{user,total} - 1$. |
| $N_{SS,r,u}$, $N_{SS,u}$ | Number of spatial streams. For the Data field $N_{SNr,u}$ is the number of spatial streams r-th RU or MRU for user u, $u = 0, 1, \ldots, N_{user,r} - 1$, and $N_{NS,u}$ is the number of spatial Streams for user u, $u = 0, 1, \ldots, N_{user,total} - 1$. <br><br> For the Data field of an BHT PPDU, $N_{SS} = \max_{r=0}^{N_{RU}} N_{SS,r,total}$, |
| $N_{SS,r,total}$ | For BHT modulated fields, $N_{SS,r,total}$ is the tolal number of spatial streams at r-th RU or MRU in a PPDU; <br><br> $$N_{SS,r,total} = \sum_{r=0}^{N_{user,r}-1} N_{SS,r,a}$$ <br><br> For pre-EHT modulated fields, $N_{SS,r,total}$ is undefined. <br> NOTE-$N_{SS,r,total} = N_{SS}$ for SU transmission in EHT PPDU. <br> Editor's Note: There is no definition on N_SN. Please consider removing or updating the note. |
| $N_{CBPSSI}$, $N_{CBPSSI,u}$ | Number of coded bits per symbol per spatial stream per BCC interleaver block. <br><br> For a VHT SU PPDU, <br><br> $$N_{CBPSSI} = \begin{cases} N_{CBPSS} & \text{for a 20 MHz, 40 MHz, or 80 MHz PPDU} \\ \dfrac{N_{CBPSS}}{2}, & \text{for a 160 MHz or 80 + 80 MHz PPDU} \end{cases}$$ <br><br> For a VHT MU PPDU for user u, $u = 0, 1, \ldots, N_{user} - 1$ <br><br> $$N_{CBPSSI,u} = \begin{cases} N_{CBPSS,w} & \text{for a 20 MHz, 40 MHz, or 80 MHz PPDU} \\ \dfrac{N_{CBPSS,u}}{2}, & \text{for a 160 MHz or 80 + 80 MHz PPDU} \end{cases}$$ <br><br> For a VHP MU PPDU, $N_{CBPSSI}$ is undefined. |

Hereinafter, a BCC interleaver will be described.

For easy explanation, the operation of the interleaver will be described only in the case of a single user (SU). For user u of MU transmission, the interleaver operates in the same way by changing $N_{SS}$, $N_{CBPSS}$, $N_{CBPSSI}$, and $N_{BPSCS}$ to $N_{SS,u}$, $N_{CBPSS,u}$, $N_{CBPSSI,u}$, and $N_{BPSCS,u}$, respectively, for output bits for the user from the stream parser. That is, the operation of the interleaver is the same as in the case of SU transmission composed only of bits of the corresponding user.

The description below describes an interleaver used in the case of BCC encoding. The interleaver described below is ignored for LDPC encoding.

In 20 MHz, 40 MHz or 80 MHz VHT PPDU transmission, the output bits of the stream parser are treated as $N_{CBPS}$ bit groups. Each group is divided into $N_{SS}$ blocks of $N_{CBPSS}$ leaver, which inputs data into rows and reads them into columns, has different $N_{COL}$ columns and $N_{ROW}$ rows depending on the bandwidth. The values of $N_{COL}$ and $N_{ROW}$ are shown in Table 5 above.

If two or more spatial streams exist after the operation according to the interleaver is applied, a third operation called frequency rotation is applied to the additional spatial streams. The parameter for frequency rotation is $N_{ROT}$, and the values of $N_{ROT}$ are given in Table 5.

An additional parameter is the spatial stream index $i_{ss}=1, 2, \ldots, N_{ss}$. The output of the third operation is a function of the spatial stream index.

Interleaving is defined using three permutations. The first permutation is given by the rule shown in the equation below.

$$i = N_{ROW}(k \bmod N_{COL}) + \left\lfloor \frac{k}{N_{COL}} \right\rfloor, \quad \text{⟨Equation 12⟩}$$

$$k = 0, 1, \ldots, N_{CBPSSI} - 1$$

Here, $N_{CBPSSI}$ is the number of coded bits per symbol per spatial stream per BCC interleaver block. k indicates a subcarrier index, and indicates a subcarrier index of an allocated RU or MRU when OFDMA or RU aggregation is used.

The second permutation is defined by the rule shown in the equation below.

$$j = s \left\lfloor \frac{i}{s} \right\rfloor + \left( i + N_{CBPSSI} - \left\lfloor \frac{N_{COL} \cdot i}{N_{CBPSSI}} \right\rfloor \right) \bmod s, \quad \text{⟨Equation 13⟩}$$

$$i = 0, 1, \ldots, N_{CBPSSI} - 1$$

The number of bits s allocated to a single axis (real or imaginary) of a constellation point in a spatial stream is expressed by the following equation.

$$s = \max\left\{ 1, \frac{N_{BPSCS}}{2} \right\} \quad \text{⟨Equation 14⟩}$$

In the second permutation, s may be defined as above.

According to the equations for the first permutation and the second permutation, the coded bits included in the BCC interleaver block may be interleaved by inputting data into the $N_{ROW}$ and reading it into the $N_{COL}$.

In addition, when two or more spatial streams exist after the operation according to the interleaver is applied ($N_{SS} \geq 2$), an operation called frequency rotation based on $N_{ROT}$ may be applied to the additional spatial stream.

IF $2 \leq N_{SS} \leq 4$, THE FREQUENCY ROTATION IS APPLIED TO THE OUTPUT OF THE SECOND permutation (Equation 13) as follows.

$$r = \left\{ j - \left[ (2(i_{SS} - 1)) \bmod 3 + 3 \left\lfloor \frac{i_{SS} - 1}{3} \right\rfloor \right] \cdot N_{ROT} \cdot N_{BPSCS} \right\} \bmod N_{CBPSSI}, \quad \text{⟨Equation 15⟩}$$

$$j = 0, 1, \ldots, N_{CBPSSI} - 1$$

In this case, iss=1, 2, . . . , $N_{ss}$ means spatial stream indexes in which the interleaving operates.

If $N_{SS} \geq 4$, frequency rotation is applied to the output of the second permutation (Equation 13) as follows.

$$r = \{j - J(i_{SS}) \cdot N_{ROT} \cdot N_{BPSCS}\} \bmod N_{CBPSSI}, \quad \text{⟨Equation 16⟩}$$
$$j = 0, 1, \ldots, N_{CBPSSI} - 1$$

In this case, iss=1, 2, . . . , Nss is a spatial stream index in which the interleaving operates, and $J(i_{SS})$ is an integer defined as follows.

| $i_{SS}$ | $J(i_{SS})$ |
|---|---|
| 1 | 0 |
| 2 | 5 |
| 3 | 2 |
| 4 | 7 |
| 5 | 3 |
| 6 | 6 |
| 7 | 1 |
| 8 | 4 |

The deinterleaver uses the following three operations to perform inverse permutation. Let r be the bit index of the received block (per spatial stream). The first operation reverses (reverses) the third (frequency rotation) permutation of the interleaver. If Ns, =1, this reversal is performed by j=r (r=0, 1, . . . , $N_{CBPSSI}-1$). When $2 \leq N_{ss} \leq 4$, this inversion is performed as shown in the following equation.

$$j = \left\{ r - \left[ (2(i_{SS} - 1)) \bmod 3 + 3 \left\lfloor \frac{i_{SS} - 1}{3} \right\rfloor \right] \cdot N_{ROT} \cdot N_{BPSCS} \right\} \bmod N_{CBPSSI}, \quad \text{⟨Equation 17⟩}$$

$$r = 0, 1, \ldots, N_{CBPSSI} - 1$$

If $N_{SS} > 4$, this inversion is performed as shown in the following equation.

$$j = \{r - J(i_{SS}) \cdot N_{ROT} \cdot N_{BPSCS}\} \bmod N_{CBPSSI}, \quad \text{⟨Equation 18⟩}$$
$$r = 0, 1, \ldots, N_{CBPSSI} - 1$$

The second operation defined by the following equation reverses the second permutation (Equation 13) in the interleaver.

$$i = s \left\lfloor \frac{i}{s} \right\rfloor + \left( j + \left\lfloor \frac{N_{COL} \cdot j}{N_{CBPSSI}} \right\rfloor \right) \bmod s, \quad \text{⟨Equation 19⟩}$$

$$j = 0, 1, \ldots, N_{CBPSSI} - 1$$

The third operation defined by the following equation reverses the first permutation (Equation 12) in the interleaver.

$$k = N_{COL} \cdot i - (N_{CBPSSI} - 1) \left\lfloor \frac{i}{N_{ROW}} \right\rfloor, \quad \text{⟨Equation 20⟩}$$

$$i = 0, 1, \ldots, N_{CBPSSI} - 1$$

In addition, from the 802.11ax WLAN system, interleaver parameters, $N_{COL}$, $N_{ROW}$, and $N_{ROT}$ for a data field according to a resource unit (RU) size and whether DCM is applied are defined as follows for the RU size column.

|  |  | RU Size (tones) | | | | HE-SIG-A/HE-SIG-B (tones) |
| --- | --- | --- | --- | --- | --- | --- |
| DCM | Parameter | 26 | 52 | 106 | 242 | 56 |
| Not used | $N_{COL}$ | 8 | 16 | 17 | 26 | 13 |
|  | $N_{ROW}$ | $3 \times N_{BPSCS}$ | $3 \times N_{BPSCS}$ | $6 \times N_{BPSCS}$ | $9 \times N_{BPSCS}$ | $4 \times N_{BPSCS}$ |
|  | $N_{ROT}$ | 2 | 11 | 29 | 58 | — |
| Used | $N_{COL}$ | 4 | 8 | 17 | 13 | 13 |
|  | $N_{ROW}$ | $3 \times N_{BPSCS}$ | $3 \times N_{BPSCS}$ | $3 \times N_{BPSCS}$ | $9 \times N_{BPSCS}$ | $2 \times N_{BPSCS}$ |
|  | $N_{ROT}$ | 26 | 2 | 11 | 29 | — |

In addition, interleaver parameters, $N_{COL}$ and $N_{ROW}$ for the HE-SIG-A and HE-SIG-B fields are defined as shown in the table above for the HE-SIG-A/HE-SIG-B column. DCM is not used in the HE-SIG-A field.

4. Embodiment Applicable to the Present Disclosure

In the wireless LAN 802.11 system, to increase peak throughput, it is considered to use a wider band than the existing 11ax or to transmit an increased stream by using more antennas. In addition, the present specification also considers a method of using aggregation of various bands/links.

This specification proposes a BCC interleaver parameter when binary convolution coding (BCC) is applied in a situation in which a multi-resource unit (MRU) is allocated to one STA to transmit a PPDU.

In the existing 802.11ax, data can be transmitted using 26/52/106/242/484/996/2×996-tone RUs, and in this case, BCC or LDPC can be used for channel coding. In particular, when BCC is used, the BCC interleaver can be used in the same way as in the existing Wi-Fi system for frequency diversity, and the PPDU encoding process and the BCC interleaver when BCC is applied have been described above.

In 802.11be, throughput can be improved by allocating multiple RUs instead of one RU to one STA and transmitting a PPDU, and information on allocating multiple RUs can be reported in the EHT-SIG field. FIG. 18 is a structure of an EHT PPDU.

The U-SIG consists of a version independent field and a version dependent field. Also, it consists of two symbols, and the two symbols are jointly encoded, and each 20 MHz consists of 52 data tones and 4 pilot tones. Also, U-SIG is modulated in the same way as HE-SIG-A. The EHT-SIG may be divided into a common field and a user specific field, and may be encoded as a variable MCS. Information for allocating RUs may be carried in a common field and a user specific field.

In this situation, the present specification considers a case in which one 26-tone RU and one 106-tone RU are aggregated or one 26-tone RU and one 52-tone RU are aggregated. The RUs to be aggregated may be two adjacent RUs or two RUs within a 20 MHz channel. Alternatively, it may be a 52-tone RU or a 106-tone RU adjacent to the center 26-tone RU in the 80 MHz tone plan. Considering each combined RU as if it were one RU, the BCC interleaver parameter is proposed as follows, and the BCC interleaver procedure described above can be applied to the existing 11ax BCC interleaver procedure as it is.

However, in the 802.11be WLAN system, BCC can be applied only to RUs or MRUs with a size of 242 tones or less that have 4 or less spatial streams and are modulated with one of BPSK, QPSK, 16-QAM, 64-QAM, or 256-QAM.

The BCC encoder may be applied to a small MRU. BCC encoded bits are interleaved across the entire MRU. The interleaver parameters of the BCC-encoded MRU are shown in Tables 6 and 7 below. Since DCM is applied only for BPSK and single stream case, $N_{ROT}$ is not applied and $N_{ROW}$ is determined without $N_{BPSCS}$ ($NB_{PSCS}$ is always 1). $N_{BPSCS}$ is the number of coded bits per subcarrier per spatial stream.

The following is an example of the BCC interleaver parameter in each RU combination when DCM is not applied.

TABLE 6

| RU aggregation | 26 + 52 tone RU | 26 + 106 tone RU |
| --- | --- | --- |
| $N_{COL}$ | 18 | 18 |
| $N_{ROW}$ | $4 \times N_{BPSCS}$ | $7 \times N_{BPSCS}$ |
| $N_{ROT}$ | 18 | 31 |

For the 26+52 RU combination, $N_{COL}$ is 12, and $N_{ROW}$ is $6 \times N_{BPSCS}$. Other numbers such as 16, 17, 19, etc. may be used for $N_{ROT}$.

For the 26+106 RU combination, 21 $N_{COL}$ and $6 \times N_{BPSCS}$ may be used for $N_{ROW}$. Alternatively, 14 for $N_{COL}$ and $9 \times N_{BPSCS}$ for $N_{ROW}$ may be used. Other numbers such as 30, 32, etc. may be used for $N_{ROT}$.

After the transmitting STA performs BCC encoding on a data bit string to be included in the data field of the PPDU, and performs a stream parsing operation of mapping the BCC encoded bits to a specific spatial stream, the interleaved bits may be constellated by performing BCC interleaving on each spatial stream.

As an example, it is assumed that a receiving STA is allocated an MRU of 26+52 RU combination, $N_{COL}$ is 18, $N_{ROW}$ is $4 \times N_{BPSCS}$, and $N_{ROT}$ is 18.

According to Equations 12 and 13, the coded bits ($N_{CBPSSI}$) included in the BCC interleaver block may be interleaved by inputting data into $N_{ROW}$ (=18) and reading it as $N_{COL}$ (=$4 \times N_{BPSCS}$). In addition, when two or more spatial streams exist after the operation according to the interleaver is applied ($N_{SS}>=2$), frequency rotation may be performed on the additional spatial stream based on $N_{ROT}$(=18) as in Equation 15 (when $2<=N_{SS}<=4$).

Here, $N_{CBPSSI}$ is the number of coded bits per symbol per spatial stream per BCC interleaver block. k is a subcarrier index of 26+52 RU, k=0, 1, . . . , 71 ($N_{SD}$=72). In Equation 13, s is the number of bits allocated to a single axis (real or imaginary number) of constellation points in the spatial stream, and can be obtained through Equation 14.

From a performance point of view, the example defined in Table 6 above may be preferred.

The following is an example of the BCC interleaver parameter in each RU combination when DCM is applied.

TABLE 7

| RU aggregation | 26 + 52 tone RU | 26 + 106 tone RU |
|---|---|---|
| $N_{COL}$ | 9 | 9 |
| $N_{ROW}$ | $4 \times N_{BPSCS}$ | $7 \times N_{BPSCS}$ |
| $N_{ROT}$ | 9 | 15 |

In the case of the 26+52 RU combination, 12 $N_{COL}$ and $3 \times N_{BPSCS}$ may be used for $N_{ROW}$. Other numbers such as 8, 10, etc. may be used for $N_{ROT}$.

For the 26+106 RU combination, 21 $N_{COL}$ and $3 \times N_{BPSCS}$ may be used for $N_{ROW}$. Alternatively, 7 for $N_{COL}$ and $9 \times N_{BPSCS}$ for $N_{ROW}$ may be used. Other numbers such as 14, 16, etc. may be used for $N_{ROT}$.

After the transmitting STA performs BCC encoding on the data bit string to be included in the data field of the PPDU and performs a stream parsing operation of mapping the BCC encoded bits to a specific spatial stream, the interleaved bits may be constellated by performing BCC interleaving on each spatial stream.

As an example, it is assumed that the MRU of 26+106 RU combination is allocated to the receiving STA, the $N_{COL}$ is 21, and the $N_{ROW}$ is $3 \times N_{BPSCS}$. Since DCM is applied, the modulation scheme is BPSK and single stream, so $N_{ROT}$ is not applied and $N_{BPSCS}$ is always set to 1.

According to Equations 12 and 13, the coded bits ($N_{CBPSSI}$) included in the BCC interleaver block may be interleaved by inputting data into $N_{ROW}$ (=21) and reading it as $N_{COL}$ (=$3 \times N_{BPSCS}$). Since there is one spatial stream, no frequency rotation is performed.

Here, $N_{CBPSSI}$ is the number of coded bits per symbol per spatial stream per BCC interleaver block. k is a subcarrier index of 26+106 RU, k=0, 1, . . . , 62 ($N_{SD}$=63). In Equation 13, s is the number of bits allocated to a single axis (real or imaginary number) of constellation points in the spatial stream, and can be obtained through Equation 14.

From a performance point of view, the example defined in Table 7 above may be preferred.

The following is an example of a summary of parameters used for BCC interleaving in two MRUs (26+52 RU and 26+106 RU) depending on whether DCM is applied or not. In this case, $N_{SD}$ means the number of data subcarriers per MRU.

TABLE 8

| DCM | Parameter | MRU size | |
|---|---|---|---|
| | | 52 + 26 | 106 + 26 |
| Not used | $N_{SD}$ | 72 | 126 |
| | $N_{COL}$ | 18 | 21 |
| | $N_{ROW}$ | $4 \times N_{BPSCS}$ | $6 \times N_{BPSCS}$ |
| | $N_{ROT}$ | 18 | 31 |
| Used | $N_{SD}$ | 36 | 63 |
| | $N_{COL}$ | 12 | 21 |
| | $N_{ROW}$ | 3 | 3 |
| | $N_{ROT}$ | N/A | N/A |

Figure 24:
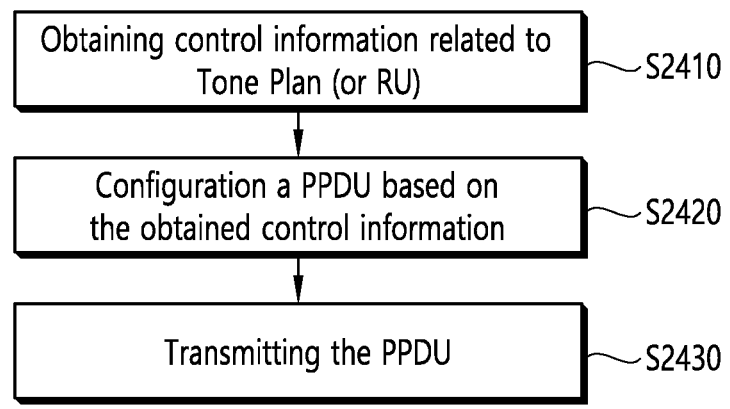
FIG. 24 is a flowchart illustrating the operation of the transmitting apparatus according to the present embodiment.

FIG. 24 is a procedure flowchart illustrating an operation of a transmission apparatus according to the present embodiment.

The example of FIG. 24 may be performed by a transmitting device (AP and/or non-AP STA). Some of each step (or detailed sub-step to be described later) of the example of FIG. 24 may be omitted or changed.

In step S2410, the transmitting device (i.e., the transmitting STA) may obtain (obtain) information on the above-described tone plan. As described above, the information on the tone plan includes the size and location of the RU, control information related to the RU, information on the frequency band including the RU, information about the STA receiving the RU, and the like.

In step S2420, the transmitting STA may configure/generate a PPDU based on the acquired control information. The step of configuring/generating the PPDU may include configuring/generating each field of the PPDU. That is, step S2420 includes configuring the EHT-SIG-A/B/C field including control information about the tone plan or sounding. That is, the step S2420 may include the step of configuring a field including control information (eg, N bitmap) indicating the size/position of the RU and/or the step of configuring the field including the identifier of the STA receiving the RU (eg, AID).

In addition, step S2420 may include the step of generating an STF/LTF sequence transmitted through a specific RU. The STF/LTF sequence may be generated based on a preset STF generation sequence/LTF generation sequence.

In addition, step S2420 may include generating a data field (ie, MPDU) transmitted through a specific RU.

In step S2430, the transmitting device may transmit the PPDU configured in step S2420 to the receiving device based on step S2430.

While performing step S2430, the transmitting device may perform at least one of CSD, spatial mapping, IDFT/IFFT operation, and GI insert operation.

A signal/field/sequence constructed according to this specification may be transmitted in the form of FIG. 18.

The method of configuring the data field of the PPDU through the above-described steps S2420 and S2430 may be performed based on the apparatus of FIG. 21.

As shown, the transmitting apparatus may 1) perform PHY padding, 2) perform scrambling operation, and 3) perform BCC encoding on a data bit string to be included in the data field. After that, 4) a stream parsing operation that maps the BCC coded bit to a specific spatial stream is performed, 5) a segment parsing operation that divides frequency segments is performed if necessary, and 6) constellation mapping is performed on individual spatial streams and each frequency segment to generate a modulation symbol.

As shown in FIG. 1, the transmitting apparatus (or transmitter) may include a memory 112, a processor 111, and a transceiver 113.

The memory 112 may store information on a plurality of Tone-Plan/RU that are described in the present specification.

The processor 111 may generate various RUs based on information stored in the memory 112 and configure a PPDU. An example of the PPDU generated by the processor 111 may be as shown in FIG. 18.

The processor 111 may perform all/part of the operations illustrated in FIG. 24.

The illustrated transceiver 113 includes an antenna and may perform analog signal processing. Specifically, the processor 111 may control the transceiver 113 to transmit the PPDU generated by the processor 111.

Alternatively, the processor 111 may generate a transmission PPDU and store information about the transmission PPDU in the memory 112.

Figure 25:
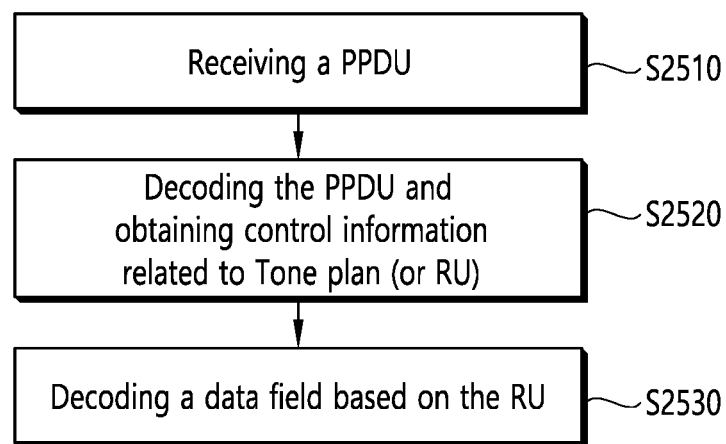
FIG. 25 is a flowchart illustrating the operation of the receiving apparatus according to the present embodiment.

FIG. 25 is a procedure flowchart illustrating an operation of a reception apparatus according to the present embodiment.

An example of FIG. 25 may be performed in the reception apparatus (AP and/or non-AP STA).

The example of FIG. 25 may be performed by a receiving STA or a receiving apparatus (AP and/or non-AP STA). Some of each step (or detailed sub-step to be described later) of the example of FIG. 25 may be omitted.

In step S2510, the receiving apparatus (receiving STA) may receive all or part of the PPDU. The received signal may be in the form of FIG. 18.

The sub-step of step S2510 may be determined based on step S2430. That is, in step S2510, an operation for restoring the results of the CSD, spatial mapping, IDFT/IFFT operation, and GI insert operation applied in step S2430 may be performed.

In step S2520, the receiving apparatus may perform decoding on all/part of the PPDU. In addition, the receiving apparatus may obtain control information related to a tone plan (i.e., RU) or sounding from the decoded PPDU.

More specifically, the receiving apparatus may decode the L-SIG and EHT-SIG of the PPDU based on the legacy STF/LTF, and obtain information included in the L-SIG and EHT SIG fields. Information about the various Tone Plans (i.e., RUs) described herein may be included in EHT-SIG (EHT-SIG-A/B/C, etc.), The receiving STA may acquire information about the tone plan (ie, RU) through the EHT-SIG.

In step S2530, the receiving apparatus may decode the remaining part of the PPDU based on the information about the tone plan (i.e., RU) obtained in step S2520. For example, the receiving STA may decode the STF/LTF field of the PPDU based on information about the tone plan (i.e., RU). In addition, the receiving STA may decode the data field of the PPDU based on the information on the tone plan (i.e., the RU) and obtain the MPDU included in the data field.

In addition, the receiving apparatus may perform a processing operation of transferring the decoded data to a higher layer (eg, MAC layer) in step S2530. In addition, when generation of a signal is indicated from the upper layer to the PHY layer in response to data transferred to the upper layer, a subsequent operation may be performed.

The above-described PPDU may be received based on the apparatus of FIG. 1.

As shown in FIG. 1, the reception apparatus may include a memory 112, a processor 111, and a transceiver 113.

The transceiver 123 may receive the PPDU based on the control of the processor 121.

For example, the transceiver 123 may include a plurality of sub-units (not shown). For example, the transceiver 123 may include at least one receiving antenna and a filter for the corresponding receiving antenna.

The PPDU received through the transceiver 123 may be stored in the memory 122. The processor 121 may process decoding of the received PPDU through the memory 122. The processor 121 may obtain control information (e.g., EHT-SIG) regarding the Tone-Plan/RU included in the PPDU, and store the obtained control information in the memory 122.

The processor 121 may perform decoding on the received PPDU. Specifically, an operation for restoring the result of CSD, Spatial Mapping, IDFT/IFFT operation, and GI insert applied to the PPDU may be performed. CSD, Spatial Mapping, IDFT/IFFT operation, and operation of restoring the result of GI insert may be performed through a plurality of processing units (not shown) individually implemented in the processor 121.

In addition, the processor 121 may decode the data field of the PPDU received through the transceiver 123.

In addition, the processor 121 may process the decoded data. For example, the processor 121 may perform a processing operation of transferring information about the decoded data field to an upper layer (e.g., a MAC layer). In addition, when generation of a signal is instructed from the upper layer to the PHY layer in response to data transferred to the upper layer, a subsequent operation may be performed.

Hereinafter, the aforementioned embodiment is described with reference to FIGS. 1 to 25.

Figure 26:
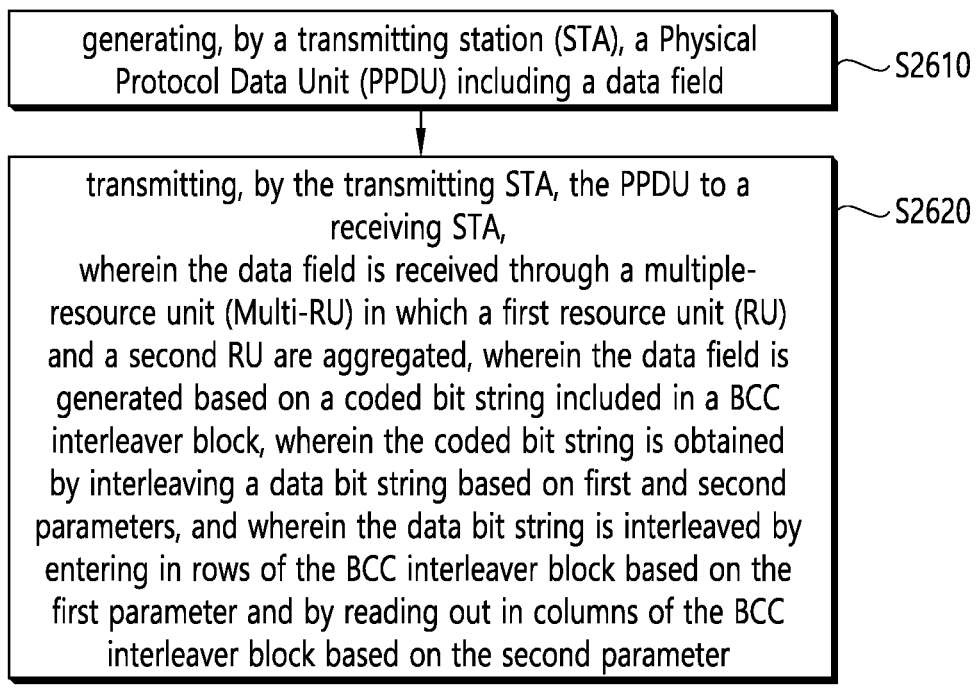
FIG. 26 is a flowchart illustrating a procedure in which a transmitting STA transmits a PPDU according to the present embodiment.

FIG. 26 is a flowchart illustrating a procedure in which a transmitting STA transmits a PPDU according to the present embodiment.

An example of FIG. 26 may be performed in a network environment in which a next-generation wireless LAN system (e.g., IEEE 802.11be or EHT wireless LAN system) is supported. The next-generation wireless LAN system is a wireless LAN system improved from the 802.11ax system, and may satisfy backward compatibility with the 802.11ax system.

This embodiment proposes a method of performing BCC interleaving on a data bit string included in a data field of the PPDU when transmitting the PPDU by allocating a Multi-RU (or MRU) supported by the 802.11be WLAN system to one STA. In particular, this embodiment proposes a method of defining a BCC parameter capable of performing BCC interleaving during Multi-RU transmission. The Multi-RU refers to an RU in which several continuous or discontinuous RUs are aggregated.

The example of FIG. 26 is performed by a transmitting STA, and the transmitting STA may correspond to an access point (AP). The receiving STA of FIG. 26 may correspond to an STA supporting an Extremely High Throughput (EHT) WLAN system.

In step S2610, the transmitting station (STA) generates a Physical Protocol Data Unit (PPDU) including a data field.

In step S2620, the transmitting STA transmits the PPDU to the receiving STA.

The data field is received through a multiple-resource unit (Multi-RU) in which a first resource unit (RU) and a second RU are aggregated.

The data field is generated based on a coded bit string included in a BCC interleaver block.

The coded bit string is obtained by interleaving a data bit string based on first and second parameters. Specifically, the data bit string is interleaved by entering in rows of the BCC interleaver block based on the first parameter and by reading out in columns of the BCC interleaver block based on the second parameter. The BCC interleaving operation on the coded bit string may be performed as in Equations 12 and 13 above.

The coded bit string may be obtained for each spatial stream by performing stream parsing on the data bit string. The coded bit string may be obtained for each spatial stream by performing stream parsing on the data bit string. The BCC interleaver block may be divided for each spatial stream. Output bits of the stream parser included in the BCC interleaver block for each spatial stream may be interleaved for each block. The data bit string is BCC encoded. An interleaving operation may be performed by the BCC interleaver block only in the case of BCC encoding.

The data field may include a transmission signal generated by performing constellation mapping and Inverse Discrete Fourier Transform (IDFT) on the coded bit string. This means the procedure after the BCC interleaver block.

A PPDU transmission procedure will be described as follows. After the transmitting STA performs BCC encoding on the data bit string to be included in the data field of the PPDU and performs a stream parsing operation of mapping the BCC encoded bits to a specific spatial stream, the interleaved bits may be constellated by performing BCC interleaving on each spatial stream.

Specifically, the transmitting STA 1) performs PHY padding, 2) performs a scrambling operation, and 3) performs BCC encoding on the data bit string, 4) performs a stream parsing operation for mapping the BCC coded bit string to a specific spatial stream, 5) performs BCC interleaving in a BCC interleaver block divided into individual spatial streams, 6) performs the constellation mapping on the BCC interleaved bit string, 7) generates a transmission signal by performing spatial frequency mapping and IDFT on a modulation symbol (constellation bit) generated based on the constellation mapping. In the transmitting STA, the procedures 1) to 7) are sequentially operated, and in this embodiment, the procedure 5) will be mainly described.

When a number of spatial streams is 2 or more and 4 or less, the coded bit string may be subjected to frequency rotation based on a third parameter. That is, when two or more spatial streams exist, frequency rotation may be performed on the additional spatial stream based on the third parameter. Frequency rotation of the coded bit string may be performed as in Equation 15 above.

Hereinafter, an example in which values of the first to third parameters are defined according to the configuration of the Multi-RU will be described. The following two examples are examples of a case in which DCM is not applied.

For example, since the first RU is a 26-tone RU and the second RU is a 52-tone RU, the Multi-RU represents 26+52-tone RU. The number of data subcarriers of the 26+52-tone RU is 72. Accordingly, the value of the first parameter may be 18, the value of the second parameter may be $4 \times N_{BPSCS}$, and the value of the third parameter may be 18. Here, $N_{BPSCS}$ is the number of coded bits per subcarrier per spatial stream per spatial stream.

As another example, since the first RU is a 26-tone RU and the second RU is a 106-tone RU, the Multi-RU represents 26+106-tone RU. The number of data subcarriers of the 26+106 tone RU is 126. Accordingly, the value of the first parameter may be 21, the value of the second parameter may be $6 \times N_{BPSCS}$, and the value of the third parameter may be 31. Here, $N_{BPSCS}$ is the number of coded bits per subcarrier per spatial stream per spatial stream.

In addition, the following two examples are examples of a case in which DCM is applied.

When Dual Carrier Modulation (DCM) is performed on constellation bits obtained by performing the constellation mapping on the coded bit string, the constellation mapping is performed based on a Binary Phase Shift Keying (BPSK), the number of spatial streams may be one. Since DCM is applied only to the BPSK modulation scheme and single stream case, frequency rotation is not applied (the third parameter is not defined) and $N_{BPSCS}$ always has 1.

For example, since the first RU is a 26-tone RU and the second RU is a 52-tone RU, the Multi-RU represents 26+52-tone RU. The number of data subcarriers of the 26+52-tone RU is 36. Accordingly, the value of the first parameter may be 12, the value of the second parameter may be 3.

As another example, since the first RU is a 26-tone RU and the second RU is a 106-tone RU, the Multi-RU represents 26+106-tone RU. The number of data subcarriers of the 26+106 tone RU is 63. Accordingly, the value of the first parameter may be 21, the value of the second parameter may be 3.

The 26-tone RU is a resource unit consisting of 26 tones, and the 52-tone RU is a resource unit consisting of 52 tones. The 26-tone RU and the 52-tone RU may be adjacent to each other or may be included in a 20 MHz channel.

The 26-tone RU is a resource unit consisting of 26 tones, and the 52-tone RU is a resource unit consisting of 52 tones. The 26-tone RU and the 52-tone RU may be adjacent to each other or may be included in a 20 MHz channel.

The PPDU may further include a control field. The control field may include a universal-signal (U-SIG) field and an EHT-SIG field. The control field includes allocation information on the Multi-RU, and the allocation information on the Multi-RU may include size and location of the RU, control information related to the RU, information on the frequency band including the RU, and information on the STA receiving the RU, etc.

In addition, the PPDU may include a Legacy-Signal (L-SIG) field, a Repeated Legacy-Signal (RL-SIG) field, a Short Training Field (EHT-STF), and a Long Training Field (EHT-LTF). The EHT-SIG field may include an EHT-SIG-A field and an EHT-SIG-B field.

Figure 27:
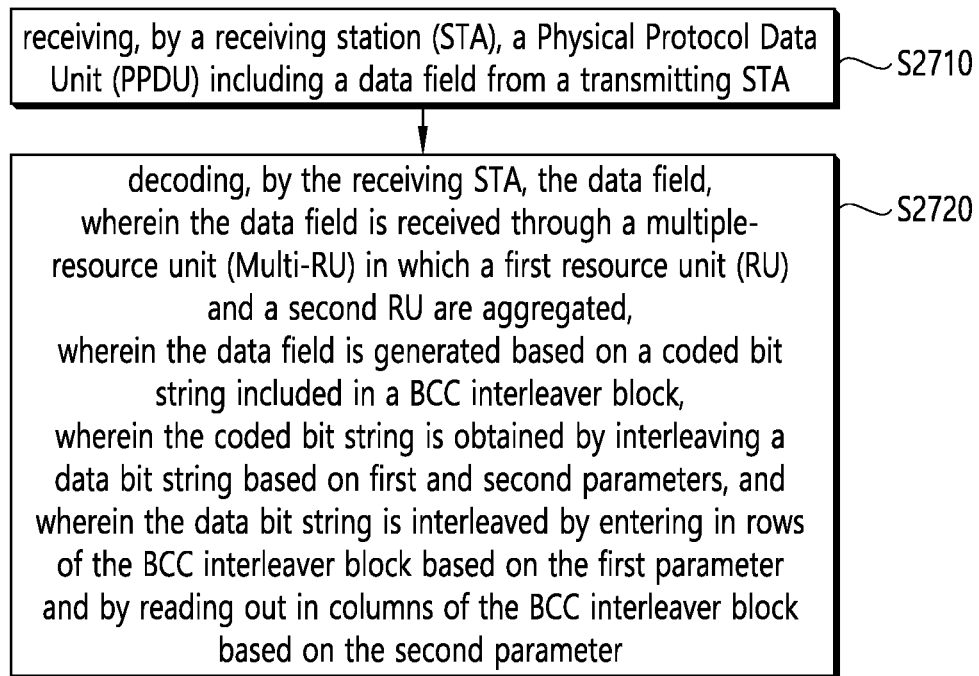
FIG. 27 is a flowchart illustrating a procedure for a receiving STA to receive a PPDU according to the present embodiment.

FIG. 27 is a flowchart illustrating a procedure for a receiving STA to receive a PPDU according to the present embodiment.

An example of FIG. 27 may be performed in a network environment in which a next-generation wireless LAN system (e.g., IEEE 802.11be or EHT wireless LAN system) is supported. The next-generation wireless LAN system is a wireless LAN system improved from the 802.11ax system, and may satisfy backward compatibility with the 802.11ax system.

This embodiment proposes a method of performing BCC interleaving on a data bit string included in a data field of the PPDU when transmitting the PPDU by allocating a Multi-RU (or MRU) supported by the 802.11be WLAN system to one STA. In particular, this embodiment proposes a method of defining a BCC parameter capable of performing BCC interleaving during Multi-RU transmission. The Multi-RU refers to an RU in which several continuous or discontinuous RUs are aggregated.

The example of FIG. 27 is performed by a receiving STA, and the receiving STA may correspond to an STA supporting an Extremely High Throughput (EHT) WLAN system. The transmitting STA of FIG. 27 may correspond to an access point (AP).

In step S2710, the receiving station (STA) receives a Physical Protocol Data Unit (PPDU) including a data field from a transmitting STA.

In step S2720, the receiving STA decodes the data field.

The data field is received through a multiple-resource unit (Multi-RU) in which a first resource unit (RU) and a second RU are aggregated.

The data field is generated based on a coded bit string included in a BCC interleaver block.

The coded bit string is obtained by interleaving a data bit string based on first and second parameters. Specifically, the data bit string is interleaved by entering in rows of the BCC interleaver block based on the first parameter and by reading out in columns of the BCC interleaver block based on the second parameter. The BCC interleaving operation on the coded bit string may be performed as in Equations 12 and 13 above.

The coded bit string may be obtained for each spatial stream by performing stream parsing on the data bit string. The coded bit string may be obtained for each spatial stream by performing stream parsing on the data bit string. The BCC interleaver block may be divided for each spatial stream. Output bits of the stream parser included in the BCC interleaver block for each spatial stream may be interleaved for each block. The data bit string is BCC encoded. An interleaving operation may be performed by the BCC interleaver block only in the case of BCC encoding.

The data field may include a transmission signal generated by performing constellation mapping and Inverse Discrete Fourier Transform (IDFT) on the coded bit string. This means the procedure after the BCC interleaver block.

A PPDU transmission procedure will be described as follows. After the transmitting STA performs BCC encoding on the data bit string to be included in the data field of the PPDU and performs a stream parsing operation of mapping the BCC encoded bits to a specific spatial stream, the interleaved bits may be constellated by performing BCC interleaving on each spatial stream.

Specifically, the transmitting STA 1) performs PHY padding, 2) performs a scrambling operation, and 3) performs BCC encoding on the data bit string, 4) performs a stream parsing operation for mapping the BCC coded bit string to a specific spatial stream, 5) performs BCC interleaving in a BCC interleaver block divided into individual spatial streams, 6) performs the constellation mapping on the BCC interleaved bit string, 7) generates a transmission signal by performing spatial frequency mapping and IDFT on a modulation symbol (constellation bit) generated based on the constellation mapping. In the transmitting STA, the procedures 1) to 7) are sequentially operated, and in this embodiment, the procedure 5) will be mainly described.

When a number of spatial streams is 2 or more and 4 or less, the coded bit string may be subjected to frequency rotation based on a third parameter. That is, when two or more spatial streams exist, frequency rotation may be performed on the additional spatial stream based on the third parameter. Frequency rotation of the coded bit string may be performed as in Equation 15 above.

Hereinafter, an example in which values of the first to third parameters are defined according to the configuration of the Multi-RU will be described. The following two examples are examples of a case in which DCM is not applied.

For example, since the first RU is a 26-tone RU and the second RU is a 52-tone RU, the Multi-RU represents 26+52-tone RU. The number of data subcarriers of the 26+52-tone RU is 72. Accordingly, the value of the first parameter may be 18, the value of the second parameter may be $4 \times N_{BPSCS}$, and the value of the third parameter may be 18. Here, $N_{BPSCS}$ is the number of coded bits per subcarrier per spatial stream per spatial stream.

As another example, since the first RU is a 26-tone RU and the second RU is a 106-tone RU, the Multi-RU represents 26+106-tone RU. The number of data subcarriers of the 26+106 tone RU is 126. Accordingly, the value of the first parameter may be 21, the value of the second parameter may be $6 \times N_{BPSCS}$, and the value of the third parameter may be 31. Here, $N_{BPSCS}$ is the number of coded bits per subcarrier per spatial stream per spatial stream.

In addition, the following two examples are examples of a case in which DCM is applied.

When Dual Carrier Modulation (DCM) is performed on constellation bits obtained by performing the constellation mapping on the coded bit string, the constellation mapping is performed based on a Binary Phase Shift Keying (BPSK), the number of spatial streams may be one. Since DCM is applied only to the BPSK modulation scheme and single stream case, frequency rotation is not applied (the third parameter is not defined) and $N_{BPSCS}$ always has 1.

For example, since the first RU is a 26-tone RU and the second RU is a 52-tone RU, the Multi-RU represents 26+52-tone RU. The number of data subcarriers of the 26+52-tone RU is 36. Accordingly, the value of the first parameter may be 12, the value of the second parameter may be 3.

As another example, since the first RU is a 26-tone RU and the second RU is a 106-tone RU, the Multi-RU represents 26+106-tone RU. The number of data subcarriers of the 26+106 tone RU is 63. Accordingly, the value of the first parameter may be 21, the value of the second parameter may be 3.

The 26-tone RU is a resource unit consisting of 26 tones, and the 52-tone RU is a resource unit consisting of 52 tones. The 26-tone RU and the 52-tone RU may be adjacent to each other or may be included in a 20 MHz channel.

The 26-tone RU is a resource unit consisting of 26 tones, and the 52-tone RU is a resource unit consisting of 52 tones. The 26-tone RU and the 52-tone RU may be adjacent to each other or may be included in a 20 MHz channel.

The PPDU may further include a control field. The control field may include a universal-signal (U-SIG) field and an EHT-SIG field. The control field includes allocation information on the Multi-RU, and the allocation information on the Multi-RU may include size and location of the RU, control information related to the RU, information on the frequency band including the RU, and information on the STA receiving the RU, etc.

In addition, the PPDU may include a Legacy-Signal (L-SIG) field, a Repeated Legacy-Signal (RL-SIG) field, a Short Training Field (EHT-STF), and a Long Training Field (EHT-LTF). The EHT-SIG field may include an EHT-SIG-A field and an EHT-SIG-B field.

5. Apparatus/Device Configuration

The technical features of the present specification described above may be applied to various devices and methods. For example, the above-described technical features of the present specification may be performed/supported through the apparatus of FIGS. 1 and/or 19. For example, the technical features of the present specification described above may be applied only to a part of FIGS. 1 and/or 19. For example, the technical features of the present specification described above are implemented based on the processing chip(s) 114 and 124 of FIG. 1, or implemented based on the processor(s) 111 and 121 and the memory(s) 112 and 122 of FIG. 1, or may be implemented based on the processor 610 and the memory 620 of FIG. 19. For example, the apparatus of the present specification may receive a Physical Protocol Data Unit (PPDU) including a data field from a transmitting STA; and decodes the data field.

The technical features of the present specification may be implemented based on a computer readable medium (CRM). For example, the CRM proposed by the present specification is at least one computer readable medium including at least one computer readable medium including instructions based on being executed by at least one processor.

The CRM may store instructions perform operations comprising: receiving a Physical Protocol Data Unit (PPDU) including a data field from a transmitting STA; and decoding the data field. The instructions stored in the CRM of the present specification may be executed by at least one processor. At least one processor related to CRM in the present specification may be the processor(s) 111 and 121 or the processing chip(s) 114 and 124 of FIG. 1, or the processor 610 of FIG. 19. Meanwhile, the CRM of the present specification may be the memory(s) 112 and 122 of FIG. 1, the memory 620 of FIG. 19, or a separate external memory/storage medium/disk.

The foregoing technical features of this specification are applicable to various applications or business models. For example, the foregoing technical features may be applied for wireless communication of a device supporting artificial intelligence (AI).

Artificial intelligence refers to a field of study on artificial intelligence or methodologies for creating artificial intelligence, and machine learning refers to a field of study on methodologies for defining and solving various issues in the area of artificial intelligence. Machine learning is also defined as an algorithm for improving the performance of an operation through steady experiences of the operation.

An artificial neural network (ANN) is a model used in machine learning and may refer to an overall problem-solving model that includes artificial neurons (nodes) forming a network by combining synapses. The artificial neural network may be defined by a pattern of connection between neurons of different layers, a learning process of updating a model parameter, and an activation function generating an output value.

The artificial neural network may include an input layer, an output layer, and optionally one or more hidden layers. Each layer includes one or more neurons, and the artificial neural network may include synapses that connect neurons. In the artificial neural network, each neuron may output a function value of an activation function of input signals input through a synapse, weights, and deviations.

A model parameter refers to a parameter determined through learning and includes a weight of synapse connection and a deviation of a neuron. A hyper-parameter refers to a parameter to be set before learning in a machine learning algorithm and includes a learning rate, the number of iterations, a mini-batch size, and an initialization function.

Learning an artificial neural network may be intended to determine a model parameter for minimizing a loss function. The loss function may be used as an index for determining an optimal model parameter in a process of learning the artificial neural network.

Machine learning may be classified into supervised learning, unsupervised learning, and reinforcement learning.

Supervised learning refers to a method of training an artificial neural network with a label given for training data, wherein the label may indicate a correct answer (or result value) that the artificial neural network needs to infer when the training data is input to the artificial neural network. Unsupervised learning may refer to a method of training an artificial neural network without a label given for training data. Reinforcement learning may refer to a training method for training an agent defined in an environment to choose an action or a sequence of actions to maximize a cumulative reward in each state.

Machine learning implemented with a deep neural network (DNN) including a plurality of hidden layers among artificial neural networks is referred to as deep learning, and deep learning is part of machine learning. Hereinafter, machine learning is construed as including deep learning.

The foregoing technical features may be applied to wireless communication of a robot.

Robots may refer to machinery that automatically process or operate a given task with own ability thereof. In particular, a robot having a function of recognizing an environment and autonomously making a judgment to perform an operation may be referred to as an intelligent robot.

Robots may be classified into industrial, medical, household, military robots and the like according uses or fields. A robot may include an actuator or a driver including a motor to perform various physical operations, such as moving a robot joint. In addition, a movable robot may include a wheel, a brake, a propeller, and the like in a driver to run on the ground or fly in the air through the driver.

The foregoing technical features may be applied to a device supporting extended reality.

Extended reality collectively refers to virtual reality (VR), augmented reality (AR), and mixed reality (MR). VR technology is a computer graphic technology of providing a real-world object and background only in a CG image, AR technology is a computer graphic technology of providing a virtual CG image on a real object image, and MR technology is a computer graphic technology of providing virtual objects mixed and combined with the real world.

MR technology is similar to AR technology in that a real object and a virtual object are displayed together. However, a virtual object is used as a supplement to a real object in AR technology, whereas a virtual object and a real object are used as equal statuses in MR technology.

XR technology may be applied to a head-mount display (HMD), a head-up display (HUD), a mobile phone, a tablet PC, a laptop computer, a desktop computer, a TV, digital signage, and the like. A device to which XR technology is applied may be referred to as an XR device.

The claims recited in the present specification may be combined in a variety of ways. For example, the technical features of the method claims of the present specification may be combined to be implemented as a device, and the technical features of the device claims of the present specification may be combined to be implemented by a method. In addition, the technical characteristics of the method claim of the present specification and the technical characteristics of the device claim may be combined to be implemented as a device, and the technical characteristics of the method claim of the present specification and the technical characteristics of the device claim may be combined to be implemented by a method.

What is claimed:

1. A method in a wireless Local Area Network (LAN) system, the method comprising:
receiving, by a receiving station (STA), a Physical Protocol Data Unit (PPDU) including a data field from a transmitting STA; and
decoding, by the receiving STA, the data field,
wherein the data field is received through a multiple-resource unit (Multi-RU) in which a first resource unit (RU) and a second RU are aggregated,
wherein the data field is deinterleaved in a BCC deinterleaver block by entering in rows of the BCC deinterleaver block based on a first parameter and by reading out in columns of the BCC deinterleaver block based on a second parameter.

2. The method of claim 1,
wherein the data field is BCC encoded data,
wherein the data field includes a transmission signal generated by performing constellation mapping and Inverse Discrete Fourier Transform (IDFT) on a coded bit string,
wherein the coded bit string is data for each spatial stream by performing stream parsing on a data bit string.

3. The method of claim 2, wherein when a number of spatial streams is 2 or more and 4 or less, the coded bit string is subjected to frequency rotation based on a third parameter.

4. The method of claim 3, wherein the first RU is 26-tone RU,
wherein the second RU is 52-tone RU,
wherein a value of the first parameter is 18,
wherein a value of the second parameter is $4 \times N_{BPSCS}$,
wherein a value of the third parameter is 18,
Here, $N_{BPSCS}$ is a number of coded bits per subcarrier per spatial stream.

5. The method of claim 3, wherein the first RU is 26-tone RU,
wherein the second RU is 106-tone RU,
wherein a value of the first parameter is 21,
wherein a value of the second parameter is $6 \times N_{BPSCS}$,
wherein a value of the third parameter is 31,
Here, $N_{BPSCS}$ is a number of coded bits per subcarrier per spatial stream.

6. The method of claim 2, wherein when Dual Carrier Modulation (DCM) is performed on constellation bits obtained by performing the constellation mapping on the coded bit string, the constellation mapping is performed based on a Binary Phase Shift Keying (BPSK),
wherein the number of spatial streams is one.

7. The method of claim 6, wherein the first RU is 26-tone RU,
wherein the second RU is 52-tone RU,
wherein a value of the first parameter is 12,
wherein a value of the second parameter is 3.

8. The method of claim 6, wherein the first RU is 26-tone RU,
wherein the second RU is 106-tone RU,
wherein a value of the first parameter is 21,
wherein a value of the second parameter is 3.

9. A receiving station (STA) in a wireless Local Area Network (LAN), the receiving STA comprising:
a memory;
a transceiver; and
a processor operatively coupled to the memory and the transceiver,
wherein the processor is configured to:
receive a Physical Protocol Data Unit (PPDU) including a data field from a transmitting STA; and
decode the data field,
wherein the data field is received through a multiple-resource unit (Multi-RU) in which a first resource unit (RU) and a second RU are aggregated,
wherein the data field is deinterleaved in a BCC deinterleaver block by entering in rows of the BCC deinterleaver block based on a first parameter and by reading out in columns of the BCC deinterleaver block based on a second parameter.

10. A method in a wireless Local Area Network (LAN), the method comprising:
generating, by a transmitting station (STA), a Physical Protocol Data Unit (PPDU) including a data field; and
transmitting, by the transmitting STA, the PPDU to a receiving STA,
wherein the data field is transmitted through a multiple-resource unit (Multi-RU) in which a first resource unit (RU) and a second RU are aggregated,
wherein the data field is interleaved in a BCC interleaver block by entering in rows of the BCC interleaver block based on a first parameter and by reading out in columns of the BCC interleaver block based on a second parameter.

11. The method of claim 10, wherein the data field is BCC encoded data,
wherein the data field includes a transmission signal generated by performing constellation mapping and Inverse Discrete Fourier Transform (IDFT) on a coded bit string
wherein the coded bit string is data for each spatial stream by performing stream parsing on a data bit string.

12. The method of claim 11, wherein when a number of spatial streams is 2 or more and 4 or less, the coded bit string is subjected to frequency rotation based on a third parameter.

13. The method of claim 12, wherein the first RU is 26-tone RU,
wherein the second RU is 52-tone RU,
wherein a value of the first parameter is 18,
wherein a value of the second parameter is $4 \times N_{BPSCS}$,
wherein a value of the third parameter is 18,
Here, $N_{BPSCS}$ is a number of coded bits per subcarrier per spatial stream.

14. The method of claim 12, wherein the first RU is 26-tone RU,
wherein the second RU is 106-tone RU,
wherein a value of the first parameter is 21,
wherein a value of the second parameter is $6 \times N_{BPSCS}$,
wherein a value of the third parameter is 31,
Here, $N_{BPSCS}$ is a number of coded bits per subcarrier per spatial stream.

15. The method of claim 11, wherein when Dual Carrier Modulation (DCM) is performed on constellation bits obtained by performing the constellation mapping on the coded bit string, the constellation mapping is performed based on a Binary Phase Shift Keying (BPSK),
wherein the number of spatial streams is one.

* * * * *